United States Patent
Hashimoto et al.

(10) Patent No.: US 7,876,422 B2
(45) Date of Patent: Jan. 25, 2011

(54) SPATIAL INFORMATION DETECTING DEVICE AND PHOTODETECTOR SUITABLE THEREFOR

(75) Inventors: Yusuke Hashimoto, Neyagawa (JP); Yuji Takada, Kyoto (JP); Kenji Imai, Kadoma (JP); Fumi Tsunesada, Ibaraki (JP)

(73) Assignee: Panasonic Electric Works Co., Ltd., Osaka (JP)

( * ) Notice: Subject to any disclaimer, the term of this patent is extended or adjusted under 35 U.S.C. 154(b) by 372 days.

(21) Appl. No.: 12/090,349

(22) PCT Filed: Nov. 14, 2006

(86) PCT No.: PCT/JP2006/322652

§ 371 (c)(1),
(2), (4) Date: Apr. 15, 2008

(87) PCT Pub. No.: WO2007/055375

PCT Pub. Date: May 18, 2007

(65) Prior Publication Data

US 2009/0040502 A1    Feb. 12, 2009

(30) Foreign Application Priority Data

Nov. 14, 2005    (JP) ............................. 2005-329509

(51) Int. Cl.
*G01C 3/08*    (2006.01)
(52) U.S. Cl. ..................................... 356/4.07; 257/184
(58) Field of Classification Search ................ 356/4.01, 356/4.07, 5.01; 257/184

See application file for complete search history.

(56) References Cited

U.S. PATENT DOCUMENTS 3,969,634 A    7/1976 Su et al.

(Continued)

FOREIGN PATENT DOCUMENTS

JP    07-022436 A    1/1995

(Continued)

OTHER PUBLICATIONS

International Search Report for Application No. PCT/JP2006/322652 mailed Jan. 16, 2007.

(Continued)

*Primary Examiner* — Isam Alsomiri
(74) *Attorney, Agent, or Firm* — Cheng Law Group, PLLC

(57) ABSTRACT

A spatial information detecting device is provided, which is capable of reducing the possibility that a saturation phenomenon is caused by the influence of an environmental light. This device includes a photoelectric converting portion for receiving a signal light from a target space to generate electric charges, a charge separating portion for separating electric charges corresponding to a constant amount of a bias component as undesired electric charges from the electric charges generated by the photoelectric converting portion, a charge accumulating portion for accumulating the remaining electric charges as effective electric charges reflecting a fluctuation component of the signal light, a barrier control electrode for forming a potential barrier between the charge separating portion and the charge accumulating portion, and a charge take-out portion for outputting the effective electric charges as an received-light output. By controlling a voltage applied to the barrier control electrode to change a height of the potential barrier, it is possible to adjust an amount of electric charges flowing from the charge separating portion into the charge accumulating portion over the potential barrier.

12 Claims, 18 Drawing Sheets

U.S. PATENT DOCUMENTS

| | | | |
|---|---|---|---|
| 5,003,565 A | 3/1991 | Yoshida | |
| 2003/0209712 A1* | 11/2003 | Fujita et al. | 257/72 |
| 2005/0116259 A1* | 6/2005 | Komori | 257/222 |
| 2005/0178946 A1 | 8/2005 | Hashimoto et al. | |
| 2006/0192938 A1 | 8/2006 | Kawahito | |
| 2007/0103748 A1* | 5/2007 | Hashimoto et al. | 359/15 |

FOREIGN PATENT DOCUMENTS

| | | |
|---|---|---|
| JP | 07-022437 A | 1/1995 |
| JP | 11-023258 A | 1/1999 |
| JP | 2001-051184 A | 2/2001 |
| JP | 2004-294420 A | 10/2004 |
| JP | 2004-356594 A | 12/2004 |
| JP | 2005-303268 A | 10/2005 |
| WO | WO 2004/029548 A1 | 4/2004 |
| WO | WO 2005/088720 A2 | 9/2005 |

OTHER PUBLICATIONS

Supplementary European Search Report for the Application No. EP 06 82 3376 dated May 20, 2010.

* cited by examiner

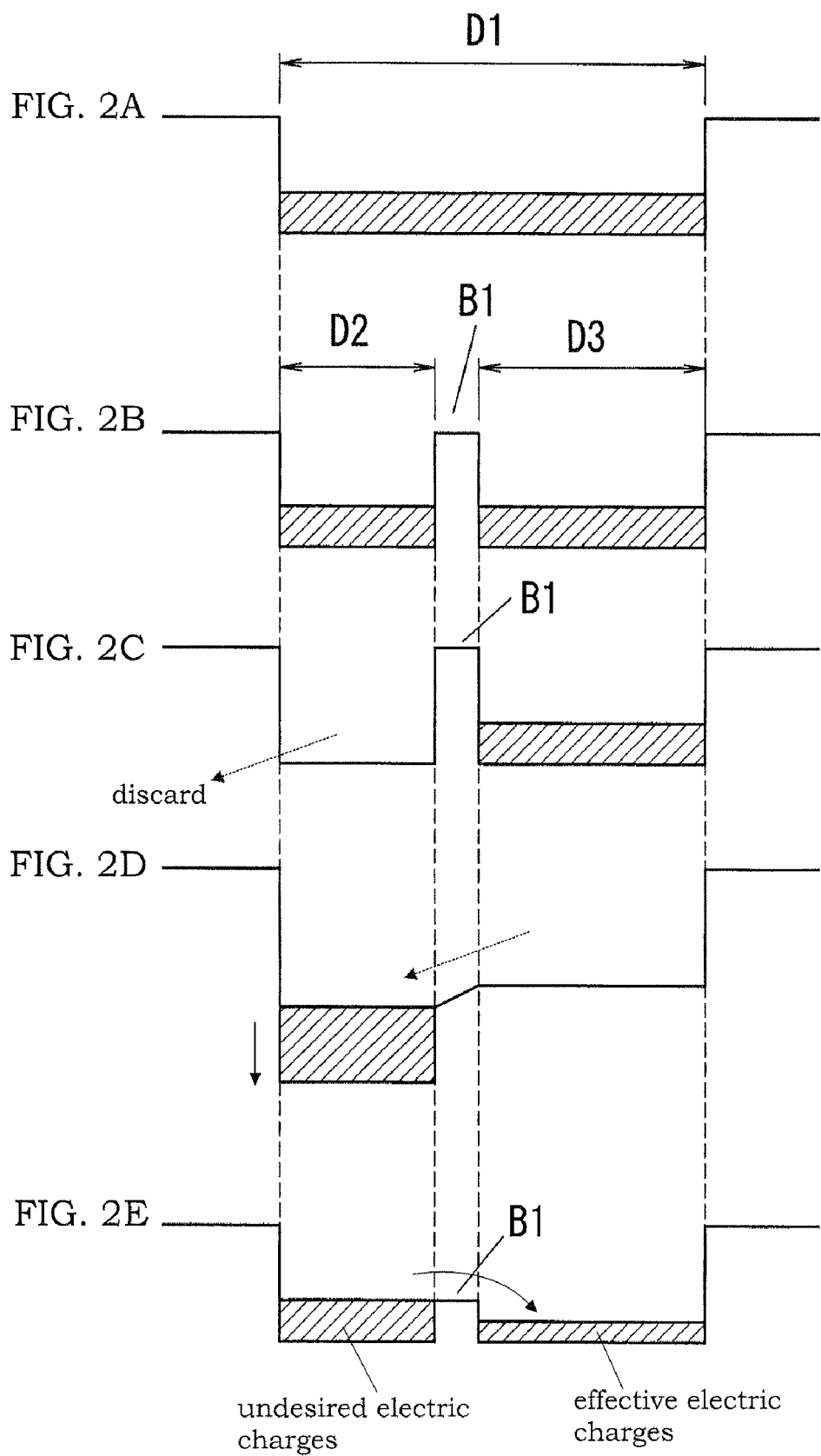

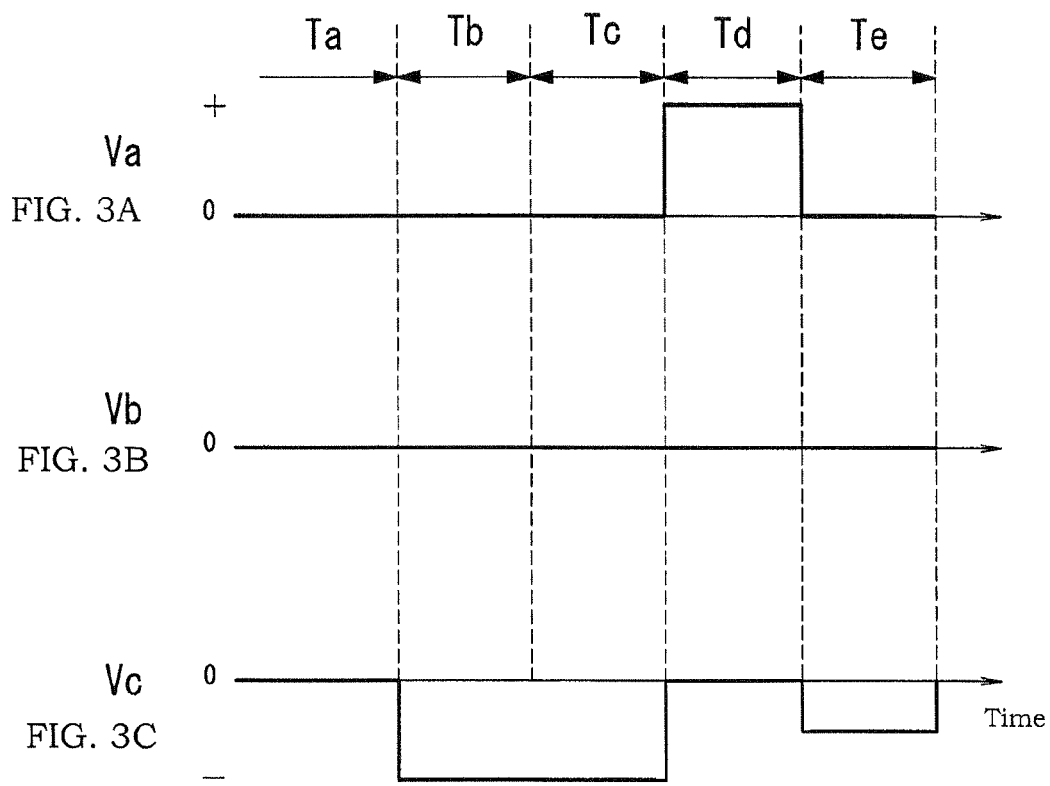
FIG. 3A — Va
FIG. 3B — Vb
FIG. 3C — Vc
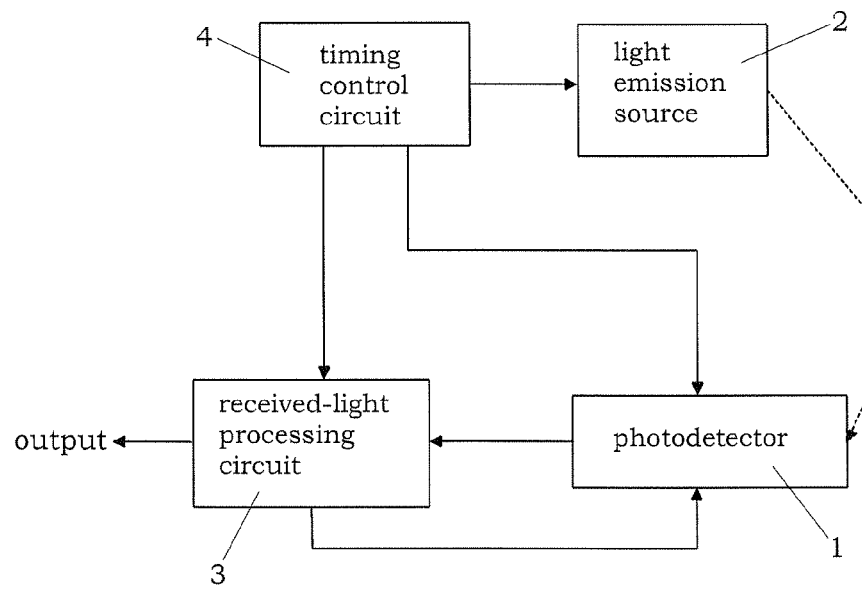
FIG. 4

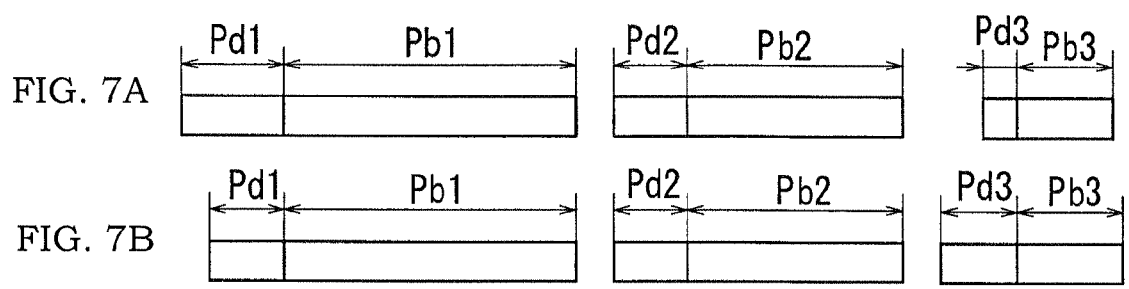
FIG. 7A
FIG. 7B
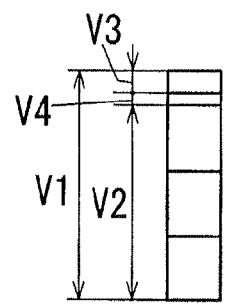
FIG. 8

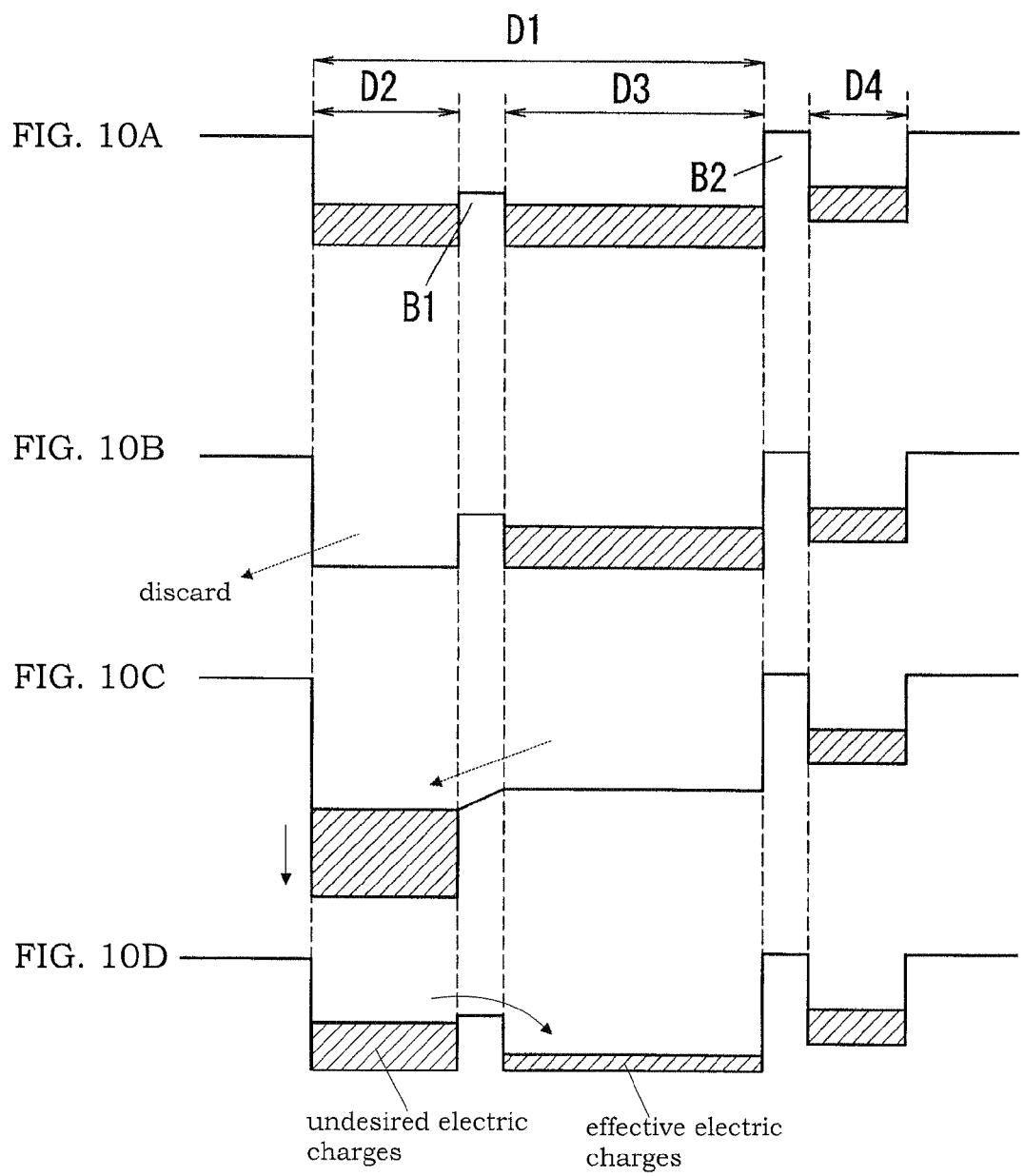

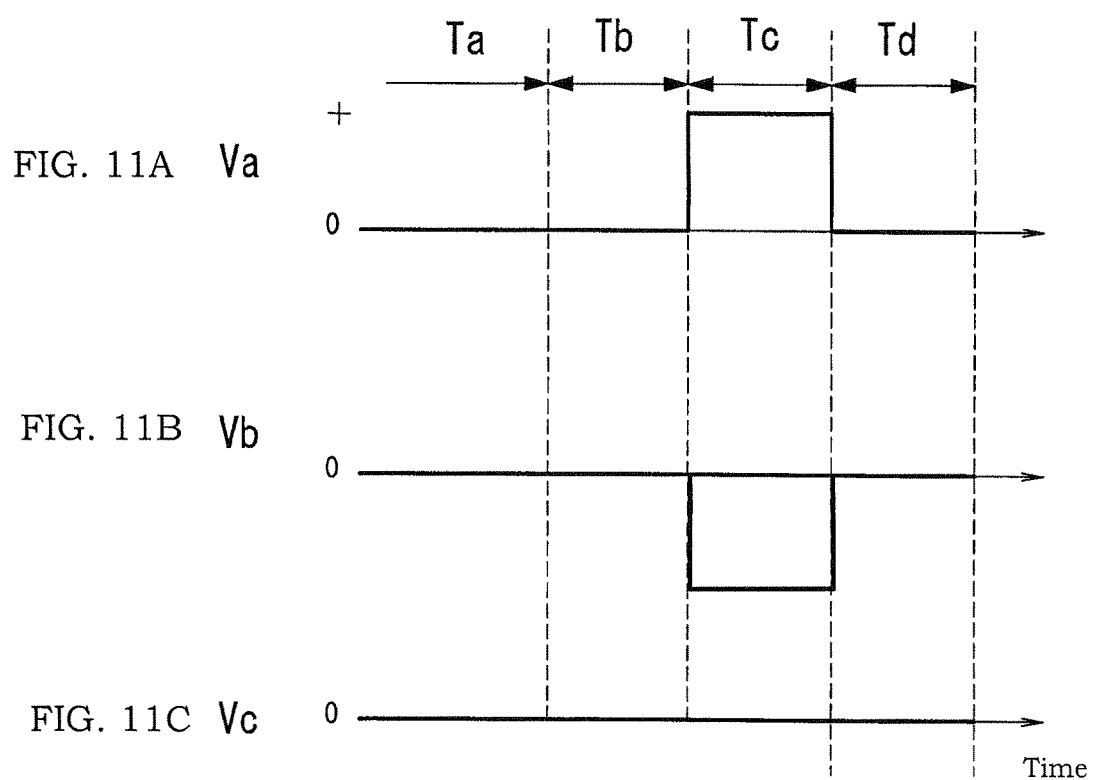

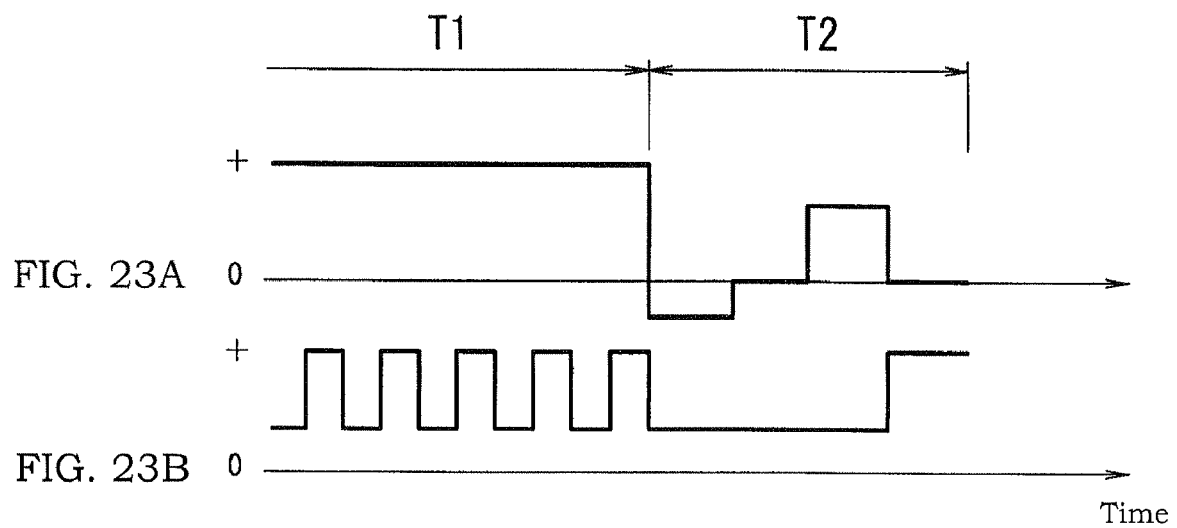

SPATIAL INFORMATION DETECTING DEVICE AND PHOTODETECTOR SUITABLE THEREFOR

TECHNICAL FIELD

The present invention relates to a spatial information detecting device and a photodetector suitably used for the same device.

BACKGROUND ART

In a conventional photodetector for generating electric charges corresponding to a light amount received from a target space, and taking out information of the target space as a received-light output, a maximum value of the received-light output is generally restricted by the dimension of a portion for taking out the generated electric charges.

To expand dynamic range of a channel for taking out the generated electric charges, for example, it is proposed in Japanese Patent Early Publications No. 7-22436 and No. 7-22437 to remove undesired electric charges other than information signal in a charge transfer channel by use of a CCD, and use the remaining electric charges as effective electric charges. According to this configuration, since the undesired electric charges are not transferred, the charge transfer channel can be downsized by a reduction in charge transfer amount.

In this configuration, however, since the removal of the undesired electric charges is performed in the charge transfer channel, the so-called saturation phenomenon happens when the undesired electric charges generated by receiving the light from the target space exceed a photoelectric conversion capacity. In this case, there is a possibility that the information to be detected is lost prior to the charge transfer channel.

Therefore, according to the configuration of the above-described prior art, the charge transfer channel can be downsized. However, there is a problem that a photoelectric converting portion for receiving the light from the target space to generate the electric charges cannot be downsized.

SUMMARY OF THE INVENTION

In consideration of the above problem, a primary concern of the present invention is to provide a spatial information detecting device with high operation reliability, which is capable of downsizing a photoelectric converting portion, and preventing saturation phenomenon even when a large amount of undesired electric charges is generated by receiving the light from the target space.

That is, the spatial information detecting device of the present invention comprises a light emission source configured to project a signal light intensity-modulated by a modulation signal into a target space; a photodetecting portion configured to separate a constant amount of a bias component from electric charges corresponding to a received-light amount detected from the target space at a timing synchronized with the modulation signal to provide a received-light output reflecting a fluctuation component of the signal light; and a signal processing portion configured to detect spatial information of the target space by use of the received-light output. The photodetecting portion comprises a photoelectric converting portion configured to receive light from the target space to generate electric charges; a charge separating portion configured to separate a prescribed constant amount of undesired electric charges corresponding to the bias component from the electric charges generated by the photoelectric converting portion, which correspond to a total of the constant amount of the bias component that does not depend on fluctuations of the signal light and the fluctuation component that changes depending on the fluctuations of the signal light; a charge accumulating portion configured to accumulate, as effective electric charges, the remaining electric charges obtained by separating the undesired electric charges from the electric charges generated by the photoelectric converting portion; and a charge take-out portion configured to take out, as the received-light output, the effective electric charges accumulated in the charge accumulating portion.

According to the present invention, since the constant amount of electric charges corresponding to the bias component is separated as the undesired electric charges, and the remaining electric charges corresponding to the fluctuation component is output as the effective electric charges, the occurrence of saturation can be reduced by reducing the total amount of electric charges, while reflecting an increase or decrease in electric charges generated by the photoelectric converting portion. In other words, even when the electric charges generated by receiving the light from the target space contains a large amount of the bias component, it is possible to efficiently take out the effective electric charges, while preventing the occurrence of saturation phenomenon by removing only the bias component. As a result, a compact photoelectric converting portion becomes available.

In the conventional configuration, the amount of electric charges separated as the undesired electric charges is determined with respect to the electric charges taken out as the received light output. On the other hand, in the present invention, the amount of undesired electric charges is determined with respect to the electric charges provided from the photoelectric converting portion to the charge take-out portion. Therefore, it is possible to remarkably reduce the possibility of saturation by separating the undesired electric charges. In this regard, when preventing the saturation by use of an overflow drain for electronic shutter, the electric charges corresponding to the received light amount are reduced at a constant ratio. This means that the fluctuation component is totally compressed, and a reduction in electric charges corresponding to the fluctuation component is caused. On the contrary, in the present invention, since the bias component is separated as the undesired electric charges, the electric charges corresponding to the fluctuation component can be kept without change.

In addition, by removing the electric charges generated at the photoelectric converting portion by receiving an environmental light from the target space as the undesired electric charges, it is possible to increase a contribution ratio of the light projected from the light emission source to the received-light output. Therefore, when detecting the spatial information according to a relation between the light projected from the light emission source and the light received at the photodetecting portion, it is possible to sensitively detect a change in light projected from the light emission source, and improve the detection accuracy of the spatial information.

In the present invention, the constant amount of electric charges corresponding to the bias component means the electric charges in the following cases. Firstly, with respect to electric charges generated by the photoelectric converting portion in an intended period, the bias component means a component having no substantial change depending on time in the intended period or a component having no substantial change depending on position in the intended period. That is, it means a stable component not depending on time or space. For example, when an active-type sensor is formed in combination with a light emission source for projecting a signal light, the bias component is contained in the electric charges corresponding to the received light amount of the environmental light other than the signal light. Secondary, the bias component means a component consistent with the electric charge amount corresponding to the received light amount of the environmental light. Thirdly, the bias component means a component smaller than the electric charge amount corresponding to the received light amount of the environmental light. Fourthly, when the intensity of the signal light is modulated, and the minimum received-light amount of the signal light is not zero, the bias component means a component equivalent to or smaller than the electric charge amount corresponding to the total of the received light amount of the environmental light and the minimum received light mount of the signal light. That is, the bias component is provided in most cases by light other than the signal light such as the environmental light existing in the target space. On the other hand, as in the case of using an intensity-modulated signal light, there is a case that a component fluctuated depending on the signal light is contained in the bias component. In addition, an offset current or a dark current may be contained in the bias component. It is assumed that the fluctuation component mainly changes with time. However, when a plurality of photoelectric converting portions are operated, there is a case that the fluctuation component means a difference in received light amount between adjacent photoelectric converting portions.

In the above-described invention, it is preferred that the charge separating portion and the charge accumulating portion are potential wells formed in a semiconductor substrate, and the photodetecting portion further comprises an electric-charge amount adjusting means configured to form a potential barrier between the charge separating portion and the charge accumulating portion, and adjust an amount of electric charges flowing from the charge separating portion into the charge accumulating portion over the potential well. The electric-charge amount adjusting means preferably comprises a barrier control electrode disposed on the semiconductor substrate to from the potential barrier between the charge separating portion and the charge accumulating portion, and a control portion configured to control a voltage applied to the barrier control electrode to change a height of the potential barrier. Alternatively, the electric-charge amount adjusting means may comprise a separation electrode disposed at a position corresponding to the charge separating portion on the semiconductor substrate, and a control portion configured to control a voltage applied to the separation electrode to change a depth of the potential well of formed as the charge separating portion.

In this configuration, the electric-charge amount adjusting means can be easily realized by forming the electrode on the general surface of the semiconductor substrate by the conventional semiconductor manufacturing technique. In addition, the amount of the undesired electric charges can be easily adjusted by controlling the voltage applied to the barrier control electrode or the separation electrode to change the height of the potential barrier or the depth of the potential well used as the charge separating portion. As a result, the electric charges flowing into the charge accumulating portion over the potential barrier formed between the charge separating portion and the charge accumulating portion can be accumulated as the effective electric charges.

In addition, it is preferred that the spatial information detecting device further comprises a timing control portion configured to determine operation timings of the photoelectric converting portion, the charge separating portion and the charge accumulating portion in association with a light receiving period where the photoelectric converting portion generates electric charges by receiving light from the target space, into which an intensity-modulated light is being irradiated, and a weighing period where the undesired electric charges are separated from the electric charges generated by the photoelectric converting portion by use of the charge separating portion and the charge accumulating portion. According to this configuration, there is an effect that the undesired electric charges can be separated in the weighing period from the electric charges generated in the light receiving period.

The spatial information detecting device according to a preferred embodiment of the present invention further comprises a semiconductor layer of a first conductive type, a well of a second conductive type formed in a general surface of the semiconductor layer, a discarding portion, to which the undesired electric charges are discarded from the charge separating portion, a plurality of electrodes disposed on the general surface of the well, and a control portion configured to control voltages applied to the electrodes in association with a light receiving period where the photoelectric converting portion generates electric charges by receiving light from the target space, into which an intensity-modulated light is being irradiated, and a weighing period where the undesired electric charges are separated from the electric charges generated by the photoelectric converting portion. The electrodes comprises a separation electrode for forming a potential well as the charge separating portion in the well, an accumulation electrode for forming a potential well as the charge accumulating portion in the well, and a barrier control electrode for forming a potential barrier between the charge separating portion and the charge accumulating portion. According to this configuration, the operation of separating the undesired electric charges in the weighing period from the electric charges generated in the light receiving period can be easily realized by use of the semiconductor substrate. The undesired electric charges removed from the electric charges generated in the light receiving period are discarded from the charge separating portion by the discarding portion. In addition, the light receiving period and the weighing period can be easily realized by controlling the voltage applying timing. Furthermore, since the potential wells are formed as the charge separating portion and the charge accumulating portion by use of the separation electrode and the accumulation electrode, and the potential barrier is formed by use of the barrier control electrode, a refined structure with an arrangement of these control electrodes is obtained.

It is particularly preferred that the control portion controls a voltage(s) applied to at least one of the separation electrode and the barrier control electrode to change at least one of a height of the potential barrier and a depth of the potential well formed as the charge separating portion, thereby adjusting an amount of electric charges flowing from the charge separating portion into the charge accumulating portion beyond the potential barrier.

In the spatial information detecting device described above, it is preferred that the light emission source irradiates, into the target space, a light intensity-modulated by the modulation signal so as to have a lighting period where the intensity-modulated light is projected from the light emission source into the target space and a rest period where the intensity-modulated light is not projected into the target space, and the photodetecting portion comprises an electric-charge amount adjusting means configured to adjust an amount of electric charges to be separated as the undesired electric charges from the electric charges corresponding to a received-light amount obtained in the lighting period according to electric charge amount generated by the photoelectric converting portion in the rest period. In this case, it is particularly preferred that the electric-charge amount adjusting means increases, when the electric charge amount generated by the photoelectric converting portion in the rest period increases, the amount of the undesired electric charges to be separated from the electric charges corresponding to the received-light amount obtained in the lighting period.

According to this configuration, since the amount of the undesired electric charges to be separated is automatically determined according to the electric charge amount generated by receiving an environmental light in the rest period, it is possible to reduce the influence of the environmental light, and easily detect the information of the target space by the light projected from the light emission source.

In addition, as a preferred embodiment of the present invention, the charge separating portion and the charge accumulating portion are potential wells formed in a semiconductor substrate, and a barrier control electrode is disposed between the charge separating portion and the charge accumulating portion to form a potential barrier. The electric-charge amount adjusting means controls a voltage applied to the barrier control electrode according to the electric charge amount generated by the photoelectric converting portion in the rest period to change a height of the potential barrier, thereby adjusting an amount of electric charges flowing from the charge separating portion into the charge accumulating portion over the potential barrier. Alternatively, it is also preferred that a separation electrode is disposed at a position corresponding to the charge separating portion on the semiconductor substrate, and the electric-charge amount adjusting means controls a voltage applied to the separation electrode according to the electric charge amount generated by the photoelectric converting portion in the rest period to change a depth of a potential well formed as the charge separating portion, thereby adjusting the amount of electric charges flowing from the charge separating portion into the charge accumulating portion over the potential barrier.

According to this configuration, since the height of the potential barrier is automatically adjusted according to the received-light amount of the environmental light received in the rest period, and the undesired electric charges are removed from the electric charges generated in the lighting period by use of this potential barrier, it is possible to reduce the influence of the environmental light, and therefore readily detect the spatial information of the target space by the light projected from the light emission source. Furthermore, since the photodetecting portion automatically determines an appropriate height of the potential barrier, an external circuit used in combination with the photodetecting portion can be formed by a relatively simple circuit configuration.

In the case of changing the height of the potential barrier, it is preferred that the electric-charge amount adjusting means has a charge holding portion, which is a potential well formed in the semiconductor substrate, to hold the electric charges generated by the photoelectric converting portion in the rest period, and the electric-charge amount adjusting means applies a voltage determined according to an electric charge amount held by the charge holding portion to the barrier control electrode. In this case, it is further preferred that the electric-charge amount adjusting means comprises a holding electrode formed at a position corresponding to the charge holding portion on the semiconductor substrate through an insulating layer, and electrically connected to the barrier control electrode. Alternatively, it is also preferred that the barrier control electrode is electrically connected to a portion of the semiconductor substrate corresponding to a charge holding well formed as the charge holding portion.

On the other hand, in the case of changing the depth of the potential well formed as the charge separating portion, it is preferred that the electric-charge amount adjusting means has a charge holding portion, which is a potential well formed in the semiconductor substrate, to hold electric charges generated by the photoelectric converting portion in the rest period, and the electric-charge amount adjusting means applies a voltage determined according to an electric charge amount held by the charge holding portion to the separation electrode.

In either case of changing the height of the potential barrier or the depth of the potential well, it is preferred that a gate electrode is formed on the general surface of the semiconductor substrate between the photoelectric converting portion and the charge holding portion, and configured to control a timing of transferring the electric charges generated by the photoelectric converting portion to the charge holding portion. According to this configuration, since the timing of transferring the electric charges from the photoelectric converting portion to the charge holding portion is controlled by the gate electrode, it is possible to transfer the electric charges to the charge holding portion at a desired timing.

In the spatial information detecting device described above, it is also preferred that the signal processing portion increases, when the electric charge amount generated in the light period reaches a predetermined saturation level, the amount of the undesired electric charges separated in a next lighting period. According to this configuration, even when the received-light output reaches the saturation level, it becomes hard to induce the saturation at the next lighting period. Therefore, it is possible to improve the detection probability of the spatial information.

In the spatial information detecting device according to a further preferred embodiment of the present invention, the photodetecting portion has a plurality of photodetecting cells, each of which corresponds to one pixel. Each of the photodetecting cells comprises a semiconductor layer of a first conductive type, a well of a second conductive type formed in a general surface of the semiconductor layer, the photoelectric converting portion including an array of a plurality of sensitivity control electrodes, which are formed on a prescribed region of the well through an insulating layer, a separation electrode used to form a potential well as the charge separating portion in the well, a barrier control electrode used to form the potential barrier in the well, an accumulation electrode used to form a potential well as the charge accumulating portion in the well, and a discarding portion, to which the undesired electric charges are discarded from the charge separating portion. The electric-charge amount adjusting means has a charge holding portion, which is a potential well for holding electric charges generated by the photoelectric converting portion in the rest period. The electric-charge amount adjusting means applies a voltage to at least one of the barrier control electrode and the separation electrode according to the electric charge amount held by the charge holding portion.

In this case, it is further preferred that the separation electrode, the barrier control electrode, and the accumulation electrode are formed in the array of the sensitivity control electrodes, and the charge holding portion is formed adjacently in a direction orthogonal to the array of the sensitivity control electrodes. By arranging the sensitivity control electrodes at equivalent intervals, there is an effect that the operation of transferring the electric charges along the sensitivity control electrodes can be easily controlled. Alternatively, it is also preferred that the separation electrode, the barrier control electrode, the accumulation electrode and the charge holding portion are set out in an array direction of the sensitivity control electrodes in a column adjacent to the array of the sensitivity control electrodes. Since the undesired electric charges can be separated in the same direction as the direction of transferring the electric charges along the sensitivity control electrodes, the separation efficiency of the undesired electric charges becomes higher. In addition, there is another effect of reducing the operation of transferring the electric charges in a different direction from the array direction of the sensitivity control electrodes, and achieving simplification in control wirings and control operations.

A further concern of the present invention is to provide a spatial information detecting device characterized by comprising the following configuration. That is, this spatial information detecting device comprises a light emission source configured to irradiate a light intensity-modulated by a modulation signal into a target space, a photodetecting portion configured to provide an electrical output according to light received from the target space, and a signal processing portion configured to detect spatial information of the target space by use of the electrical output. The photodetecting portion comprises a photoelectric converting portion configured to receive the light from the target space to generate electric charges, a charge separating portion configured to separate an amount of undesired electric charges, which is determined according to an electric charge amount generated by the photoelectric converting portion in one of two zones having different phase ranges of the modulation signal, from the electric charges generated in the other zone by the photoelectric converting portion, a charge accumulating portion configured to accumulate, as effective electric charges, the remaining electric charges obtained by separating the undesired electric charges from the electric charges generated in the other zone by the photoelectric converting portion, and a charge take-out portion configured to output, as the electrical output, the effective electric charges accumulated in the charge accumulating portion.

According to this configuration, since a difference between the received-light amounts obtained in synchronization with the two zones having different phase ranges of the modulation signal is determined, it is possible to effectively reduce the influence of the environmental light by using this difference, and therefore readily detect the spatial information of the target space by the light projected from the light emission source. In addition, the amount of the undesired electric charges is determined by the received-light amount obtained in the one of the two zones having different phase ranges of the modulation signal, and the amount of the effective electric charges corresponds to a difference in electric charge amount between the two zones. That is, it is possible to obtain the received-light output corresponding to the difference in received-light amount between the two zones.

As a preferred embodiment of the spatial information detecting device described above, the charge separating portion and the charge accumulating portion are potential wells formed in a semiconductor substrate. The spatial information detecting device has a barrier control electrode disposed on the semiconductor substrate to form a potential barrier between the charge separating portion and the charge accumulating portion, and a charge holding portion configured to hold electric charges generated by the photoelectric converting portion in the one of the two zones having different phase ranges of the modulation signal. A voltage determined according to the electric charge amount held by the charge holding portion is applied to the barrier control electrode to determine the amount of the undesired electric charges. The amount of the undesired electric charges is separated from the electric charges generated by the photoelectric converting portion in the other one of the two zones having different phase ranges of the modulation signal by the charge separating portion. According to this configuration, the amount of the undesired electric charges is automatically determined by the received-light amount obtained in the one of the two zones having different phase ranges of the modulation signal, and the amount of the effective electric charges corresponds to a difference in electric charge amount between the two zones. That is, it is possible to obtain the received-light output corresponding to the difference in received-light amount between the two zones.

Another concern of the present invention is to provide a photodetector suitably used as the photodetecting portion of the spatial information detecting device described above. That is, this photodetector is characterized by comprising a photoelectric converting portion configured to receive light from the target space to generate electric charges, a charge separating portion configured to separate a prescribed constant amount of undesired electric charges corresponding to a bias component from the electric charges generated by the photoelectric converting portion, which correspond to a total of the constant amount of the bias component and a fluctuation component that changes depending on an increase or decrease in received-light amount, a charge accumulating portion configured to accumulate, as effective electric charges, the remaining electric charges obtained by separating the undesired electric charges from the electric charges generated by the photoelectric converting portion, and a charge take-out portion configured to take out, as a received-light output, the effective electric charges accumulated in the charge accumulating portion. This photodetector preferably comprises a device formation layer made of a semiconductor of a first conductive type, a well of a second conductive type formed on a general surface of the device formation layer, a discarding portion, to which the undesired electric charges are discarded from the charge separating portion, and a plurality of electrodes disposed on the general surface of the well. The electrodes comprises a separation electrode for forming a potential well as the charge separating portion in the well, an accumulation electrode for forming a potential well as the charge accumulating portion in the well, and a barrier control electrode for forming a potential barrier between the charge separating portion and the charge accumulating portion.

BRIEF EXPLANATION OF THE DRAWINGS

FIGS. 2A to 2E are operation explanatory diagrams showing potential relations in this embodiment;

FIGS. 3A to 3C are operation explanatory diagrams showing voltage relations in this embodiment;

FIG. 4 is a block diagram showing a schematic configuration of a spatial information detecting device according to this embodiment;

FIGS. 7A and 7B are explanatory diagrams for further operation examples in this embodiment;

FIG. 8 is an explanatory diagram for another operation example in this embodiment;

FIGS. 10A to 10D are operation explanatory diagrams showing potential relations in this embodiment;

FIGS. 11A to 11C are operation explanatory diagrams showing voltage relations in this embodiment;

FIGS. 23A and 23B are operation explanatory diagrams showing voltage relations in this embodiment.

BEST MODE FOR CARRYING OUT THE INVENTION

The present invention is explained below in detail according to preferred embodiments.

First Embodiment

The spatial information detecting device of this embodiment comprises a light emission source configured to project a light intensity-modulated by a modulation signal as a signal light into a target space, a photodetecting portion configured to provide a received light output reflecting a fluctuation component of the signal light by separating a constant amount of a bias component from electric charges corresponding to a received light amount detected from the target space at a timing synchronized with the modulation signal, and a signal processing portion configured to detect the spatial information of the target space (e.g., a distance to an object in the target space) by use of the received light output. In the following embodiments, the photodetecting portion is provided by a photodetector. In addition, to avoid that the explanation of the present invention becomes complicated, only a minimum unit cell of the photodetector and its operation are explained in some situations. By arranging a plurality of the unit cells, it is possible to obtain an image sensor as the photodetector.

Figure 1:
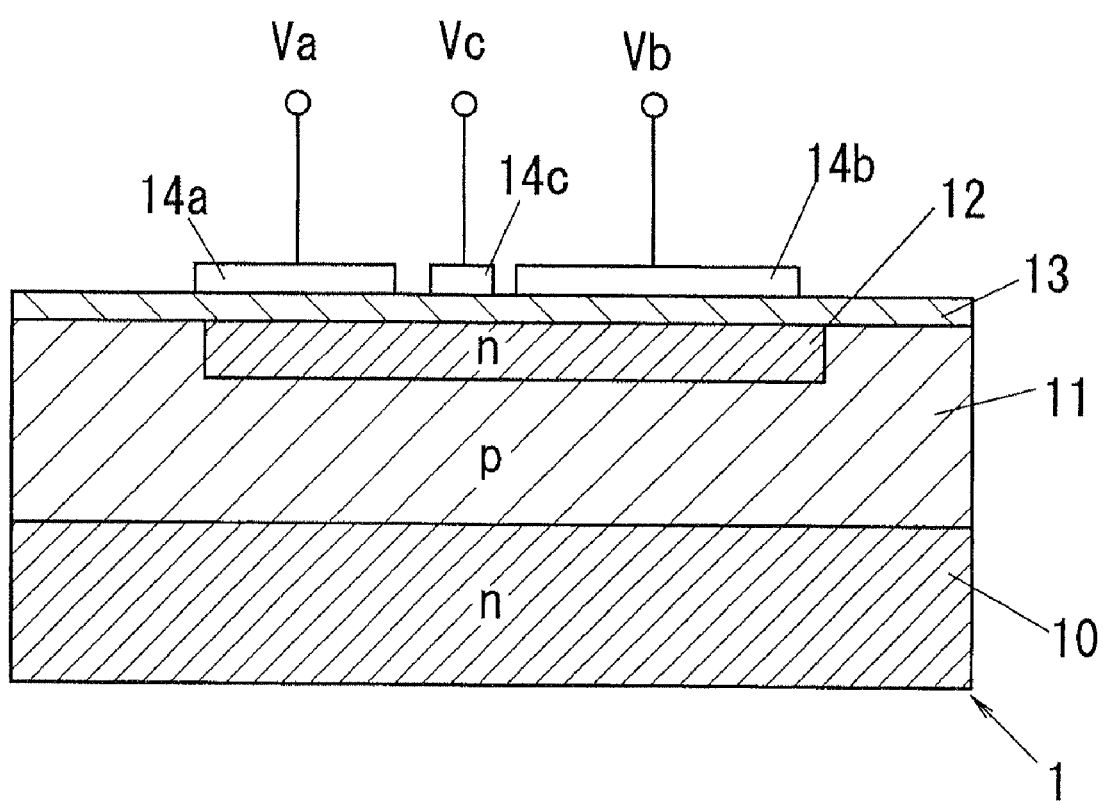
FIG. 1 is a cross-sectional view showing a first embodiment of the present invention.

In each cell 1, as shown in FIG. 1, a device formation layer 11 formed on a substrate 10 is of a semiconductor (e.g., silicon) of a first conductivity type (e.g., p-type), and a well 12 formed in a general surface of the device formation layer 11 is of a semiconductor of a second conductivity type (e.g., n-type). On a general surface of the well 12, a separation electrode 14a, an accumulation electrode 14b and a barrier control electrode 14c are disposed through an insulating layer 13 (e.g., silicon oxide or silicon nitride). The barrier control electrode 14c and the separation electrode 14a function as means of adjusting an amount of undesired electric charges. Voltages applied to the barrier control electrode 14c and the separation electrode 14a are determined by a control portion (not shown). The substrate 10 has the second conductivity type. The separation electrode 14a, the accumulation electrode 14b and the barrier control electrode 14c have translucency. In the present embodiment, it is explained about a case where electric charges generated by receiving light from the target space are electrons. Alternatively, by reversing the conductivity type of the semiconductor and the polarity of voltage described later, holes can be used as the electric charges.

In FIG. 1, the separation electrode 14a, the accumulation electrode 14b and the barrier control electrode 14c are designed to have different widths from each other such that the accumulation electrode 14b has a larger width than the separation electrode 14a and the barrier control electrode 14c. Alternatively, a plurality of electrodes having a same width may be arranged. In this case, by applying a same voltage to plural electrodes, which are successively disposed adjacent to each other, they can be equivalently used as a single electrode having a large width. For example, when the separation electrode 14a is provided by two electrodes disposed adjacent to each other, the accumulation electrode 14b is provided by three electrodes successively disposed adjacent to each other, and the barrier control electrode 14c is provided by a single electrode, the functions of the separation electrode 14a, the accumulation electrode 14b and the barrier control electrode 14c can be achieved by using these six electrodes having the same width.

The well 12 of n-type is surrounded by the device formation layer 11 of p-type. Therefore, when no voltage is applied to the separation electrode 14a, the accumulation electrode 14b and the barrier control electrode 14c, the potential of the well 12 is lower than that of the device formation layer 11 with respect to electrons. That is, the region corresponding to the well 12 provides a potential well for electrons. In FIG. 1, a hatching area designates electrons. The potential in the well 12 can be controlled by applying voltages to the separation electrode 14a, the accumulation electrode 14b and the barrier control electrode 14c.

Here, it is explained about a case where light is irradiated when the well 12 is in an empty state of electric charges. To obtain the empty state of the well 12, electrons are discarded through a drain (not shown) formed adjacent to the well 12. Alternatively, electrons in the well 12 may be taken out as the received-light output to the outside through a charge take-out portion (not shown). The charge take-out portion can have the same configuration as a vertical transfer portion or a horizontal transfer portion of a conventional CCD image sensor.

As shown by a period Ta in FIGS. 3A to 3C, when light is received from the target space under the condition that no voltage is applied to the separation electrode 14a, the accumulation electrode 14b and the barrier control electrode 14c, electrons and holes are generated in the device formation layer 11 including the well 12. As shown in FIG. 2A, the generated electrons are collected in the well 12. That is, the well 12 functions as a photoelectric converting portion D1. When a voltage (i.e., a positive voltage) with a higher electric potential than a reference electric potential of the device formation layer 11, is applied to any one of the separation electrode 14a, the accumulation electrode 14b and the barrier control electrode 14c, it is possible to obtain the potential well having a larger depth, and improve the collection efficiency of electrons.

After electrons are collected in the photoelectric converting portion D1, a potential barrier B1 is formed in the well 12, as shown in FIG. 2B, by applying a negative voltage to the barrier control electrode 14c, as shown by a period Tb in FIGS. 3A to 3C. The potential barrier B1 divides the potential well of the well 12 into two potential wells of a charge separating portion D2, which is a region corresponding to the separation electrode 14a, and a charge accumulating portion D3, which is a region corresponding to the accumulation electrode 14b.

Under the condition that the potential barrier B1 is formed to separate the charge separating portion D2 from the charge accumulating portion D3, when electrons in the charge separating portion D2 are discarded through the drain (not shown) formed close to the well 12, electrons remain only in the charge accumulating portion D3, as shown in FIG. 2C. An amount of the remaining electrons in the charge accumulating portion D3 corresponds to the received-light amount obtained in the period Ta shown in FIGS. 3A to 3C. To discard the electric charges, it is preferred that a gate is formed between the drain and the charge separating portion D2, and the gate is opened to discard the electric charges from the charge separating portion D2 to the drain. The gate and the drain structure can have the same configuration as a conventional MOSFET or CCD structure.

Next, as shown in a period Td in FIGS. 3A to 3C, a positive voltage is applied to the separation electrode 14a, and the voltage applied to the barrier control electrode is removed. At this time, as shown in FIG. 2D, the charge separating portion D2 becomes a potential well having a larger depth than the charge accumulating portion D3. In addition, since the potential barrier B1 between the charge separating portion D2 and the charge accumulating portion D3 is eliminated, all of the electrons collected in the charge accumulating portion D3 flow into the charge separating portion D2. That is, all of the electrons collected in the charge accumulating portion D3 are transferred to the charge separating portion D2.

After all of the electrons in the well 12 are moved into the charge separating portion D2, a predetermined negative constant voltage is applied to the barrier control electrode 14c, as shown by a period Te in FIGS. 3A to 3C, and the voltage applied to the separation electrode 14a is removed. That is, as shown in FIG. 2E, the potential barrier B1 is formed again to divide the potential well 12 into the charge separating portion D2 and the charge accumulating portion D3. At this time, the potential well of the charge separating portion D2 is formed to have a shallow depth. In addition, a capacity (volume) of the charge separating portion D2 is determined by a height of the potential barrier B1. That is, the capacity of the charge separating portion D2 is determined according to the voltage applied to the barrier control electrode 14c. The voltage applied to the barrier control electrode 14c is set such that the potential of the potential barrier B1 does not exceed the potential of the device formation layer 11.

When the amount of electrons flowed in the charge separating portion D2 in the state of FIG. 2D exceeds the capacity of the charge separating portion D2 in the state of FIG. 2E, a part of the electrons flows from the charge separating portion D2 into the charge accumulating portion D3 over (beyond) the potential barrier B1. Since the amount of electrons flowed in the charge separating portion D2 in the state of FIG. 2D corresponds to the amount of electrons generated by light irradiation (practically, the amount of electrons in FIG. 2C), the amount of electrons flowed in the charge accumulating portion D3 in the state of FIG. 2E is equal to the amount determined by subtracting the electrons corresponding to the capacity of the charge separating portion D2 set in the state of FIG. 2E from the electrons generated by the light irradiation.

In the following explanation, the electrons separated by the charge separating portion D2 are called as undesired electric charges, and the electron flowed in the charge accumulating portion D3 are called as effective electric charges. In general, the underside electric charges are discarded, and the effective electric charges are taken out as the received-light output. That is, the electrons generated by the photoelectric converting portion D1 can be regarded as a total of a constant amount of a bias component such as an environmental light and a fluctuation component including the information to be detected, which fluctuates depending on an increase or decrease in received-light amount. Since the bias component does not contain the information to be detected, it is discarded as the undesired electric charges. On the other hand, the obtained effective electric charges correspond to electric charges obtained by simply removing the constant amount of electrons from the amount of electrons corresponding to the received-light amount. Therefore, the fluctuation component of the received-light amount is kept in the effective electric charges, and there is no change in information amount contained in the received-light amount.

By the way, light is received during the movement of electrons in the well 12 for the periods shown in FIG. 2A to FIG. 2E, and the generated electrons are continuously collected in the well 12. Therefore, it is needed to vanishingly reduce the amount of electrons generated in the periods shown in FIG. 2B to FIG. 2E, as compared with the amount of electrons generated by the photoelectric converting portion D1 in the period shown in FIG. 2A. In order to minimize the occurrence of an error, for example, it is preferred that the period of FIG. 2A is set in the millisecond (ms) order, and the periods of FIG. 2B to FIG. 2E are set in the microsecond (es) order.

In the present embodiment, as explained above, a prescribed constant amount of electrons is separated from the electrons generated at the photoelectric converting portion D1 by receiving the light from the target space by the charge separating portion D2, and then the remaining electrons are transferred as the effective electric charges into the charge accumulating portion D3. In this case, the amount of the effective electric charges accumulated in the charge accumulating portion D3 becomes smaller than the amount of electrons corresponding to the received-light amount (=time integration of received light flux). However, the information amount contained in the received-light amount is reflected on the effective electric charges. Thus, even when the received-light amount increases, saturation becomes hard to occur because the constant amount of the generated electric charges is removed as the undesired electric charges by the charge separating portion D2.

In the present embodiment, the photoelectric converting portion D1 is formed in the well 12. Alternatively, the photoelectric converting portion may be formed at a different position from the well 12. Electrons generated by the photoelectric converting portion are transferred to the well 12, and then a part of the electrons is separated according to the above-described procedures. In this case, since the well 12 can be light-shielded, it is possible to reduce the occurrence of an error derived from electric charges generated in the periods shown in FIG. 2A to FIG. 2E.

Furthermore, in the above explanation, the potentials of the charge separating portion D2 and the potential barrier B1 are lowered without changing the potential of the charge accumulating portion D3 in the period of FIG. 2D. Alternatively, electrons may be moved from the charge accumulating portion D3 into the charge separating portion D2 by lowering the potential of the potential barrier B1 so as to be higher than the potential barrier B1 of FIG. 2E, and increasing the potential of the charge accumulating portion D3 so as not to be smaller than the potential barrier B1, without changing the potential of the charge separating portion D2.

By the way, to separate a constant amount of electrons as the undesired electric charges by the charge separating portion D2 in the state of FIG. 2E, it is needed that all of the electrons moved beyond the potential barrier B1 flow into the charge accumulating portion D3. When the amount of electrons moved into the charge accumulating portion D3 exceeds the capacity of the charge accumulating portion D3, the constant amount of the undesired electric charges can not be separated by the charge separating portion D2. To solve this problem, when the capacity of the charge accumulating portion D3 is increased without changing the depth of the charge accumulating portion D3, an occupation area of the well 12 relative to the device formation layer 11 increases. As a result, this leads to an increase in size of the photodetector. Therefore, to solve the above-mentioned problem, it is preferred to use a technique of adjusting the depth of the charge accumulating portion D3.

The depth of the charge accumulating portion D3 depends on the height of the potential barrier B1. The amount of the undesired electric charges is determined by a relative height of the potential barrier B1 to the potential of the bottom of the charge separating portion D2. Therefore, by adjusting the potential of the bottom of the charge separating portion D2 without changing the height of the potential barrier B1, it becomes possible to measure and separate the constant amount of the undesired electric charges by the charge separating portion D2 even though the received-light amount increases or decreases.

To appropriately set the potential of the bottom of the charge separating portion D2, it is needed to evaluate the received-light amount. In the evaluation of the received-light amount, it is preferred that electrons collected in the photoelectric converting portion D1 are moved outside of the photodetector, and then evaluated by an external circuit of the photodetector. In this case, the evaluation result provided from the external circuit is reflected on the voltage applied to the separation electrode 14a. In response to the evaluation result of the received-light amount, there is a case that it is not necessary to separate the undesired electric charges by the charge separating portion D2. In that case, the electrons remaining in the charge accumulating portion D3 in the state of FIG. 2C are taken out as the received-light output.

Specifically, voltages applied to the separation electrode 14a, the accumulation electrode 14b and the barrier control electrode 14c are controlled by the external circuit (not shown) as the control portion such that the photodetector performs two operations of taking out a received-light output for evaluating the received-light amount, and taking out a received-light output after separating the undesired electric charges. In the period for obtaining the received-light output for evaluating the received-light amount, the electric charges collected in the photoelectric converting portion D1 is directly taken out. By use of this received-light output, the voltages applied to the separation electrode 14a, the accumulation electrode 14b and the barrier control electrode 14c are determined to adjust one of the height of the potential barrier B1 and the depth of the charge accumulating portion D3. Next, with respect to the electric charges corresponding to the received-light amount, the undesired electric charges are separated according to the above-described procedures, so that the remaining electrons are taken out as the received-light output.

By the way, the received-light output obtained by separating the undesired electric charges must hold the information contained in the received-light amount. Therefore, in the case of a passive-type sensor without the light emission source, the fluctuation component of the received-light amount can be reflected on the received-light output by keeping constant the amount of the undesired electric charges to be separated. On the other hand, in the case of an active-type sensor using the light emission source, a period (hereinafter referred to as "lighting period") where the light emission source lights up, and a period (hereinafter referred to as "rest period") where the light emission source is turned off are set. After the received-light amount obtained in the rest period is evaluated, the undesired electric charges are removed from the electric charges obtained in the lighting period. According to this operation, it is possible to remove the amount of the undesired electric charges, which is determined in response to an environmental light such as natural light and illumination light, from the electric charges obtained in the lighting period, and substantially improve dynamic range with respect to the light projected from the light emission source.

In the above-described operation, it is assumed that the operation of separating the undesired electric charges is performed once, and the amount of the undesired electric charges is determined by adjusting only the height of the potential barrier B1. Alternatively, the amount of the undesired electric charges may be adjusted by changing the number of times of the operation of separating the undesired electric charges. In this case, the capacity of the charge separating portion D2 is kept constant. After separating the undesired electric charges by the charge separating portion D2 in the state of FIG. 2E, the undesired electric charges are discarded from the charge separating portion D2. Then, the state of the FIG. 2D is reproduced to return the electric charges from the charge accumulating portion D3 to the charge separating portion D2, the undesired electric charges are separated again by the charge separating portion D2 in the state of FIG. 2E. By repeating the above procedures at a required number of times, the amount of the undesired electric charges can be adjusted.

In the operations shown in the drawings, after the electric charges are moved into the charge separating portion D2 to separate the undesired electric charges, the voltage applied to the barrier control electrode 14c or the voltage applied to the separation electrode 14a is adjusted. Alternatively, after the capacity of the charge separating portion D2 is determined by adjusting the voltage applied to the barrier control electrode 14c or the voltage applied to the separation electrode 14a, the electric charges may be moved into the charge separating portion D2.

In the following explanation, as shown in FIG. 4, a light is projected from the light emission source 2 into the target space, so that resultant light from the target space is received as a signal light by the photodetector (i.e., the photodetecting portion) 1. In this configuration, it is assumed that the light received by the photodetector 1 contains an environmental light such as natural light and illumination light, and the received-light output is obtained by reducing the environmental light component. Therefore, the amount of electrons separated as the undesired electric charges is determined so as to reflect the received-light amount of the environmental light. The received-light output of the photodetector 1 is sent to a received-light processing circuit 3 to extract desired information from the received-light output. Operations of the photodetector 1, the light emission source 2 and the received-light processing circuit 3 are controlled according to timing signals output from a timing control circuit 4.

That is, the voltages applied to the barrier control electrode 14c and the separation electrode 14a, which are used as the means for adjusting the electric charge amount separated as the undesired electric charges, are controlled by this timing control circuit 4. In addition, the timing control circuit 4 outputs a timing signal to the light emission source 2 such that the lighting period and the rest period are alternately repeated. The timing control circuit 4 also provides timing signals to the photodetector 1 and the received-light processing circuit 3 such that operations described later are performed in the lighting period and the rest period. That is, in the configuration shown in the drawings, the signal processing portion is composed of the received-light processing circuit 3 and the timing control circuit 4. The signal processing portion may be configured by a microcomputer for executing an appropriate program.

In the following explanation, a desired amount of undesired electric charges is separated by performing a charge weighing operation plural times. That is, when the amount of the undesired electric charges to be discarded is Qg, it can be discarded by repeating the charge weighing operation plural times "k" (k: a positive integer). Therefore, the amount of the undesired electric charges discarded per one charge weighing operation is represented as Qg/k. To discard the undesired electric charges, there are a method of repeating the charge weighing operation plural times at intervals of a predetermined time, and a method of repeating the charge weighing operation plural times successively. In the following explanation, both of them are performed in a mixed manner.

Figure 5A:
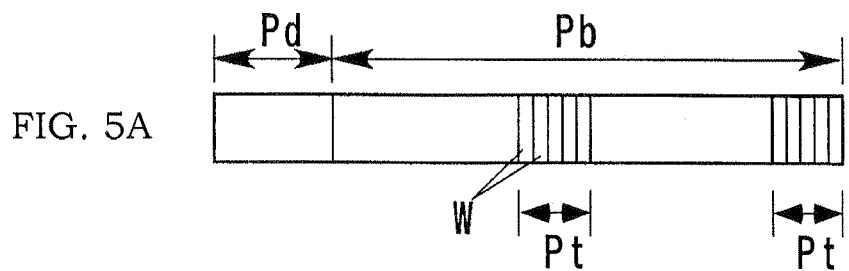
FIGS. 5A and 5B are explanatory diagrams for operation examples in this embodiment.
Figure 5B:
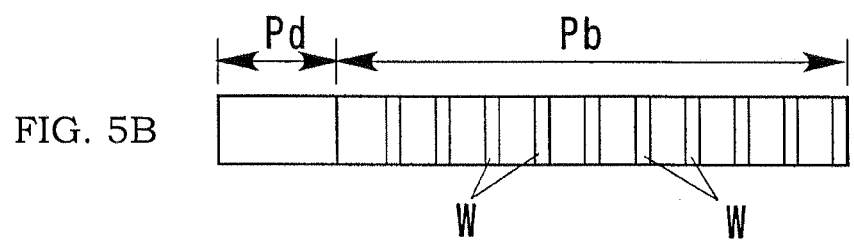

That is, a weighing period is defined, in which an operation of separating and discarding the undesired electric charges is successively repeated plural times "m" (m: a positive integer of 2 or more), and this weighing period is repeated plural times "n" (n: a positive integer of 1 or more) in the light period. This relation is shown in FIGS. 5A and 5B. In each of FIGS. 5A and 5B, one rest period "Pd" and one lighting period "Pb" are shown. In a practical sense, the rest period "Pd" and the lighting period "Pb" are alternately repeated plural times. In the operation shown in FIG. 5A, the weighing period "Pt" is performed "n" times (2 times in this drawing) in the lighting period "Pb", and the operation of separating and discarding the undesired electric charges (hereinafter referred to as a weighing operation "W") is repeated "m" times (5 times in this drawing) in each weighing period. That is, the number of times of the weighing operation "W" performed in the lighting period "Pb" is represented as "n"דm". In each weighing period "Pt", the undesired electric charges are discarded such that only the amount of electrons corresponding to the received-light amount of the signal light remains. Therefore, the amount of the undesired electric charges discarded per one weighing operation "W" is determined by dividing the amount of the undesired electric charges discarded in the weighing period "Pt" by the positive integer "m". In addition, the amount of the undesired electric charges discarded per one weighing operation "W" is set according to the received-light amount obtained in the rest period "Pd". That is, in the operation explained below, "k"="m".

Firstly, it is explained about an advantage in the case where the undesired electric charges are separated little by little by plural times of the weighing operation, as compared with the case where the undesired electric charges are separated at a time by a single weighing operation. In general, an electric charge amount "Q" (an amount of electrons) accumulated in response to the received-light amount of the photodetector is proportional to the area "S" of the photoelectric converting portion D1 (the charge accumulating portion D3) and the light receiving time "t". When the electric charge amount accumulated per unit time and unit area is "q", "Q"="q"×"S"×"t". In this explanation, since the height of the potential barrier B1 is determined according to the electric charge amount accumulated in the rest period "Pd", the height ΔV of the potential barrier B1 can be represented as a function of the electric charge amount "Q" accumulated in the rest period "Pd". For, example, it can be calculated from the relation of ΔV (Q)="α"×"q"×"S"×"t", wherein "α" is a coefficient for converting the electric charge amount "Q" into the height ΔV (Q) of the potential barrier B1. The amount of the undesired electric charges discarded per one weighing operation can be adjusted by changing the height ΔV (Q) of the potential barrier B1.

The height ΔV (Q) of the potential barrier B1 can be adjusted by changing any one of the above-described four variables. As explained above, the time "t" is set in the millisecond (ms) order, and the time needed for the weighing operation is set in the microsecond (es) order. Therefore, by reducing the time "t" for determining the amount of the undesired electric charges, it becomes possible to shorten the rest period "Pd", and relatively increase the time used for collecting the spatial information. However, as the time "t" becomes shorter, the electric charge amount Q discarded per one weighing operation decreases. Therefore, the number of times of the weighing operation is increased to discard the desired amount of the undesired electric charges.

To shorten the time "t", without reducing the electric charge amount Q discarded per one weighing operation, it is considered to increase at least one of the coefficient "α", the electric charge amount "q" and the area "S". However, as the coefficient "α" becomes larger, noise components such as shot noise increases. As a result, it leads to an increase in measurement error. In addition, it is difficult to regulate the electric charge amount "q" because it depends on the specifications of the photodetector and the received-light intensity. On the other hand, as the area "S" becomes larger, an increase in size of the device comes into problem. Therefore, the coefficient "α", the electric charge amount "q" and the area "S" are not changed.

The amount of the undesired electric charges discarded per one weighing operation "W" is determined by the electric charge amount accumulated in the rest period "Pd", as described above. This electric charge amount is represented as a function of the received-light intensity of the environmental light and the length (time "t") of the rest period "Pd". That is, the amount of the undesired electric charges discarded per one weighing operation "W" is defined to be larger as the rest period "Pd" becomes longer. In fact, it is defined by a linear function or a cubic function. Therefore, as described above, when the amount of the undesired electric charges discarded in the weighing period "Pt" is "Qg", and the amount of the undesired electric charges discarded per one weighing operation "W" is represented as "Qg/m", the length of the rest period "Pd" needed for one weighing operation is 1/m of the length of the rest period needed to discard the electric charge amount "Qg" at a time. In brief, since the weighing operation "W" is repeated "m" times, the length of the rest period "Pd" needed for one weighing operation for discarding the undesired electric charges can be reduced to 1/m.

In the above-described operation, the rest period "Pd" is shortened, and on the other hand the time corresponding to the repetition number of the weighing operation "W" is needed to finish discarding the undesired electric charges. Since the time scale of the rest period is in the milliseconds (ms) order, and the time scale of the weighing operation "W" is in the microseconds (es) order, the total time needed for the rest period "Pd" and the lighting period "Pb" can be shortened, as compared with the case of discarding the undesired electric charges at a time. For example, when 7 milliseconds (ms) are needed for the rest period in the case of discarding the undesired electric charges at a time, the time needed for the rest period in the case of discarding the undesired electric charges by repeating the weighing operation "W" 7 times can be reduced to 1 millisecond. That is, even when 100 microseconds (μs) are needed to perform each of weighing operations "W", the total time of the rest period "Pd" and the lighting period "Pb" is less than 2 milliseconds. Thus, a remarkable time reduction can be achieved.

Thus, the signal processing portion determines the amount of the undesired electric charges separated from the electric charges corresponding to the received-light amount obtained in the prescribed constant lighting period according to the received-light amount obtained in the rest period. In addition, the signal processing portion controls the photodetector such that the undesired electric charges are discarded by repeating the weighing operation plural times. As the amount of the undesired electric charges discarded per one weighing operation is larger, the continuous time of the rest period becomes longer. Therefore, as compared with the case of discarding the undesired electric charges at a time, it is possible to shorten the continuous time of the rest period. That is, since the time needed for the weighing operation is two or three orders of magnitudes shorter than the rest period, the processing time corresponding to the total time of the rest period and the lighting period can be effectively shortened by a reduction in the rest period. As a result, it is possible to efficiently collect the information of the signal light in the lighting period, and increase the amount of the spatial information collected per unit time.

As described above, the time needed to take out the received-light output can be reduced by shortening the rest period "Pd" and removing the undesired electric charges by repeating the weighing operation "W" plural times, as compared with the case of removing the undesired electric charges at a time. In addition, even when the intensity of the environmental light received in the rest period "Pd" relatively increases, it is possible to reduce the amount of electrons generated at the photoelectric converting portion D1 by shortening the rest period "Pd", and therefore prevent the photodetector 1 from saturation.

In the above-described operation, the weighing operation "W" is performed "m" times in the weighing period "Pt", and the weighing period "Pt" is performed "n" times in the lighting period "Pb". In this case, the lighting period "Pb" is constant each time. By performing the weighing operation "W" plural times in each of the weighing periods "Pt", the effect of shortening the rest period "Pd" becomes higher. The number of times of the weighing operation "W" performed in the lighting period "Pb" can be appropriately determined. For example, a single weighing period "Pt", in which a required number of times of the weighing operation "W" are performed, may be set in the lighting period "Pb". Alternatively, a single weighing operation "W" may be performed in each of the weighing periods "Pt".

From the viewpoint of the received-light intensity of the environmental light, it is preferred that a plurality of weighing periods "Pt" are set in the lighting period "Pb". Particularly, when a large received-light amount is obtained in the rest period "Pd", in other words, the received-light intensity of the environmental light increases, it is desired to increase the number of times of the weighing periods "Pt" in the lighting period "Pb". This reason is explained referring to FIGS. 6A and 6B.

Figure 6A:
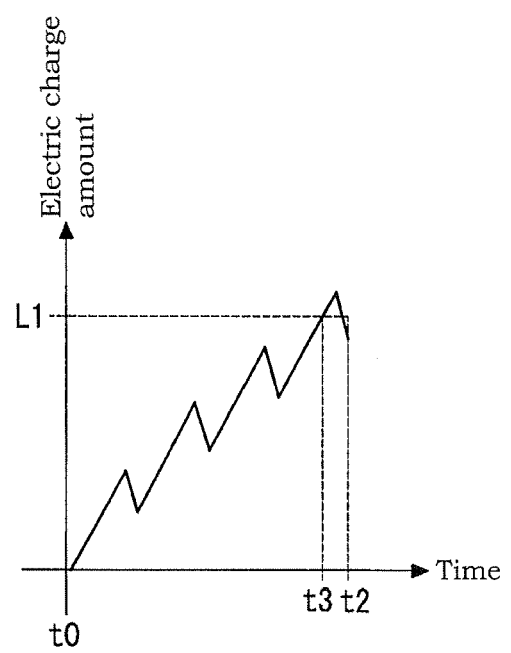
FIGS. 6A and 6B are explanatory diagrams for another operation examples in this embodiment.

For example, when the number of times of the weighing periods "Pt" is set 4 times in the lighting period "Pb", a constant amount of the undesired electric charges is discarded by the four weighing periods "Pt" in the lighting period "Pb" between the time "t0" and the time "t2", as shown in FIG. 6A. In this case, although the undesired electric charges are removed every weighing period "Pt", the electrons accumulated in the charge accumulating portion D3 gradually increases as a whole.

In the above operation, when the amount of the undesired electric charges discarded by one weighing period "Pt", and the number of times of the weighing periods "Pt" are appropriately set, the amount of electrons accumulated in the charge accumulating portion D3 does not exceed a saturation level L1 of the photodetector 1. However, when the environmental light is greater than an initial assumption, a phenomenon that the amount of electrons accumulated in the charge accumulating portion D3 exceeds the saturation level L1 may happen before the end, i.e., the time "t2" of the lighting period "Pb". In FIG. 6A, the electric charge amount exceeds the saturation level L1 at the time "t3". In such a case, a part of the information of the signal light is lost from the received-light output taken out from the photodetector 1.

Due to this reason, it is needed to detect as to whether the electric charge amount has reached the saturation level L1 in the lighting period "Pb". To detect that the electric charge amount has reached the saturation level L1, for example, it is preferred that the weighing periods "Pt" are set such that the lighting period "Pb" is finished after the elapse of a constant time period from the last weighing period "Pt" in the lighting period "Pb". The time period between the last weighing period "Pt" and the end of the lighting period "Pb" is set to be equal to the time interval between adjacent weighing periods "Pt".

Here, it is assumed that four weighing periods "Pt" are set in one lighting period "Pb", and saturation happens between the third weighing period "Pt" and the fourth weighing period "Pt". In this case, since the undesired electric charges are discarded by the fourth weighing period "Pt", so that the electric charge amount is lower than the saturation level L1, the occurrence of saturation can not be detected when the received-light output is taken out at the end of the last (fourth) weighing period "Pt". On the other hand, as described above, when the lighting period "Pb" is finished after the elapse of the constant time period from the end of the last weighing period "Pt", and then the received-light output is taken out, it becomes possible to detect the occurrence of saturation in the lighting period "Pb" because the received-light output reaches the saturation level L1 again.

Figure 6B:
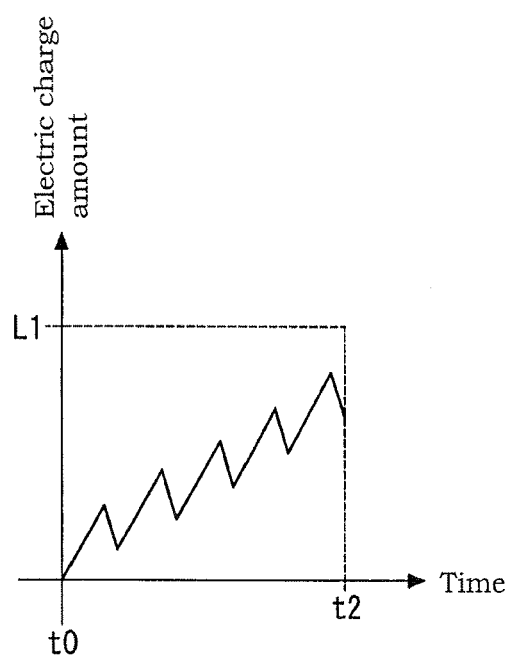

In addition, even when the amount of electrons accumulated in the charge accumulating portion D3 exceeds the saturation level L1 before the time "t2", there is a case that the electric charge amount can be controlled so as not to exceed the saturation level L1 by increasing the number of times of the weighing periods "Pt" without changing the lighting period "Pb". For example, assuming that the four weighing periods "Pt" are set in the lighting period "Pb" between the time "t1" and the time "t2", as shown in FIG. 6A, and the amount of electrons accumulated in the charge accumulating portion D3 exceeds the saturation level L1 immediately before the fourth weighing period "Pt", it may be possible to prevent that the amount of electrons accumulated in the charge accumulating portion D3 exceeds the saturation level L1 before the time "t2" by increasing the number of times of the weighing periods "Pt" in the lighting period "Pb" from 4 times to 5 times, as shown in FIG. 6B. In other words, when each of the weighing periods "Pt" is set to be relatively shorter, the undesired electric charges may be discarded before the saturation of the photodetector 1. As a result, it becomes possible to increase a ratio of electrons corresponding to the signal light in the received-light output even under a larger amount of the environmental light. That is, even when the received-light intensity of the environmental light increases, the received light output with the information of the signal light can be obtained.

The number of times of the weighing periods "Pt" in the lighting period "Pb" is determined by using at least the received-light output obtained in the rest period "Pd" from the photodetector 1. If necessary, the received-light amount obtained in the rest period "Pd" may be also used. Procedures for determining the number of times of the weighing periods "Pt" are explained below. Since the weighing operation is performed plural times in the weighing period "Pt", each weighing period "Pt" can be regarded as an operation for discarding the undesired electric charges. In addition, when the weighing period "Pt" is performed plural times in the lighting period "Pb" such that a time interval is provided between adjacent weighing periods "Pt", it means that the weighing operation for discarding the undesired electric charges are performed plural times at intervals of time.

Since the received-light intensity of the environmental light is reflected on the received-light amount obtained in the rest period "Pd", the amount of the undesired electric charges accumulated in the lighting period "Pb" can be estimated from the received-light amount obtained in the rest period "Pd". In addition, the electric charge amount discarded per one weighing period "Pt" is determined by the received-light amount obtained in the rest period "Pd". Therefore, by determining the received-light amount of the rest period "Pd", it is possible to recognize a tendency of a change with time in the amount of electrons accumulated in the lighting period "Pb". At this time, the amount of electrons corresponding to the signal light is not clear. However, it can be regarded that the amount of electrons corresponding to the signal light is almost uniformly increases in the lighting period "Pb". Therefore, it is possible to estimate the amount of the undesired electric charges to be discarded in consideration of the saturation level L1, and determine a candidate value for the number of times of the weighing periods "Pt".

After the candidate value is determined, whether the number of times of the weighing periods "Pt" is proper or not is evaluated by monitoring a magnitude of the received-light output obtained in the case of using the candidate value by the received-light processing circuit 3. For this evaluation, an upper limit value and a lower limit value are set, and the number of times of the weighing periods "Pt" is adjusted by comparing the received-light output with the upper limit value and the lower limit value.

For example, when the received-light amount exceeds the upper limit value, a new candidate value is prepared by adding "1" to the candidate value for the number of times of the weighing periods "Pt". On the other hand, when the received-light amount is smaller than the lower limit value, another new candidate value is prepared by subtracting "1" from the candidate value for the number of times of the weighing periods "Pt". By repeating this processing, the received-light amount can be maintained to an appropriate value between the upper limit value and the lower limit value. When the received-light output is not between the upper limit value and the lower limit value, it is not adopted. That is, the received-light output of the period is interpolated or substituted by the received-light output of another period.

In place of determining the candidate value for the number of times of the weighing periods "Pt" according to the received-light amount obtained in the rest period "Pd", a predetermined default value may be used as the candidate value. In this case, the received-light amount of the rest period "Pd" is used only to determine the amount of the undesired electric charges discarded in one weighing operation "W". The number of times of the weighing operation "W" in one weighing period "Pt" is not changed.

To determine the number of times of the weighing periods "Pt" in the lighting period "Pb", the received-light processing circuit 3 executes the above-explained processing according to the received-light amount and the received-light output obtained in the rest period "Pd", and the timing control circuit 4 controls the operation of the photodetector 1 in response to the number of times of the weighing periods "Pt" determined by the received-light processing circuit 3. The processing for adjusting the number of times of the weighing periods "Pt" such that the received-light output is put between the upper limit value and the lower limit value is not needed every lighting period "Pb". According to the use environment, it is enough to execute the processing every time corresponding to an appropriate number of times of the lighting periods "Pb". For example, a standard frequency can be set as a default value. When there is a large change in environmental light, the frequency is increased than the standard frequency. On the contrary, when there is a small change in environmental light, the frequency is decreased than the standard frequency.

When the received-light output has reached the saturation level in the lighting period "Pb", the received-light output obtained in this lighting period "Pb" can not be used to detect the spatial information. Therefore, this received-light output is discarded, and the amount of the undesired electric charges separated in the next lighting period "Pb" is changed to obtain an appropriate received-light output in the next or later lighting period "Pb". As a technique for changing the amount of the undesired electric charges, the number of times of the weighing periods "Pt" is preferably changed, as explained above. Alternatively, as the rest period "Pd" is extended, the electric charge amount discarded in one weighing period "Pt" increases. In addition, when a plurality of sensitivity control electrodes 17a to 17h (FIG. 12) are formed, as described later, the light receiving area can be substantially controlled by changing the number of the sensitivity control electrodes, to which a voltage is applied to form a potential well for collecting electric charges as the photoelectric converting portion D1 in the rest period "Pd". Therefore, by increasing the light receiving area in the rest period "Pd", it is possible to increase the electric charge amount discarded in one weighing period "Pt".

As understood from the above-described principle, from the viewpoint of performing the weighing operations "W" such that the received-light output does not exceed the saturation level L1, it is preferred that the weighing operations "W" are uniformly distributed in the lighting period "Pb", as compared with the case where the weighing operations "W" are performed in a lump in the weighing period "Pt". That is, as shown in FIG. 5B, it is preferred to set a time interval between adjacent weighing operations "W" in the lighting period "Pb". In addition, it is preferred that the time interval is set to be shorter as the received-light output obtained in the rest period "Pd" becomes larger. According to this technique, it is possible to reduce an increase rate of the electric charge amount accumulated in the charge accumulating portion D3, and improve the effect of preventing the charge accumulating portion D3 from the saturation because the electric charge amount accumulated is hard to reach the saturation level L1.

By the way, the amount of the undesired electric charges discarded in one weighing period "Pt" is calculated to preserve all of the electrons generated by the signal light. However, since the weighing operation "W" is performed plural times in one weighing period "Pt", and the amount of the undesired electric charges discarded in one weighing operation "W" is determined by the received-light amount of the rest period "Pd", it may be difficult to preserve only all of the electrons corresponding to the signal light. Therefore, in fact, a slightly larger amount of electrons than all of the electrons corresponding to the signal light is preserved. In this case, to expand the dynamic range with respect to the signal light, it is desired to minimize the excessive amount of electrons.

The amount of the undesired electric charges discarded in one weighing operation "W" is determined by the received-light amount of the rest period "Pd", and this received-light amount is represented as a function of length (continuous time) of the rest period "Pd". Therefore, when the total amount of the undesired electric charges discarded in one weighing period "Pt" is calculated, it is possible to determine the amount of the undesired electric charges discarded in one weighing operation "W" such that the excessive amount of electrons becomes minimum by changing the length of the rest period "Pd".

In addition, since the amount of the undesired electric charges discarded in one weighing operation "W" decreases as the rest period "Pd" becomes shorter, the excessive amount of electrons can be reduced. Alternatively, it is also possible to reduce the excessive amount of electrons by extending the rest period "Pd" such that one weighing operation "W" is performed in one weighing period "Pt". However, in the former case, a ratio of the processing for the weighing operations "W" in the lighting period "Pb" becomes large due to an increase in the number of times of the weighing operation "W". In the later case, the rest period "Pd" is prolonged. Therefore, in these cases, the information amount obtained per unit time from the signal light is reduced.

In addition, it is preferred that upper and lower limits are set with respect to the number of times of the weighing operation "W" in one weighing period "Pt", and upper and lower limits are set with respect to the length of the rest period "Pd". In this case, each of the amount of the undesired electric charges discarded in one weighing operation "W" and the number of times of the weighing operation "W" in one weighing period "Pt" are determined such that the excessive amount of electrons becomes minimum within the ranges between these upper and lower limits. As a result, it becomes possible to set conditions for the weighing period "Pt" so as to prevent that the number of times of the weighing operation "W" extremely increases, while relatively shortening the rest period "Pd".

By the way, the amount of the undesired electric charges discarded in the weighing period "Pt" is calculated as a product of the number of times of the weighing operation "W" in the weighing period "Pt" and the amount of the undesired electric charges discarded in one weighing operation "V". The amount of the undesired electric charges discarded in one weighing operation "W" is determined by the received-light amount of the rest period "Pt". In addition, the received-light amount of the rest period "Pt" is determined by the length (continuous time) of the rest period "Pt" and the received-light intensity of the environmental light To set the conditions for the weighing period "Pt", a default value is set with respect to the length of the rest period "Pd". The received-light intensity of the environmental light is estimated by use of the received-light amount obtained in the rest period "Pd" having the time length of the default value, and then the total amount of undesired electric charges discarded every weighing period "Pt" is determined. In addition, the amount of the undesired electric charges discarded in one weighing operation "W" is determined by use of the received-light amount of the rest period "Pd" having the time length of the default value.

Next, the total amount of the undesired electric charges discarded every weighing period "Pt" is divided by the amount of the undesired electric charges discarded in one weighing operation "W" to obtain a quotient and a remainder. When the quotient is between the upper and lower limits of the number of times of the weighing operation "W" in the weighing period "Pt", the amount of the undesired electric charges discarded in one weighing operation "W" is determined to reduce the remainder. According to this amount, the length of the rest period "Pd" is calculated back. When the length of the rest period "Pd" obtained from the back calculation is between the upper and lower limits, the rest period "Pd" is set to the length determined by the back calculation.

When the length of the rest period "Pd" or the number of times of the weighing operation "W" deviates from the range between the upper and lower limits, the number of times or the length is adjusted within the range therebetween.

In an image sensor having a plurality of the photoelectric converting portions D1, when the above-described processing is performed in each of the photoelectric converting portions D1, the processing load increases. Therefore, it is preferred that the rest period "Pd" is set to be short, and at the same time the number of times of the weighing operation "W" is set to be large, such that the amount of the undesired electric charges separated by one weighing operation "W" is smaller than a predetermined value with respect to all of the photoelectric converting portions D1. As the amount of the undesired electric charges discarded by one weighing operation "W" becomes smaller, the number of times of the weighing operation "W" increases. However, the time needed for one weighing operation "W" is very short. Therefore, an increase in the total time needed to receive light by the photoelectric converting portion D1, discard the undesired electric charges, and then take out the received-light output is small. On the other hand, since the rest period "Pd" is shortened, it is possible to relatively increase the time used to detect the spatial information in the lighting period "Pb".

In the image sensor having the plural photoelectric converting portions D1, to simply control the operation timings according to the outputs of the timing control circuit 4, it is preferred that the same number of times of the weighing operation "W" is set with respect to all of the photoelectric converting portions D1. Therefore, as described above, to reduce the amount of the undesired electric charges separated by one weighing operation "W", it is desired that the number of times of the weighing operation "W" in the weighing period "Pt" is set to be as large as possible.

Thus, with respect to all of the pixels, the signal processing portion reduces the amount of the undesired electric charges separated by one weighing operation "W", and also increases the number of times of the weighing operation "W" by shortening the rest period such that the remainder obtained by dividing with the amount of the undesired electric charges separated by one weighing operation "W" is smaller than the prescribed value. According to this configuration, when the undesired electric charges are separated by performing the weighing operation plural times, the rest period is shortened, and the number of times of the weighing operation is increased. As a result, despite repeating the weighing operation the same number of times with respect to each of the photoelectric converting portions of the photodetector, the amount of the undesired electric charges left without being separated from the electric charges generated by each of the photoelectric converting portions becomes small. Thus, it is possible to reduce an amount of undesired components other than the signal-light component, which are mixed in the electric charges taken out as the received-light output.

By the way, when the undesired electric charges are separated and discarded, as described above, most of the received-light output corresponds to the signal-light component. However, when the received-light intensity of the signal light increases, the photodetector 1 may be saturated. On the other hand, when the received-light intensity of the signal light lowers, the S/N ratio may deteriorate due to the influence of internal noise such as shot noise. In the above operation example, the amount of the undesired electric charges is adjusted under a constant length of the lighting period "Pb". In the case of adjusting the received-light amount of the signal light at the light receiving side, it is also needed to adjust the length of the lighting period "Pb".

For example, as shown in FIG. 7A, it is preferred that the length of the lighting period is selectable from plural lengths (Pb1, Pb2, Pb3). By selecting one of the lighting periods (Pb1, Pb2, Pb3) to obtain an approximate received-light output, the dynamic range can be improved with respect to the signal light. That is, the length of the lighting period (Pb1, Pb2, Pb3) is determined such that the received-light output is obtained as large as possible under the condition that the photodetector 1 is not saturated. In the case of using this technique, the amount of the undesired electric charges changes due to the change in length of the lighting period (Pb1, Pb2, Pb3).

It is explained about a case where the length of the lighting period (Pb1, Pb2, Pb3) is changed under an environment with the signal light as well as the environmental light. When the undesired electric charges are not discarded, both of an amount of electric charges corresponding to the environmental light and an amount of electric charges corresponding to the signal light increase as the lighting period becomes longer. Therefore, as described above, it is needed to discard the undesired electric charges such that saturation does not occur.

The amount of the undesired electric charges discarded per one weighing operation "W" is increased or decreased in response to the received-light amount of the environmental light obtained in the rest period (Pd1, Pd2, Pd3). Therefore, by changing the length of the rest period (Pd1, Pd2, Pd3) in response to the length of the lighting period (Pb1, Pb2, Pb3), the amount of the undesired electric charges separated by one weighing operation can be adjusted.

That is, the amount of the undesired electric charges collected in the lighting period (Pb1, Pb2, Pb3) is proportional to the length of the lighting period (Pb1, Pb2, Pb3). In addition, the amount of the undesired electric charges discarded by one weighing operation "W" is proportional to the received-light amount obtained in the rest period (Pd1, Pd2, Pd3). Therefore, when the same number of times of the weighing periods "Pt" is set in each of the lighting periods (Pb1, Pb2, Pb3) irrespective of the length of the lighting period (Pb1, Pb2, Pb3), the amount of the undesired electric charges to be discarded can be appropriately adjusted by setting a proportional relation between the length of the lighting period (Pb1, Pb2, Pb3) and the length of the rest period (Pd1, Pd2, Pd3). In this case, since it is needed that the number of times of the weighing periods "Pt" is equally set in the lighting periods (Pb1, Pb2, Pb3) having different lengths, an time interval between the weighing periods "Pt" is adjusted in response to the length of the lighting period (Pb1, Pb2, Pb3).

In the above-explained operation, the length of the rest period (Pd1, Pd2, Pd3) is changed in response to the length of the lighting period (Pb1, Pb2, Pb3). Alternatively, as shown in FIG. 7B, it is also preferred that the length of the rest period "Pd" is kept constant irrespective of the length of the lighting period (Pb1, Pb2, Pb3), and the number of times of the weighing operation "W" in one weighing period "Pt" is changed depending on the length of the lighting period (Pb1, Pb2, Pb3). Since the amount of the undesired electric charges discarded in the weighing operation "W" is determined by the received-light amount obtained in the rest period "Pd", it does not depend on the length of the lighting period (Pb1, Pb2, Pb3). Therefore, the number of times of the weighing operation "W" in the weighing period "Pt" can be changed with respect to each of the lighting periods (Pb1, Pb2, Pb3).

In this operation, the amount of the undesired electric charges discarded in one weighing period "Pt" is adjusted in response to the length of the lighting period (Pb1, Pb2, Pb3). Therefore, it is substantially equivalent to the operation of adjusting the length of the rest period (Pd1, Pd2, Pd3). In this regard, since the amount of the undesired electric charges discarded in the weighing period "Pt" is an integral multiple of the amount of the undesired electric charges discarded by one weighing operation "W", there is a possibility that the amount of undesired components other than the signal light component slightly increases in the received-light output, as compared with the operation of adjusting the length of the rest period (Pd1, Pd2, Pd3) in response to the length of the lighting period (Pb1, Pb2, Pb3)

In the case of repeating the weighing operation "W" plural times in the lighting period "Pb", the amount of the undesired electric charges discarded by one weighing operation "W" can be reduced, as compared with the case of performing only one weighing operation "V" in the lighting period "Pb". As a result, since the rest period "Pd" becomes short, it is possible to reduce the total time of the lighting period "Pb" and the rest period "Pd". In addition, by setting plural weighing periods "Pt" in the lighting period "Pb" it becomes possible to accumulate the electrons corresponding to the signal light, while keeping the state not exceeding the saturation level L1 even when the environmental light increases.

On the other hand, in the case of setting plural weighing periods "Pt" in the lighting period "Pb", since the amount of the undesired electric charges discarded in one weighing period "Pt" is set such that the component corresponding to the signal light is not discarded as the undesired electric charges, there is a possibility that residual undesired electric charges are accumulated during the operation where the weighing period "Pt" is repeated plural times. That is, the amount of the undesired electric charges discarded in one weighing period "Pt" is ideally regulated such that only the amount of electrons corresponding to the signal light remains. However, in fact, since the residual electrons other than the electrons corresponding to the signal light are generated every weighing period "Pt", and accumulated, the component corresponding to the residual electrons as well as the component corresponding to the signal light are contained in the received-light output.

That is, as shown in FIG. 8, an amount V1 of electrons accumulated before a weighing period "Pt" in the lighting period "Pb" is larger than a total of an amount V2 of the undesired electric charges to be discarded and an amount V3 of electrons corresponding to the signal light. After the undesired electric charges are discarded, there are residual electrons (an electric charge amount V4) such as noises other than the electrons corresponding to the signal light. Since most of the residual electrons are generated by internal noises such as shot noise, the amount of the residual electrons cannot be estimated from the received-light amount obtained in the rest period "Pd". In this regard, although the amount of the residual electrons per one weighing period "Pt" resulting from the shot noise and so on change with time passage, it becomes almost constant on an average.

The residual electrons described above occur every weighing period "Pt", and are accumulated during the lighting period "Pb". Therefore, when the weighing period "Pt" is repeated in the lighting period "Pb", there is a case that the amount of the residual electrons reaches the amount of the undesired electric charges discarded by one weighing operation "W". As described above, since an average value of the amount of the residual electrons can be estimated, it is possible to determine the number of times of the weighing period "Pt" needed to accumulate the residual electrons corresponding to the amount of the undesired electric charges discarded by one weighing operation.

From this viewpoint, it is preferred that the number of times of the weighing operation "W" is increased by just "one time" every time that the number of times of the weighing period "Pt" reaches the estimated number of times. Thereby, it is possible to remarkably reduce the residual electrons. In addition, according to this operation, it is possible to prevent that the dynamic range for the signal light is deteriorated by the influence of the residual electrons.

In the case of repeating the weighing operation "W" plural times in the lighting period "Pb", since the amount of the undesired electric charges to be discarded can be estimated by use of the received-light amount of the rest period "Pd", it is needed to take out the electrons corresponding to the received-light amount of the rest period "Pd" to the outside of the photodetector 1. This configuration is preferably used in the present embodiment. In addition, in the following embodiments, the electrons corresponding to the received-light amount of the rest period "Pd" may be taken out to the outside of the photodetector 1.

In addition, it is not essential to alternately perform the rest period "Pd" for estimating the amount of the undesired electric charges and the lighting period "Pb". The amount of the undesired electric charges estimated in one of the rest periods "Pd" can be utilized in plural lighting periods "Pb". In addition, since the time interval between adjacent lighting periods "Pb" can be set to be shorter than the rest period "Pd", it is possible to increase a ratio of the period for receiving the signal light in unit time, and consequently increase the period for detecting the spatial information of the target space. The relation between the rest period "Pd" and the lighting period "Pb" can be used in a similar fashion in the following embodiments.

As described above, in the present embodiment, the signal processing portion controls the photodetector such that a plurality of the weighing periods, in each of which the undesired electric charges are separated with the amount determined according to the received-light amount obtained in the rest period, are set in the lighting period. In addition, the weighing operation is repeated plural times in each of the weighing periods. The number of times of the weighing operation is increased every timing corresponding to a prescribed number of times of the weighing period. The prescribed number of times can be determined by use of the amount of electric charges resulting from the noise components in one lighting period and the amount of the undesired electric charges discarded by one weighing operation. Therefore, it is possible to reduce the ratio of the undesired electric charges resulting from the noise components in the received-light output, and increase the dynamic range with respect to the signal light component.

Furthermore, when the signal processing portion increases the number of times of the operation of discarding the undesired electric charges in the lighting period to increase the amount of the undesired electric charges separated in the lighting period, the amount of the undesired electric charges to be discarded can be easily controlled by only managing the number of times of the operation of discarding the undesired electric charges.

In addition, under the condition that the signal processing portion controls the photodetector such that the operation of discarding the undesired electric charges is performed plural times in the lighting period, a time interval is set between the adjacent operations, and the time interval is reduced as the received-light output obtained in the rest period increases, when the electric charges collected by the photoelectric converting portion in the lighting period increases, the undesired electric charges are discarded. Therefore, it is possible to reduce the increasing rate of the electric charges collected in the photoelectric converting portion, and prevent the saturation of the received-light output even under an increase in the received-light intensity of the environmental light. That is, since the undesired electric charges are discarded by little and little during the lighting period, the amount of the electric charges collected in the photoelectric converting portion becomes hard to reach the saturation level, as compared with the case where the undesired electric charges are discarded in a lump at the end of the lighting period. Moreover, since the time interval between the weighing operations is shortened when the environmental light increases, it is possible to reduce the increasing rate of electric charges collected in the photoelectric converting portion, and prevent the saturation resulting from the environmental light.

In the above explanation, either one weighing operation or plural weighing operations performed continuously can be used to discard the undesired electric charges. The period where the weighing operation is continuously performed plural times corresponds to the weighing period described above.

In addition, when the signal processing portion selects one of plural lighting periods having different continuous times according to the received-light intensity of the signal light, and increases or decreases the number of times of the weighing operation in response to the continuous time of the lighting period, it is possible to expand the dynamic range with respect to the signal light. In addition, since the amount of the undesired electric charges to be discarded is controlled by increasing or decreasing the number of times of the weighing operation in response to a change in continuous time of the lighting period, the continuous time of the rest period can be maintained constant irrespective of the continuous time of the lighting period. As a result, it is possible to relatively reduce an increase or decrease in the total time of the rest period and the lighting period. In other words, by setting the continuous time of the rest period to relatively short, the increase or decrease in the total time of the lighting period and the rest period depends only on the increase or decrease in the continuous time of the lighting period. Therefore, the maximum value of the total time of the rest period and the lighting period becomes smaller than the case of changing the continuous time of the rest period.

Second Embodiment

The present embodiment is characterized by using the photodetector capable of automatically changing the amount of electrons separated as the undesired electric charges according to the received-light amount without using an external circuit for controlling the potential barrier B1.

Figure 9A:
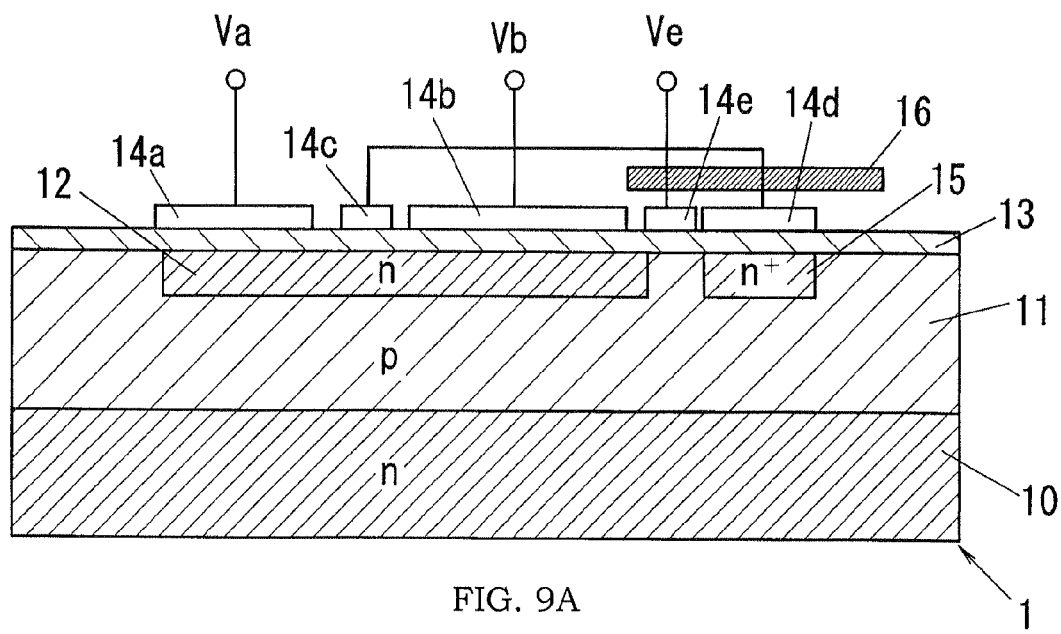
FIG. 9A is a cross-sectional view showing a second embodiment.

That is, as a configuration for automatically adjusting the amount of the undesired electric charges, the photodetector 1 of the present embodiment has a holding well 15 formed on the general surface of a device formation layer 11 at a different position from the well 12, as shown in FIG. 9A. The holding well 15 has the same conductive type as the well 12, and a lower impurity concentration than the well 12. That is, the conductive type of the holding well 15 is n+. In addition, a holding electrode 14d is disposed at a position corresponding the holding well 15 to through an insulating layer 13, and a gate electrode 14e is disposed at a position corresponding to a region between the well 12 and the holding well 15 on the device formation layer 11 through the insulating layer 13. The holding electrode 14d is electrically connected to a barrier control electrode 14c. In addition, a region of the device formation layer 11 corresponding to the holding electrode 14d and the gate electrode 14e is light-shielded by a light shielding film 16.

By the way, since the n+-type holding well 15 is surrounded by the p-type device formation layer 11, a potential well for electrons is formed in the holding well 15, as in the well 12. In this regard, since the holding well 15 has the lower impurity concentration than the well 12, the potential well having a larger depth than the well 12 is formed in the holding well 15 under the condition that no voltage is applied to a separation electrode 14a, an accumulation electrode 14b, the barrier control electrode 14c and the holding electrode 14d. The potential well formed in the holding well 15 functions as a charge holding portion D4 for holding electrons.

As the amount of the electrons held in the holding well 15 increases, the electric potential of the holding electrode 14d lowers, and the electric potential of the barrier control electrode 14c connected to the holding electrode 14d also lowers. When the electric potential of the barrier control electrode 14c lowers, the potential barrier B1 becomes high, so that the capacity of the charge separating portion D2 increases. That is, when the amount of the electrons held in the holding well 15 is increased as the environmental light becomes large, it is possible to increase the amount of electrons separated as the undesired electric charges in response to the environmental light. Therefore, it becomes possible to keep the dynamic range almost constant with respect to signal light, irrespective of an increase or decrease in the environmental light.

To increase or decrease the amount of the electrons held in the holding well 15 in response to the increase or decrease in the environmental light, it is needed that electrons generated at the photoelectric converting portion D1 by receiving the environmental light are transferred to the holding well 15, and held therein. That is, a time period for transferring the electric charges generated by the photoelectric converting portion to the holding well 15 is set. Since the holding well 15 is light-shielded by the light shielding film 16, there is no change in amount of the electrons held in the holding well 15 even when light is irradiated to the device formation layer 11 and the well 12.

By the way, in the present embodiment, since the barrier control electrode 14c is connected to the holding electrode 14d, the height of the potential barrier B1 formed at a region corresponding to the barrier control electrode 14c can not be randomly controlled. The height of the potential barrier B1 is determined by the amount of the electrons held in the holding well 15. Due to this reason, the height of the potential barrier B1 can not be controlled, as in the first embodiment explained referring to FIGS. 2A to 2D. Therefore, the present embodiment uses a technique of adjusting the potentials of the charge separating portion D2 and the charge accumulating portion D3. Thereby, electrons can be moved according to the same procedures as the first embodiment.

The present embodiment is explained in more detail. As in the first embodiment, it is assumed that the potential well formed in the well 12 under the condition that no voltage is applied to the separation electrode 14a and the accumulation electrode 14b is used as the photoelectric converting portion D1. In addition, a drain (not shown) is formed adjacent to the holding well 15 to discard the electrons collected in the holding well 15. First, electrons remaining in the well 12 and the holding well 15 are discarded. In this state, no voltage is applied to the separation electrode 14a, the accumulation electrode 14b, the barrier control electrode 14c, the holding electrode 14d and the gate electrode 14e. In the well 12, a potential well is formed, as in the case of FIG. 2A. This potential well functions as the photoelectric converting portion D1. At this time, the light emission source is not turned on, and only the environmental light is incident on the photoelectric converting portion D1. Therefore, electrons generated in this period by the photoelectric converting portion D1 correspond to the received-light amount of the environmental light.

After the electrons in the well 12 and the holding well 15 are discarded, the amount of electrons corresponding to the received-light amount of the environmental light are collected in the photoelectric converting portion D1 during a predetermined time period, and then transferred to the holding well 15. That is, the amount of electrons corresponding to the environmental light obtained in the rest period where light is not projected from the light emission source is held in the holding well 15. When the electrons are transferred from the photoelectric converting portion D1 to the holding well 15, a positive voltage is applied to the gate electrode 14e to pull down a potential barrier B2 formed between the photoelectric converting portion D1 and the holding well 15. In addition, a negative voltage is applied to the separation electrode 14a and the accumulation electrode 14b such that the potential of the photoelectric converting portion D1 is pulled up so as to be larger than the potential of the holding well 15. According to this operation, the electrons can be moved from the well 12 into the holding well 15.

Thus, the amount of electrons transferred to the holding well 15 corresponds to the received-light amount in the rest period of the light emission source. Therefore, it is not needed that all of electrons generated by the photoelectric converting portion D1 flow into the holding well 15. That is, it is essential that the amount of electrons transferred from the well 12 to the holding well 15 is associated with the received-light amount of the photoelectric converting portion D1 obtained in the rest period of the light emission source.

When the electric charges corresponding to the rest period of the light emission source are held in the holding well 15, the height of the potential barrier B1 formed at the region corresponding to the barrier control electrode 14c is determined, as shown in FIG. 10A. That is, the capacity of the charge separating portion D2 is determined. As the amount of electrons flowing into the holding well 15 increases, the surface potential of the holding well 15 decreases. In response to the decrease in surface potential, the electric potential of the holding electrode 14d lowers. As a result, the voltage applied to the barrier control electrode 14c decreases, so that the potential barrier B1 becomes high. In the period "Ta" shown in FIGS. 11A to 11C, since no voltage is applied to the separation electrode 14a, the accumulation electrode 14b and the gate electrode 14e, electric potentials of the barrier control electrode 14c and the holding electrode 14d are determined by the amount of electrons held in the charge holding portion D4.

The electrons remaining in the photoelectric converting portion D1 after the electrons are transferred from the photoelectric converting portion D1 to the charge holding portion D4 are not needed. Therefore, the remaining electrons are discarded by use of the drain formed adjacent to the well 12.

Next, when the light emission source is turned on, both of the signal light and the environmental light are incident on the photoelectric converting portion D1. In this regard, since the potential barrier B1 is formed in the photoelectric converting portion D1 according to the amount of electrons held in the charge holding portion D4, an amount of electrons not exceeding the height of this potential barrier B1 is collected. That is, in the well 12, the region corresponding to the separation electrode 14a and the region corresponding to the accumulation electrode 14b function as the photoelectric converting portion D1. As in the operation shown in FIG. 2B of the first embodiment, the well 12 is divided into two regions by the formation of the potential barrier B1.

The electrons collected in one of the two regions, i.e., the charge separating portion D2 corresponding to the separation electrode 14a are discarded without being used, and the electrons collected in the charge accumulating portion D3 corresponding to the accumulation electrode 14b are used. Therefore, in the present embodiment, the region corresponding to the accumulation electrode 14b in the well 12 substantially functions as the photoelectric converting portion D1 in the lighting period where the light is projected from the light emission source. Thus, the charge accumulating portion D3 is also used as the photoelectric converting portion D1.

As shown in the period "Tb" of FIGS. 11A to 11C, no voltage is applied to the separation electrode 14a. The electrons in the charge separating portion D2 are discarded by use of the drain, as shown in FIG. 10B. Subsequently, as shown by the period "Tc" in FIGS. 11A and 11B, a positive voltage is applied to the separation electrode 14a, and a negative voltage is applied to the accumulation electrode 14b. Thereby, as shown in FIG. 10C, the potential of the charge separating portion D2 is pulled down. In addition, when the potential of the charge separating portion D2 is considerably pulled down, the potential barrier B1 is also pulled down. As a result, the electrons in the charge accumulating portion D3 (photoelectric converting portion D1) can flow into the charge separating portion D2.

In place of pulling down the potential of the charge separating portion D2, the potential of the charge accumulating portion D3 may be pulled up. In this case, to move all of the electrons in the charge accumulating portion D3 into the charge separating portion D2, it is needed that the potential of the charge accumulating portion D3 is set to be equal to or more than the potential of the potential barrier B1. In addition, the operation of pulling down the potential of the charge separating portion D2 and the operation of pulling up the potential of the charge accumulating portion D3 may be simultaneously performed.

After all of the electrons in the charge accumulating portion D3 flow into the charge separating portion D2, the voltages applied to the separation electrode 14a and the accumulation electrode 14b are removed, as shown by the period "Td" in FIGS. 11A and 11B. At this time, the capacity of the charge separating portion D2 is determined. As shown in FIG. 10D, when the electrons collected in the charge separating portion D2 exceed the capacity of the charge separating portion D2, excessive electrons flow into the charge accumulating portion D3 over the potential barrier B1. That is, a constant amount of electrons, which corresponds to the capacity of the charge separating portion D2, and is determined in response to the amount of electrons held in the charge holding portion D4 (i.e., the amount of electrons corresponding to the rest period of the light emission source), is separated as the undesired electric charges from the electrons generated by the photoelectric converting portion D1. On the other hand, the electrons returned to the charge accumulating portion D3 are used as the effective electric charges.

In the above-described embodiment, the height of the potential barrier B1 is automatically adjusted in the interior of the photodetector without using the external circuit. In addition, since the amount of the undesired electric charges are determined in response to the received-light amount of the environmental light, the dynamic range for the signal light in the received-light output can be maintained almost constant irrespective of the received-light amount of the environmental light.

In the case where an image pickup device is formed by arranging a plurality of the photoelectric converting portions D1, when the potential for determining the amount of the undesired electric charges is controlled every pixel by use of the external circuit, the configuration of the external circuit becomes incredibly complicated. On the other hand, as described in the present embodiment, when using the technique of automatically adjusting the amount of the undesired electric charges in response to the received-light amount of the environmental light, the external circuit for determining the amount of the undesired electric charges substantially becomes unnecessary. In addition, when the image pickup device and the external device are integrated in a semiconductor substrate, the S/N ratio may deteriorate due to an decrease in area ratio of the photoelectric converting portion D1 relative to the semiconductor substrate. However, in the present embodiment, since the external circuit is not substantially needed, an improved S/N ratio can be obtained. The other configurations and operations are the same as those of the first embodiment.

Thus, the electric charges corresponding to the received-light amount in an intended time period are transferred from the photoelectric converting portion to the charge holding portion by controlling the voltage applied to the gate electrode after the electric charges are generated by the photoelectric converting portion. After the transfer of the electric charges, the amount of the undesired electric charges determined in response to the electric potential of the holding electrode is separated from the electric charges corresponding to the received-light amount in a time period. The timing of transferring the electric charges generated by the photoelectric converting portion to the charge holding portion is controlled by the voltage applied to the gate electrode. As a result, it becomes possible to take out, as the received light output, effective electric charges reflecting a difference between the received-light amount in the time period for generating the electric charges transferred to the charge holding portion and the received-light amount in a subsequent appropriate time period.

In the present embodiment, the gate electrode 14e is used to control the timing of transferring the electrons from the potential well formed as the photoelectric converting portion D1 into the well 12 to the potential well formed as the charge holding portion D4 in the holding well 15. Alternatively, the gate electrode 14e may be omitted. In this case, the electrons can be transferred from the photoelectric converting portion D1 into the charge holding portion D4 by controlling the voltages applied to the separation electrode 14a and the accumulation electrode 14b.

For example, a positive voltage is applied to the separation electrode 14a and the accumulation electrode 14b to form the potential wells. After electrons are collected in the photoelectric converting portion D1, a negative voltage is applied to the separation electrode 14a and the accumulation electrode 14b, so that the electrons collected in the well 12 move toward the holding well 15. By applying the negative voltage to the accumulation electrode 14b, the potential barrier between the well 12 and the holding well 15 is broken, so that the electrons easily move from the well 12 into the holding well 15. In addition, since the negative voltage is applied to the separation electrode 14a, it is possible to prevent that the electrons collected in the well 12 move in the left direction of FIG. 9.

After the electrons move from the well 12 into the holding well 15, a positive voltage is applied to the separation electrode 14a and the accumulation electrode 14b to form the potential wells in the well 12. By these operations, it becomes possible to move the electrons from the photoelectric converting portion D1 to the charge holding portion D4 without using the gate electrode 14e.

In place of FIG. 9A, it is also preferred that the barrier control electrode 14c is electrically connected directly to the holding well 15 formed as the charge holding portion in the semiconductor substrate. That is, as shown in FIG. 9A, when the holding electrode 14d is formed on the insulating layer 13, the holding electrode 14d becomes a floating electrode. In this case, noise electric charges are easy to accumulate in a wiring between the holding electrode 14d and the barrier control electrode 14c as time advances. Therefore, it is desired to form a switch for removing (resetting) the noise electric charges from the wiring between the holding electrode 14d and the barrier control electrode 14c. On the other hand, when such a switch is formed every pixel, it may lead to increases in device size and production cost.

Figure 9B:
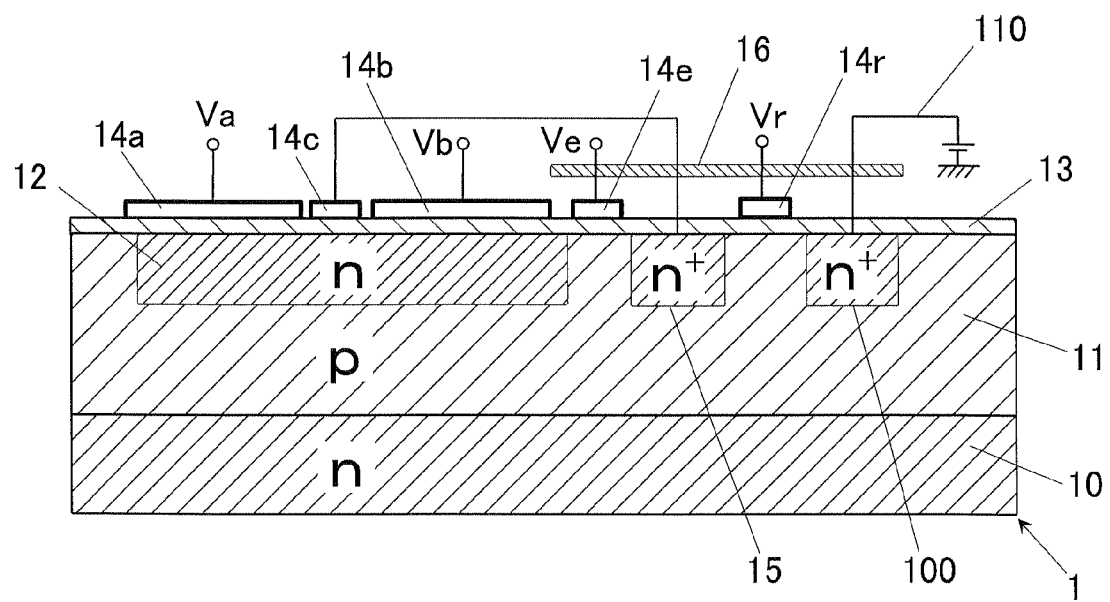
FIG. 9B is a cross-sectional view showing a modification of the second embodiment.

Therefore, the holding electrode 14d is formed on a region corresponding to the holding well 15 of the semiconductor substrate not through the insulating layer. Alternatively, a direct electrical connection is made between the barrier control electrode 14c and the region corresponding to the holding well 15 of the semiconductor substrate. In these cases, when the holding well 15 is reset, the noise electric charges in the wiring can be reliably removed by use of an adjacently formed reset means. The reset means shown in FIG. 9B is formed with a reset drain 100, a reset electrode 14r formed at a position corresponding to the region between the holding well 15 and the reset drain 100, and a circuit 110 for discarding the electric charges from the rest drain 100. By applying a predetermined voltage Vr to the reset electrode 14r, it is possible to remove the electric charges from the holding well 15 through the reset drain 100.

Third Embodiment

In the present embodiment, as in the second embodiment, the charge holding portion D4 is formed, and the capacity of the charge separating portion D2 is automatically determined according to the received-light amount of the environmental light. The present embodiment is characterized by modulating the intensity of light projected from the light emission source in the lighting period by a modulation signal having a constant frequency, and taking out received-light outputs corresponding to received-light amounts, which are obtained at timings synchronized with two different phase zones of the modulation signal. In addition, a since wave is used as the waveform of the modulation signal to take out the received-light outputs, which respectively correspond to the received-light amount obtained in the phase zone of 0 to 180 degrees (hereinafter referred to as the phase zone "P0") and the received-light amount of obtained in the phase zone of 180 to 360 degrees (hereinafter referred to as the phase zone "P2"). As the waveform of the modulation signal, a rectangular wave, a triangular wave or a saw-tooth wave may be used. In addition, the phase zones for obtaining the received-light amounts are not limited to the above-mentioned phase zones.

In the present embodiment, an image sensor is configured by arranging a plurality of cells 1. The received-light outputs of the above-mentioned two phase zones can be simultaneously taken out every operation of taking out the received-light output of 1 frame from the image sensor. In the case of taking out the received-light outputs of the two phase zones by the 1 frame, a configuration of detecting the received-light amount with respect to each of the phase zones, and a configuration of accumulating the received-light output with respect to each of the phase zones are needed for each of the cells 1. Therefore, the photoelectric converting portion D1 is formed separately from the charge separating portion D2 and the charge accumulating portion D3.

Figure 12A:
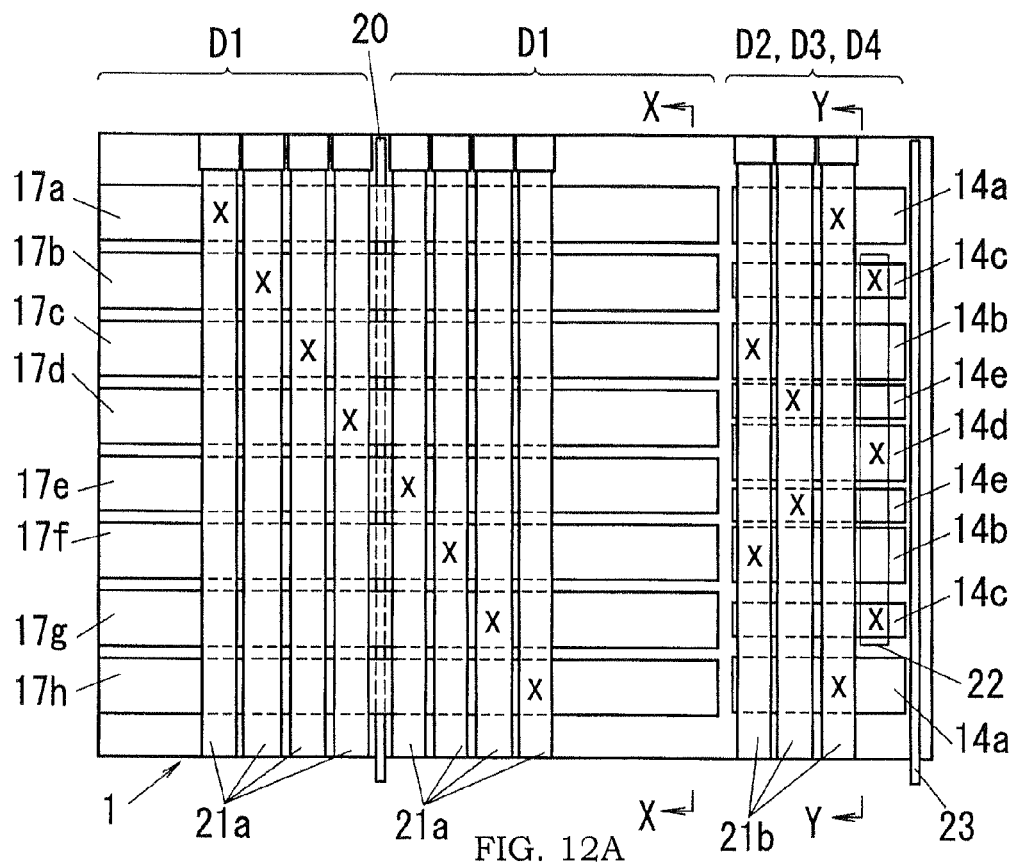
FIG. 12A is a plan view showing a third embodiment.
Figure 12B:
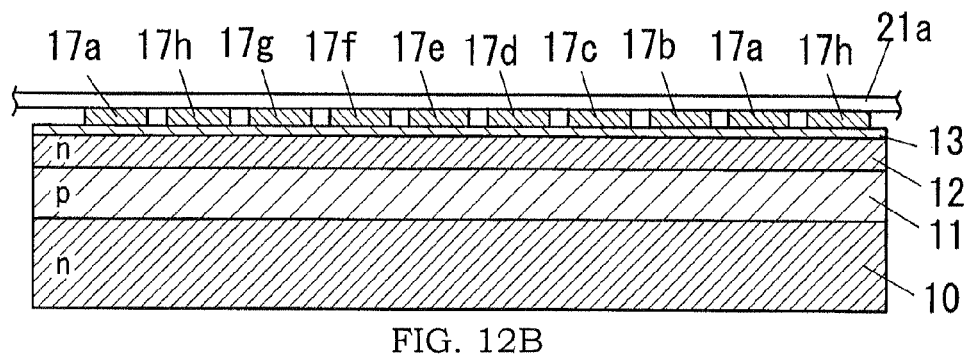
FIG. 12B is a cross-sectional view taken along the line X-X in FIG. 12A.
Figure 12C:
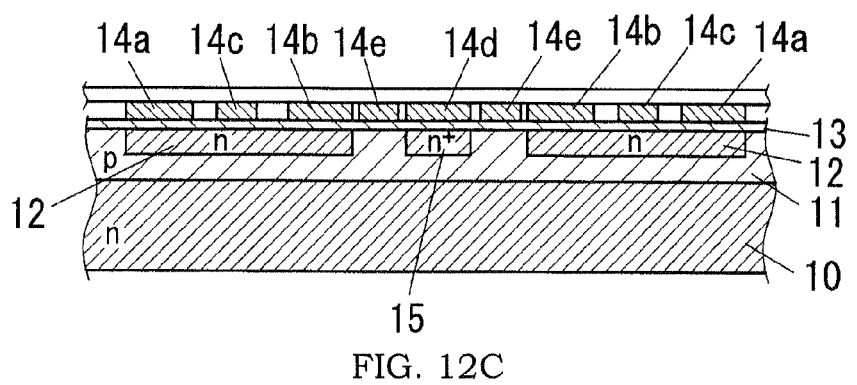
FIG. 12C is a cross-sectional view taken along the line Y-Y in FIG. 12A.

Referring to FIGS. 12A to 12C, the present embodiment is explained in more detail. The photoelectric converting portion D1 is provided with a well (not shown) formed on the general surface of a device formation layer 11, and a plurality of sensitivity control electrodes (e.g., eight sensitivity control electrodes 17a to 17h) arranged on the well through an insulating layer 13. The well has a different conductive type from the device formation layer 11. It is desired that this well is formed separately from a well 12 functioning as the charge separating portion D2 and the charge accumulating portion D3, and electric charges are transferred to the well 12 through a gate. Alternatively, these wells may be continuously formed. In this case, the electric charges can be transferred by potential controlling. Four sensitivity control electrodes (17a to 17d) in the eight sensitivity control electrodes (17a to 17h) are used as group for one of the phase zones, and the remaining four sensitivity control electrodes (17e to 17h) are used as a group for the other phase zone. A control wiring 21a is connected to each of the sensitivity control electrodes (17a to 17h). Therefore, a voltage applied to each of the sensitivity control electrodes (17a to 17h) can be controlled independently. In the drawing, the symbol "X" designates a connection point between the control wiring 21a and each of the sensitivity control electrodes (17a to 17h).

A longitudinal direction of FIG. 12A corresponds to the vertical direction of the image sensor. In the drawing, only one cell 1 is shown in the vertical direction. That is, the one cell 1 has the eight sensitivity control electrodes (17a to 17h) arranged in the vertical direction. A part of another cell 1 adjacent to the cell 1 in the horizontal direction is shown in the drawing. Each of the sensitivity control electrodes (17a to 17h) extends over a range of the adjacent two cells 1 in the horizontal direction. The numeral 20 designates a cell dividing portion formed between the adjacent cells 1 in the horizontal direction to prevent crosstalk between the cells 1 in the horizontal direction. The cell dividing portion 20 is formed on the general-surface side of the device formation layer 11 by use of a semiconductor having a different conductive type from the device formation layer 11. In the drawings, four control wirings 21a are provided at each of both sides of the cell dividing portion 20. Therefore, an area of the control wirings 21a in the photoelectric converting portion D1 can be equally determined with respect to each of the two cells adjacently formed in the horizontal direction. Therefore, the photoelectric converting portions D1 of the adjacent two cells 1 can have the same sensitivity. In addition, the sensitivity control electrodes located at the same positions in the plural cells 1 arranged in the vertical direction are connected to the same control wiring 21a.

In the present embodiment, as described above, the photoelectric converting portion D1 having the sensitivity control electrodes (17a to 17h) is formed separately from the charge separating portion D2 and the charge accumulating portion D3. In addition, the charge separating portion D2, the charge accumulating portion D3 and the charge holding portion D4 are arranged adjacent to the sensitivity control electrodes (17a to 17h) in the horizontal direction. Although it is not shown in the drawing, the charge separating portion D2, the charge accumulating portion D3 and the charge holding portion D4 of the right one of the two cells 1 adjacently formed in the horizontal direction are disposed at the right side of the photoelectric converting portion D1. On the other hand, those portions of the left one of the two cells 1 adjacently formed in the horizontal direction are disposed at the left side of the photoelectric converting portion D1. In addition, the charge separating portion D2 and the charge accumulating portion D3 are formed every group of the sensitivity control electrodes (17a to 17h). The charge holding portion D4 is shared by the two groups constructing one cell 1 because the charge holding portion D4 is used to hold the electrons corresponding to the environmental light, and it can be regarded that there is no change in the environmental light between the two groups. Due to this configuration, when a same voltage is applied to the barrier control electrodes 14c of the two groups, potential barriers B1 having a same height can be obtained in the two groups. Thus, when plural sets of the charge separating portion and the charge accumulating portion are formed, and the charge holding portion is shared by the two barrier control electrodes 14c formed adjacently, there is an advantage of downsizing the device formation area, as compared with the case of independently forming the charge holding portion.

In each of the groups, the accumulation electrodes 14b are formed adjacent to the sensitivity control electrodes (17c, 17f). Electrons generated by the photoelectric converting portion D1 can be transferred from a region corresponding to the sensitivity control electrode (17c, 17f) to the charge accumulating portion D3. In this regard, by regulating the potential relation between the photoelectric converting portion D1 and the charge accumulating portion D3, it becomes also possible to move the electrons from the charge accumulating portion D3 to the photoelectric converting portion D1. Alternatively, a flow of the electric charges between the photoelectric converting portion D1 and the charge accumulating portion D3 may be controlled by disposing a gate electrode (not shown) therebetween.

Moreover, in each of the groups, the separation electrodes 14a are disposed adjacent to the sensitivity control electrodes (17a, 17h). On the other hand, the holding electrode 14d shared by the both groups is disposed adjacent to a region straddling between the sensitivity control electrodes (17d, 17e). The separation electrode 14a, the accumulation electrode 14b and the gate electrode 14e are respectively connected to control wirings 21b. The barrier control electrode 14c is connected to the holding electrode 14d through a connection wire 22. That is, the control wirings 21b are respectively used to make connections between the separation electrodes 14a of the groups, between the accumulation electrodes 14b of the groups, and between the gate electrodes 14e of the groups. Therefore, the movement of electrons among the charge separating portion D2, the charge accumulating portion D3 and the charge holding portion D4 can be controlled by use of these three control wirings 21b. In the drawing, the symbol "X" designates a connection point between the control wiring 21b or the connection wire 22 and the separation electrode 14a, the accumulation electrode 14b, the barrier control electrode 14c, the holding electrode 14d or the gate electrode 14e.

The voltages applied to the sensitivity control electrodes (17a to 17h) are controlled so as to be synchronized with the modulation signal used to modulate the intensity of the light projected from the light emission source. For example, in the phase zone P0, a positive voltage is applied to each of the sensitivity control electrodes (17a to 17d) and the sensitivity control electrode 17f. On the other hand, in the phase zone P2, a positive voltage is applied to each of the sensitivity control electrode 17c and the sensitivity control electrodes s (17e to 17h). When the positive voltage is applied to each of the sensitivity control electrodes (17a to 17h), a potential well for collecting electrons is formed at a region corresponding to each of the sensitivity control electrodes in the cell.

When the voltages applied to the sensitivity control electrodes (17a to 17h) are controlled, as described above, electrons generated in the phase zone P0 by light irradiation are collected in the regions corresponding to the sensitivity control electrodes (17a to 17d) of the well, and on the other hand, electrons generated in the phase zone P2 by light irradiation are collected in the regions corresponding to the sensitivity control electrodes (17e to 17h) of the well. That is, the area where electrons are generated by light irradiation can be changed by controlling the voltage applying pattern to the sensitivity control electrodes (17a to 17h). This is substantially equivalent to control the sensitivity of the photodetector.

In the phase zone P0, since the potential well is also formed at the region corresponding to the sensitivity control electrode 17f, the electrons collected in the phase zone P2 can be held in this potential well. On the other hand, in the phase zone P2, the electrons collected in the phase zone P0 can be held in the potential well formed at the region corresponding to the sensitivity control electrode 17c.

Therefore, the electrons generated by light irradiation with respect to each of the phase zones can be collected over plural cycles of the modulation signal. For example, when the modulation signal is 10 MHz, and a period for generating electrons at the photoelectric converting portion D1 is 15 ms, the plural cycles correspond to 150000 cycles. Even in the period for holding the electrons in the region corresponding to the sensitivity control electrode (17c, 17f), electrons are generated at the region corresponding to the sensitivity control electrode (17c, 17f). However, since an electron collecting area in the period for collecting electrons is 4 times larger than the electron collecting area in the period for holding electrons (i.e., the area ratio is 4:1), it can be regarded that the amount of the electrons held reflects the received-light amount in each of the phase zones of the modulation signal. In brief, the amount of electrons corresponding to each of the phase zones (P0, P2) can be held in the region corresponding to the sensitivity control electrode (17c, 17f).

The electrons held in the region corresponding to the sensitivity control electrode (17c, 17f) are transferred to the charge accumulating portion D3. In this transfer step, a positive voltage is applied to the accumulation electrode 14b, and a negative voltage is applied to the sensitivity control electrodes (17a to 17h). In the case of moving the electrons among the charge separating portion D2, the charge accumulating portion D3 and the charge holding portion D4, the negative voltage is applied to the sensitivity control electrodes (17a to 17h) to prevent that the electrons are moved to the photoelectric converting portion D1. In this regard, since the electrons collected in the phase zone P2 are held in the region corresponding to the sensitivity control electrode 17c, and the electrons collected in the phase zone P0 are held in the region corresponding to the sensitivity control electrode 17f, a timing where the charge accumulating portions D3 of one of the groups receives the electrons from the photoelectric converting portion D1 is different from the timing where the charge accumulating portions D3 of the other group receives the electrons from the photoelectric converting portion D1.

Electrons generated at the photoelectric converting portion D1 in the rest period of the light emission source are transferred from the charge accumulating portion D3 to the charge holding portion D4 though the region corresponding to the gate electrode 14e. In this regard, although the modulation signal is not necessary for the rest period of the light emission source, the voltages applied to the sensitivity control electrode (17a to 17h) are controlled at the same timing as the lighting period of the light emission source to generate the amount of electrons corresponding to the received-light amount of the environmental light at the photoelectric converting portion D1. Therefore, in the both groups of one cell 1, the electrons corresponding to the environmental light are transferred to the charge accumulating portion D3. It is enough to transfer the electrons from one of the charge accumulating portions D3 of the groups to the charge holding portion D4. Alternatively, the electrons may be transferred from both of the charge accumulating portions D3 of the groups. After the amount of electrons corresponding to the received-light amount of the environmental light is transferred, a voltage is applied to the barrier control electrodes 14c connected to the holding electrode 14d through the connection wire 22, so that a potential barrier B1 is formed in the respective well 12 in response to the received-light amount of the environmental light.

Next, in the lighting period of the light emission source, electrons are collected every group by the photoelectric converting portion D1. As a result, the electrons collected in the phase zones (P0, P2) are held respectively in the regions corresponding to the sensitivity control electrodes (17c, 17f). Then, the electrons are moved from the photoelectric converting portion D1 to the charge accumulating portion D3. The operations performed hereinafter are the same as the operations of the second embodiment. That is, the electrons are moved from the charge accumulating portion D3 to the charge separating portion D2, so that the amount of the undesired electric charges determined according to the capacity of the charge separating portion D2 is discarded, and effective electric charges are returned to the charge accumulating portion D3. By this operation, it is possible to obtain the effective electric charges in the charge accumulating portion D3. The amount of the effective electric charges corresponds to the electric charge amount obtained by separating the amount of the undesired electric charges determined by the received-light amount in the rest period of the light emission source from the electrons collected in the lighting period of the light emission source by the photoelectric converting portion D1.

The present embodiment uses a configuration of returning the effective electric charges in the charge accumulating portion D3 to the photoelectric converting portion D1. That is, the electrons of the effective electric charges are transferred from the charge accumulating portion D3 to the photoelectric converting portion D1 by applying a negative voltage to the accumulation electrode 14b, and applying a positive voltage to the photosensitive control electrode (17c, 17f). The electrons transferred to the photoelectric converting portion D1 are further transferred in the vertical direction by using the photosensitive control electrodes (17a to 17h) as vertical transfer electrodes, and then taken out as the received-light output to the outside of the photodetector, as in the case of a conventional CCD image sensor.

In the configuration of the present embodiment, portions other than the photoelectric converting portion D1 are preferably light-shielded. That is, by light-shielding the charge separating portion D2, the charge accumulating portion D3 and the charge holding portion D4, it is possible to prevent that electrons generated by light irradiation during the operation of separating the undesired electric charges are mixed as an error component into the effective electric charges. On the other hand, as in the above-described embodiments, since the weighing period for separating the undesired electric charges and taking out the effective electric charges is sufficiently short, as compared with a light receiving period for collecting electrons generated at the photoelectric converting portion D1 by light irradiation, the charge separating portion D2 and the charge accumulating portion D3 may be not light-shielded. Even in that case, the charge holding portion D4 should be light-shielded.

In the present embodiment, since the photoelectric converting portion D1 does not collect the electrons generated by light irradiation during the operation of separating the undesired electric charges, it is possible to achieve a reduction in error, as compared with the case where the photoelectric converting portion D1 is also used as the charge accumulating portion D3. The other configurations and operations are the same as those of the second embodiment.

By the way, it was explained in the second and third embodiments about the case where the spatial information detecting device is characterized by a combination of the photodetector having the charge holding portion D4 and the light emission source, and the amount of electrons corresponding to the received-light amount in the rest period of the light emission source (i.e., the received-light amount of the environmental light) is held in the charge holding portion D4. In this device, by using the relation between the received-light output of the photodetector and the light projected from the light emission source, it is possible to obtain the information about the target space, into which the light is projected from the light emission source. As the information about the target space, for example, there are the presence or absence of an object in the target space, reflectance of the object, and distance to the object. Depending on the information needed with respect to the target space, a circuit (not shown) for processing the received-light output can be appropriately designed.

For example, in the case of determining the distance to the object in the target space, the intensity of light projected from the light emission source is modulated by the modulation signal with a predetermined frequency. The photodetector detects the received-light amounts at plural timings synchronized with the modulation signal. This is a technique of detecting a flight time of light taken until the light projected from the light emission source is incident on the photodetector as a phase difference of the modulated light. To calculate the phase difference, a difference between the received-light amounts in two different phase zones of the modulation signal is used.

In the third embodiment, since the effective electric charges are obtained in each of the phase zones (P0, P2), a difference between the effective electric charges of the phase zones can be used to calculate the distance. On the other hand, in the second embodiment, when the electrons obtained in one of the phase zones (P0, P2) are held in the charge holding portion D4, the amount of electrons corresponding to the received-light amount of this phase zone is determined as the undesired electric charges, and the amount of the undesired electric charges are subtracted from the electrons obtained in the other phase zone. That is, the amount of the obtained effective electric charges corresponds to the difference between the received-light amounts of the two phase zones (P0, P2). Therefore, when the distance is calculated by an external circuit, it is possible to reduce the calculation amount for the received-light output of the photodetector.

In the configuration where the amount of the effective electric charges is equal to the difference between the received-light amounts of the two phase zones (P0, P2), when the electrons collected in the two phase zones (P0, P2) are alternately held in the charge holding portion D4, an error may occur in different directions depending on which one of the received-light amounts of the two phase zones is held. In such a case, by determining an average of two of the received-light outputs, it is possible to cancel out the error caused by separating the undesired electric charges. As a result, the information about the target space can be accurately detected according to the received-light outputs.

As in the present embodiment, when the plural photoelectric converting portions are arranged, the amount of the undesired electric charges separated in the weighing period may be set to be the same with respect to each of the photoelectric converting portions. In this case, controlling becomes easy by the formation of a common electric channel for controlling the amount of the undesired electric charges, as compared with the case where the amount of the undesired electric charges is separately determined by each of the photoelectric converting portions D1.

In addition, when the charge separating portion is formed with respect to each of the photoelectric converting portions, and the signal processing portion sets the amount of the undesired electric charges separated by one charge weighing operation with respect to each of the charge separating portions, it is preferred that the number of times of the charge weighing operation is set to be the same with respect to all of the charge separating portions. According to this photodetector, there is an advantage that the timings of the charge weighing operations can be controlled in a lump.

Fourth Embodiment

In the third embodiment, the charge separating portion D2 and the charge accumulating portion D3 are formed with respect to each of the received-light amount in the phase zone P0 synchronized with the phase range of 0 to 180 degrees of the modulation signal, and the received-light amount in the phase zone P2 synchronized with the phase range of 180 to 360 degrees of the modulation signal. This embodiment is characterized in that the charge separating portion D2 and the charge accumulating portion D3 are shared with respect to the received-light amounts in these the phase zones (P0, P2).

Figure 13:
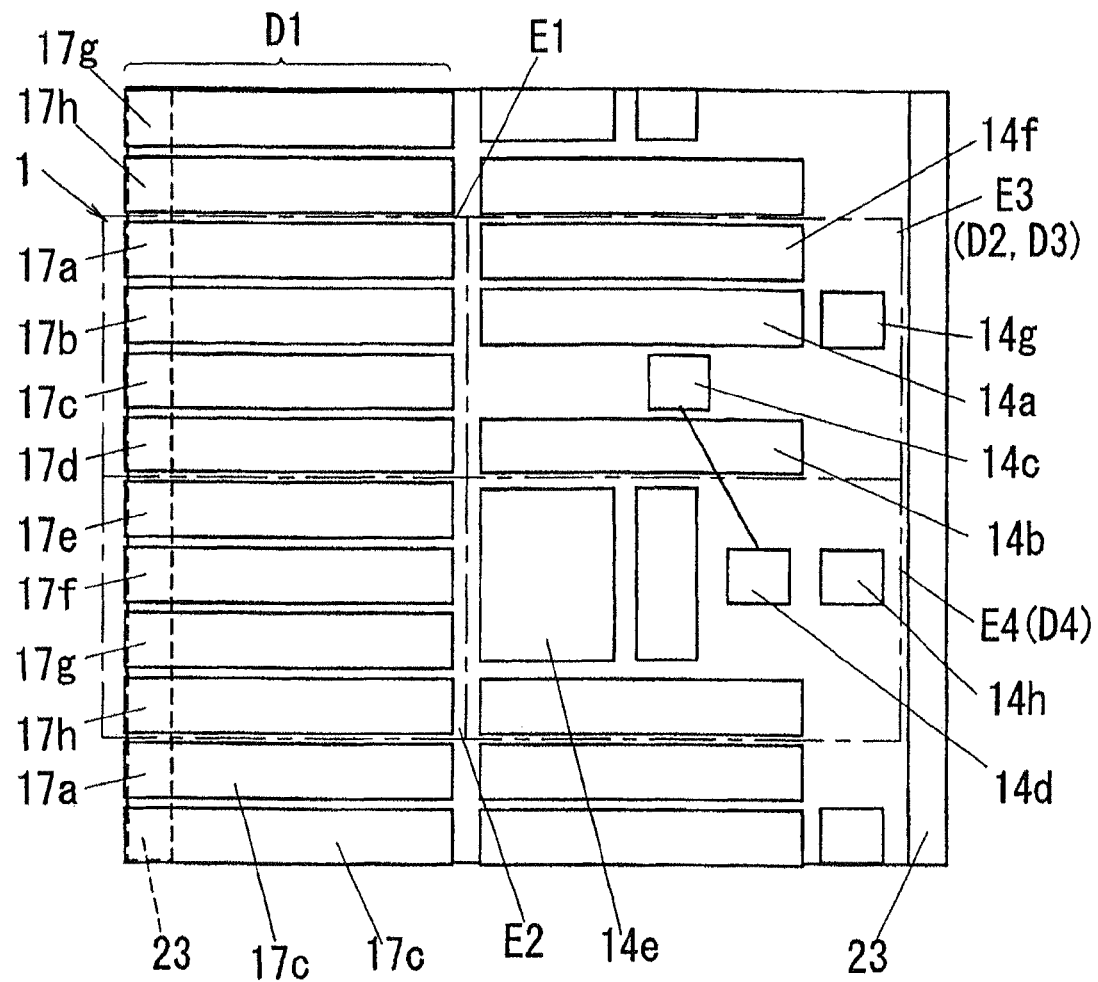
FIG. 13 is a plan view showing a fourth embodiment.

That is, as shown in FIG. 13, the present embodiment is the same as the third embodiment in that eight sensitivity control electrodes (17a to 17h) are formed with respect to each cell 1 of the photoelectric converting portion D1. In the third embodiment, the charge separating portion D2, the charge accumulating portion D3 and the charge holding portion D4 are arranged in a symmetric manner in the vertical direction. On the other hand, these portions of the present embodiment are arranged in an asymmetric manner in the vertical direction. In the photoelectric converting portion D1, a region E3 where the charge separating portion D2 and the charge accumulating portion D3 are formed is disposed at a side of a region E1 where the sensitivity control electrodes (17a to 17d) are arranged. As described later, the photoelectric converting portion D1 is also used as the charge accumulating portion D3. In addition, a region E4 where the charge holding portion D4 is formed is disposed at a side of a region E2 where the sensitivity control electrodes (17e to 17h) are arranged.

In the region E3 where the charge separating portion D2 and the charge accumulating portion D3 are formed, an acceptance electrode 14f is formed adjacent to the sensitivity control electrode 17a of the photoelectric converting portion D1. When a potential well formed under the acceptance electrode 14f has a larger depth than the potential well formed under the sensitivity control electrode 17a, the electric charges collected in the potential well formed under the sensitivity control electrode 17a can be received from the photoelectric converting portion D1.

In the region E3, a separation electrode 14a, a barrier control electrode 14c and an accumulation electrode 14b are arranged at one sides of the sensitivity control electrodes (17b, 17c, 17d), respectively. In the attached drawing, it is shown that only the barrier control electrode 14c has a small size. However, the present embodiment is not limited to this dimensional relation.

On the other hand, in the region E4 where the charge holding portion D4 is formed, a gate electrode 14e is formed adjacent to the sensitivity control electrodes (17e to 17g) of the photoelectric converting portion D1. When a potential well formed under the gate electrode 14e has a larger depth than the potential well formed under the sensitivity control electrode 17f, the electric charges collected in the potential well formed under the sensitivity control electrode 17f can be received from the photoelectric converting portion D1.

In the region E4, a holding electrode 14d is formed such that the photoelectric converting portion D1 is disposed at one side of the gate electrode 14e, and the holding electrode 14d is disposed at the other side of the gate electrode 14e. Therefore, as in the second and third embodiments, when a potential well is formed under the holding electrode 14d, and the potential under the gate electrode 14e is appropriately adjusted, the electric charges collected in the potential well under the sensitivity control electrode 17f can flow into the potential well under the holding electrode 14d.

After the electric charges are moved into the potential well under the holding electrode 14d, i.e., the charge holding portion D4, the potential of the barrier control electrode 14c is determined by the amount held in the charge holding portion D4. That is, a height of a potential barrier formed under the barrier control electrode 14c is determined. A drain (overflow drain) 23 is formed adjacent to the well 12 in the device formation layer 11 (FIG. 1).

Figure 14:
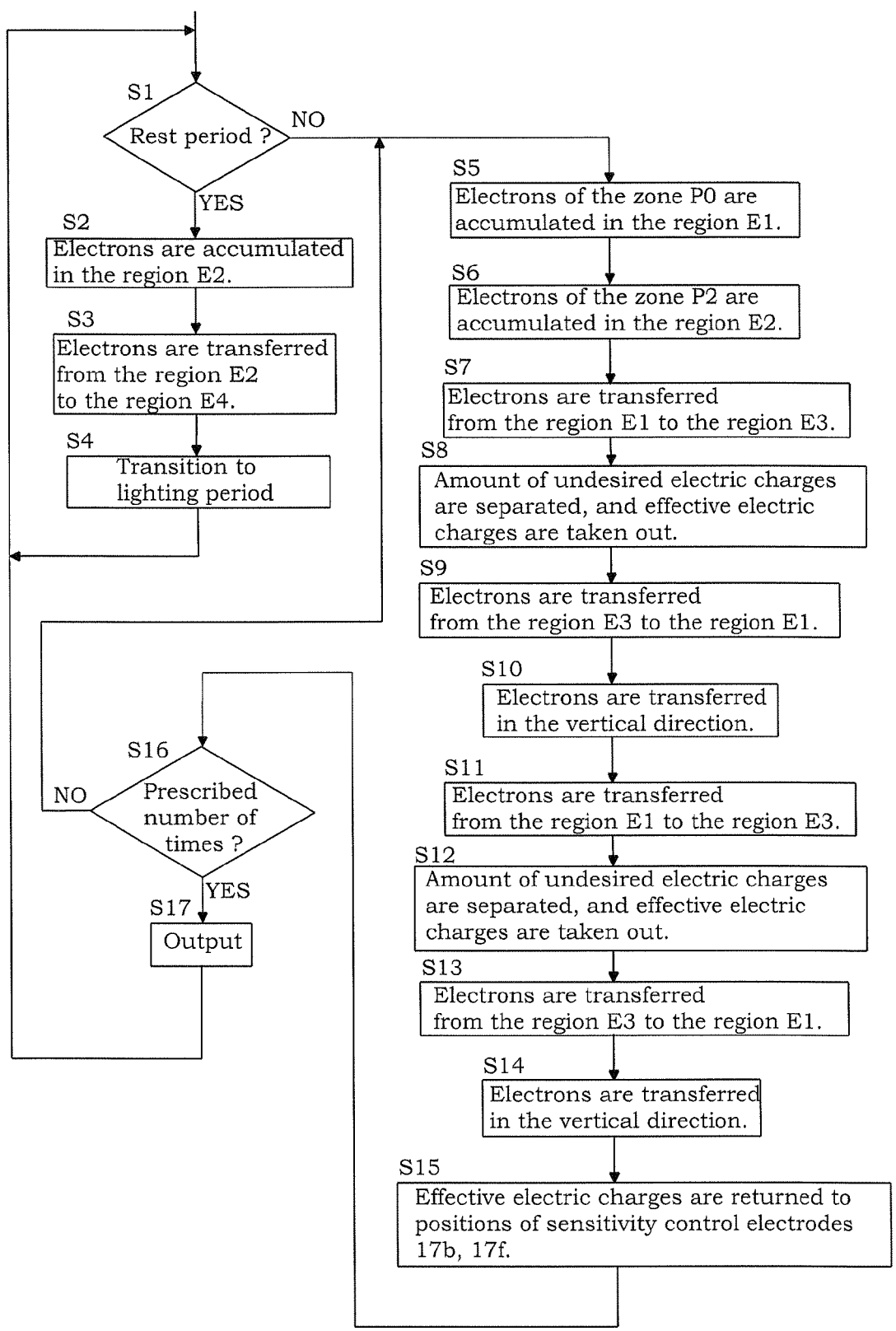
FIG. 14 is a flowchart explaining operations in this embodiment.

Referring to FIG. 14, operations of the present embodiment is explained. As in the third embodiment, a rest period of the light emission source is set. In the case of using the photodetector of this embodiment, a positive voltage is firstly applied to the sensitivity control electrodes (17e to 17h) of the photoelectric converting portion D1 in the rest period (S1), and the sensitivity control electrodes (17a to 17d) are kept at a reference potential. Alternatively, a negative voltage may be applied to these electrodes (17a to 17d). Hereinafter, the reference potential state can be replaced by the negative-voltage applied state. In addition, the separation electrode 14a, the accumulation electrode 14b, the holding electrode 14d, the gate electrode 14e and the acceptance electrode 14f formed in the regions (E3, E4) are also kept at the reference potential.

By the above-described procedures, electrons corresponding to the received-light amount of the environmental light are collected in the region E2 corresponding to the sensitivity control electrodes (17e to 17h) of the photoelectric converting portion D1 (S2). Subsequently, a positive voltage is applied only to the sensitivity control electrode 17f, and the remaining sensitivity control electrodes (17a to 17e, 17g, 17h) are kept at the reference potential. By this operation, the electrons corresponding to the received-light amount of the environmental light are collected in the potential well corresponding to the sensitivity control electrode 17f.

Next, a positive voltage is applied to the gate electrode 14e to form a channel under the gate electrode 14e. Thereby, the electrons can be transferred from the potential well under the sensitivity control electrode 17f to the charge holding portion D4 under the holding electrode 14d (S3). When the electrons are transferred to the charge holding portion D4, the potential of the holding electrode 14d becomes a potential corresponding to the received-light amount of the environmental light, and the potential of the barrier control electrode 14c also becomes the same potential. That is, the height of the potential barrier formed under the barrier control electrode 14c is determined.

Next, a lighting period where light is projected from the light emission source is started (S4). In the lighting period, since the signal light intensity-modulated by the modulation signal is projected, the following operations are performed to individually take out the received-light outputs corresponding to the received-light amounts of the phase zones (P0, P2). In this explanation, the electrons corresponding to the received-light amount of the phase zone P0 are collected in the region E1, and the electrons corresponding to the received-light amount of the phase zone P2 are collected in the region E2.

First, a set of an operation of applying a positive voltage to each of the sensitivity control electrodes (17a to 17d) of the region E1 and the sensitivity control electrode 17f of the region E2, and keeping the remaining sensitivity control electrodes (17e, 17g, 17h) of the region E2 at the reference potential (S5), and an operation of applying a positive voltage to the sensitivity control electrode 17b of the region E1 and the sensitivity control electrodes (17e to 17h) of the region E2, and keeping the remaining sensitivity control electrodes (17a, 17c, 17d) of the region E1 at the reference potential (S6) are performed once or plural times at a cycle synchronized with the modulation signal. Thereby, the electrons corresponding to the received-light amount of the phase zone P0 are collected in the potential well corresponding to the sensitivity control electrode 17b, and the electrons corresponding to the received-light amount of the phase zone P2 are collected in the potential well corresponding to the sensitivity control electrode 17f.

Next, an operation of separating undesired electric charges from the electrons corresponding to the received-light amount of each of the phase zones (P0, P2), and taking out effective electric charges is performed. Since the electrons corresponding to the received-light amount of the phase zone P0 are collected in the potential well corresponding to the sensitivity control electrode 17b, they are transferred to the potential well corresponding to the sensitivity control electrode 17a by applying a positive voltage to the sensitivity control electrode 17a, and keeping the sensitivity control electrode 17b at the reference potential. Furthermore, the electrons are transferred to the potential well under the acceptance electrode 14f by applying a positive voltage to the acceptance electrode 14f, and keeping the sensitivity control electrode 17a at the reference potential. That is, the electrons corresponding to the received-light amount of the phase zone P0 collected in the region E1 are transferred to the region E3 (S7).

The electrons transferred to the region E3 flow from the potential well corresponding to the acceptance electrode 14f into the charge separating portion D2 formed at a region corresponding to the separation electrode 14a. In this regard, since the height of the potential barrier between the charge separating portion D2 and the charge accumulating portion D3 is already determined, a constant amount of the undesired electric charges are left in the charge separating portion D2, and the remaining electrons flow into the charge accumulating portion D3. The undesired electric charges in the charge separating portion D2 are discarded through the drain 23. Thus, the amount of the undesired electric charges is removed from the electrons corresponding to the received-light amount of the phase zone P0, and the effective electric charges are taken out (S8).

As described above, the thus obtained effective electric charges are transferred to the potential well formed under the sensitivity control electrode 17d adjacent to the accumulation electrode 14b. That is, the effective electric charges obtained by separating the undesired electric charges corresponding to the received-light amount of the environmental light from the electrons corresponding to the received-light amount of the phase zone P0 are transferred from the region E3 to the region E1 (S9).

Similarly, it is needed to separate the undesired electric charges with respect to the electrons collected in the region E2. In the region E2, the electrons corresponding to the received-light amount of the phase zone P2 are collected in the potential well corresponding to the sensitivity control electrode 17f. To transfer the electrons to the region E3, the electrons are firstly transferred from the potential well corresponding to the sensitivity control electrode 17f to the potential well corresponding to the sensitivity control electrode 17a. At this time, to prevent that the transferred electrons are mixed with the effective electric charges obtained from the received-light amount of the phase zone P0, the electric charges transferred to the region E1 at the step S9 are transferred in the vertical direction. That is, the electrons (i.e., the effective electric charges of the phase zone P0) are transferred from the potential well under the sensitivity control electrode 17d to the potential well under the sensitivity control electrode 17g of an adjacent cell 1, and on the other hand the electrons (i.e., the electrons of the phase zone P2) are transferred from the potential well under the sensitivity control electrode 17f to the potential well under the sensitivity control electrode 17a (S10).

After the electrons corresponding to the received-light amount of the phase zone P2 are transferred to the potential well under the sensitivity control electrode 17a, they are further transferred from the region E1 to the region E3. The undesired electric charges are separated from the transferred electrons, and the effective electric charges are accumulated in the charge accumulating portion D3 (S11 to S13). That is, by performing the same operations as the steps S7 to S9, it is possible to take out the effective electric charges of the phase zone P2. The obtained effective electric charges are transferred to the potential well under the sensitivity control electrode 17d. Thus, the effective electric charges are returned from the region E3 to the region E1 (S14).

According to the above procedures, when the effective electric charges of each of the phase zones (P0, P2) are obtained, they are transferred in the vertical direction, and returned once to the region corresponding to the sensitivity control electrode (17b, 17f) (S15). After this operation is repeated a prescribed number of times in the lighting period (S16), the electrons left in the potential well corresponding to the sensitivity control electrode (17b, 17f are finally taken out as the received-light output (S17).

In this embodiment, a discarding electrode 14g is formed between the separation electrode 14a and the drain 23, and a discarding electrode 14h is formed between the holding electrode 14d and the drain 23. The undesired electric charges can be discarded every transfer of the electric charges from the region E1 to the region E3 by controlling the voltage applied to the discarding electrode 14g. In addition, the electrons corresponding to the received-light amount of the environmental light held in the charge holding portion D4 can be discarded every transfer of the electric charges from the region E2 to the region E4 by controlling the voltage applied to the discarding electrode 14h. The other configurations and operations are the same as those of the above-described embodiments.

Fifth Embodiment

Figure 15:
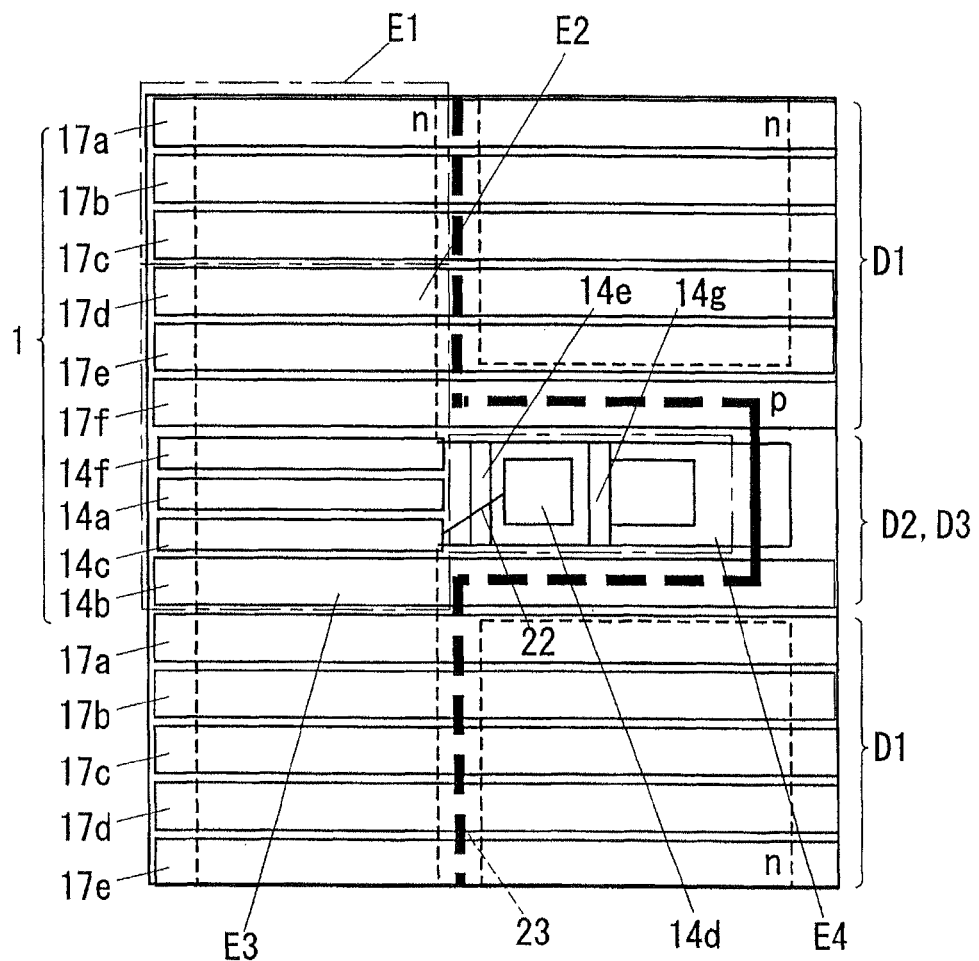
FIG. 15 is a plan view showing a fifth embodiment.

As shown in FIG. 15, the present embodiment is characterized in that the region E3 capable of separating the undesired electric charges and the regions (E1, E2) where the photoelectric converting portion D1 is formed are arranged in a vertical direction.

That is, 6 sensitivity control electrodes (17a to 17f) are formed with respect to one cell 1. The regions (E1, E2) for collecting the electric charges corresponding to the received-light amounts in the phase zones (P0, P2) are respectively provided by the three sensitivity control electrodes (17a to 17c) and the three sensitivity control electrodes (17d to 17f). In addition, the region E3 for separating the undesired electric charges is formed between adjacent cells 1 in the vertical direction. The region E4 for holding the electric charges corresponding to the received-light amount of the environmental light is also formed at one side of the region E3 (i.e., a location away from the region E3 in the horizontal direction).

That is, an acceptance electrode 14f is disposed at a region adjacent to the sensitivity control electrode 17f of the cell 1. A separation electrode 14a, a barrier control electrode 14c and an accumulation electrode 14b are disposed in order adjacent to the acceptance electrode 14f in the vertical direction. That is, the acceptance electrode 14f is disposed between the sensitivity control electrode 17f and the separation electrode 14a, and the accumulation electrode 14b is disposed between the barrier control electrode 14c and the sensitivity control electrode 17a of the adjacent another cell 1.

In addition, a gate electrode 14e is formed such that the acceptance electrode 14f, the separation electrode 14a and the barrier control electrode 14c of the region E3 are disposed at one side of the gate electrode 14e. In addition, a holding electrode 14d is disposed at the other side of the gate electrode 14e. In this regard, the barrier control electrode 14c is electrically connected to the holding electrode 14d through a connection wire 22. A drain 23 is formed to extend along the circumference of the regions (E1, E2, E3, E4). In addition, a discarding electrode 14g is disposed between a holding portion D4 corresponding to the holding electrode 14d and the drain 23. Each of the above-described electrodes is disposed on a surface of an n-type well 12 formed on a p-type device formation layer 11.

The operations of the present embodiment are basically same as those of the fourth embodiment. That is, a positive voltage is applied to the sensitivity control electrodes (17d to 17f) corresponding to the region E2 of the photoelectric converting portion D1 during the rest period, and the sensitivity control electrodes (17a to 17c) of the region E1 are held at a reference potential. In addition, the separation electrode 14a, the accumulation electrode 14b, the barrier control electrode 14c, the holding electrode 14d, the gate electrode 14e and the acceptance electrode 14f are kept at the reference potential. Therefore, electrons corresponding to the received-light amount of the environmental light are collected in the region E2 of the photoelectric converting portion D1. Subsequently, a positive voltage is applied to only one (i.e., the sensitivity control electrode 17f) of the sensitivity control electrodes (17a to 17f) of the regions (E1, E2), so that the collected electrons are collected in the potential well corresponding to the sensitivity control electrode 17f.

The electrons collected in the potential well corresponding to the sensitivity control electrode 17f are transferred to the holding portion D4 under the holding electrode 14d through the acceptance electrode 14f and the gate electrode 14e. In this stage, the height of the potential barrier formed under the barrier control electrode 14c is set in response to the environmental light.

Next, the lighting period where light is projected from the light emission source is started. At least one set of an operation of applying a positive voltage to the sensitivity control electrodes (17a to 17c, 17e), and keeping the sensitivity control electrodes (17d, 17f) at the reference potential, and an operation of applying a positive voltage to the sensitivity control electrodes (17b, 17d to 17f), and keeping the sensitivity control electrodes (17a, 17c) at the reference potential is performed at a cycle synchronized with the modulation signal so as to be associated with the phase zones (P0, P2) synchronized with the modulation signal. According to these operations, the electrons corresponding to the received-light amount in the phase zone P0 are collected in the potential well under the sensitivity control electrode 17b, and the electrons corresponding to the received-light amount in the phase zone P2 are collected in the potential well under the sensitivity control electrode 17e.

In this regard, when the electrons collected in the potential well under the sensitivity control electrode 17e are transferred in the vertical direction, and also transferred to a potential well formed as the charge separating portion D2 under the separation electrode 14a, the undesired electric charges are separated according to the height of the potential barrier under the barrier control electrode 14c, and only the effective electric charges are accumulated in the charge accumulating portion D3 under the accumulation electrode 14b. That is, the effective electric charges corresponding to the phase zone P2 are accumulated in the charge accumulating portion D3. On the other hand, the undesired electric charges left in the charge separating portion D2 are discarded through the drain 23 by way of a predetermined route (not shown).

In FIG. 15, the drain 23 is continuously formed from the upstream side toward the downstream side of the separation electrode 14a. In this regard, it is assumed that electrons are transferred from the upper side to the lower side of FIG. 15. Alternatively, the drain 23 formed at the upstream side of the separation electrode 14a may be separated from the drain 23 formed at the downstream side thereof. In this case, the undesired electric charges are transferred to a region under one of the sensitivity control electrodes (17a to 17f, e.g., the sensitivity control electrode 17e) adjacent to the drain 23 of the upstream side. Then, a voltage (e.g., +15 V) for attracting electrons is applied to the drain 23, and a voltage (e.g., −5 V) for ejecting electrons is applied to the sensitivity control electrode 17e corresponding to the region with the transferred undesired electric charges. The voltage for ejecting electrons is also applied to the sensitivity control electrodes (17c, 17d, 17f, 17g) adjacent to the sensitivity control electrode 17e, to which the undesired electric charges are transferred. According to these operations, the undesired electric charges can be discarded through the drain 23 without flowing toward the sensitivity control electrodes (17c, 17d, 17f, 17g).

Next, the electrons corresponding to the received-light amount of the phase zone P0, which are collected in the potential well formed under the sensitivity control electrode 17*b*, are transferred in the vertical direction, and also transferred to the potential well formed as the charge separating portion D2 under the separation electrode 14*a*. At this time, the effective electric charges of the phase zone P2 accumulated in the charge accumulating portion D3 under the accumulation electrode 14*b* are transferred in the vertical direction, and temporarily held at the potential well formed under the sensitivity control electrode 17*b* of an adjacent cell 1 in the vertical direction.

As described above, when the electrons corresponding to the received-light amount of the phase zone P0 are transferred to the charge separating portion D2, the undesired electric charges are separated, and the effective electric charges of the phase zone P0 are accumulated in the charge accumulating portion D3.

The effective electric charges of the phase zone P0 accumulated in the charge accumulating portion D3, and the effective electric charges of the phase zone P2 accumulated in the potential well formed under the sensitivity control electrode 17*b* are transferred in the vertical direction toward the upper side of FIG. 15. By controlling the voltage applied to the accumulation electrode 14*b*, the effective electric charges accumulated in the charge accumulating portion D3 can climb over the potential barrier formed under the barrier control electrode 14*c*. Thus, by transferring the effective electric charges in the inverse direction, the effective electric charges of the phase zones (P0, P2) can be respectively accumulated in the potential wells under the sensitivity control electrodes (14*b*, 14*e*).

After the above-described operation is repeated a predetermined number of times in the lighting period, the effective electric charges are taken out as the received-light output. In the present embodiment, there is an advantage that the number of the operations becomes smaller, as compared with the fourth embodiment. The other configurations and operations are the same as those of the first embodiment. In each of the second to fifth embodiments, the holding electrode 14*d* is disposed on the holding well 15 through the insulating layer 13. Alternatively, the holding electrode 14*d* may be ohmic-connected to the holding well 15 not through the insulating layer 13.

Sixth Embodiment

The present embodiment is characterized in that a plurality of electrodes having a same width are arranged, and operations substantially equivalent to the case of using a plurality of electrodes having different widths can be achieved by use of an appropriate combination of the electrodes having the same width. In the present embodiment, the intensity of light projected from the light emission source is modulated by a sinusoidal modulation signal, as in the third embodiment. The photoelectric converting portion D1 is also used as the charge separating portion D2 and the charge accumulating portion D3. In addition, the charge holding portion D4 is not formed.

Figure 16:
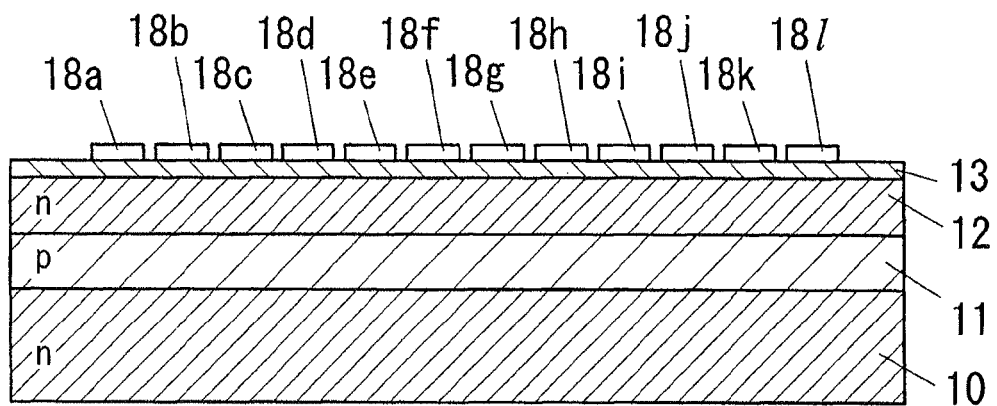
FIG. 16 is a cross-sectional view showing a sixth embodiment.

As shown in FIG. 16, one cell 1 of this embodiment has a plurality of control electrodes (18*a*-18*l*) having the same width, which are disposed on the well 12 on the general surface of the device formation layer 11 through the insulating layer 13, and equally spaced from each other. That is, the one cell 1 is composed of twelve control electrodes (18*a*-18*l*). In the one cell 1, wirings are formed such that voltages applied to the control electrodes (18*a*-18*l*) can be separately controlled.

Operations of the photoelectric converting portion D1 are substantially the same as the operations using the sensitivity control electrodes (17*a*-17*h*) of the third embodiment except for the following points. In this embodiment, electrons corresponding to the received-light amount in the phase zone P0 are collected by use of the control electrodes (18*a*-18*i*), and electrons corresponding to the received-light amount in the phase zone P2 are collected by use of the control electrodes (18*d*-18*l*). These operations are explained referring to FIGS. 17A to 17H. In FIGS. 17A to 17H, the control electrodes (18*a*-18*l*) are represented as (a) to (l).

Figure 17:
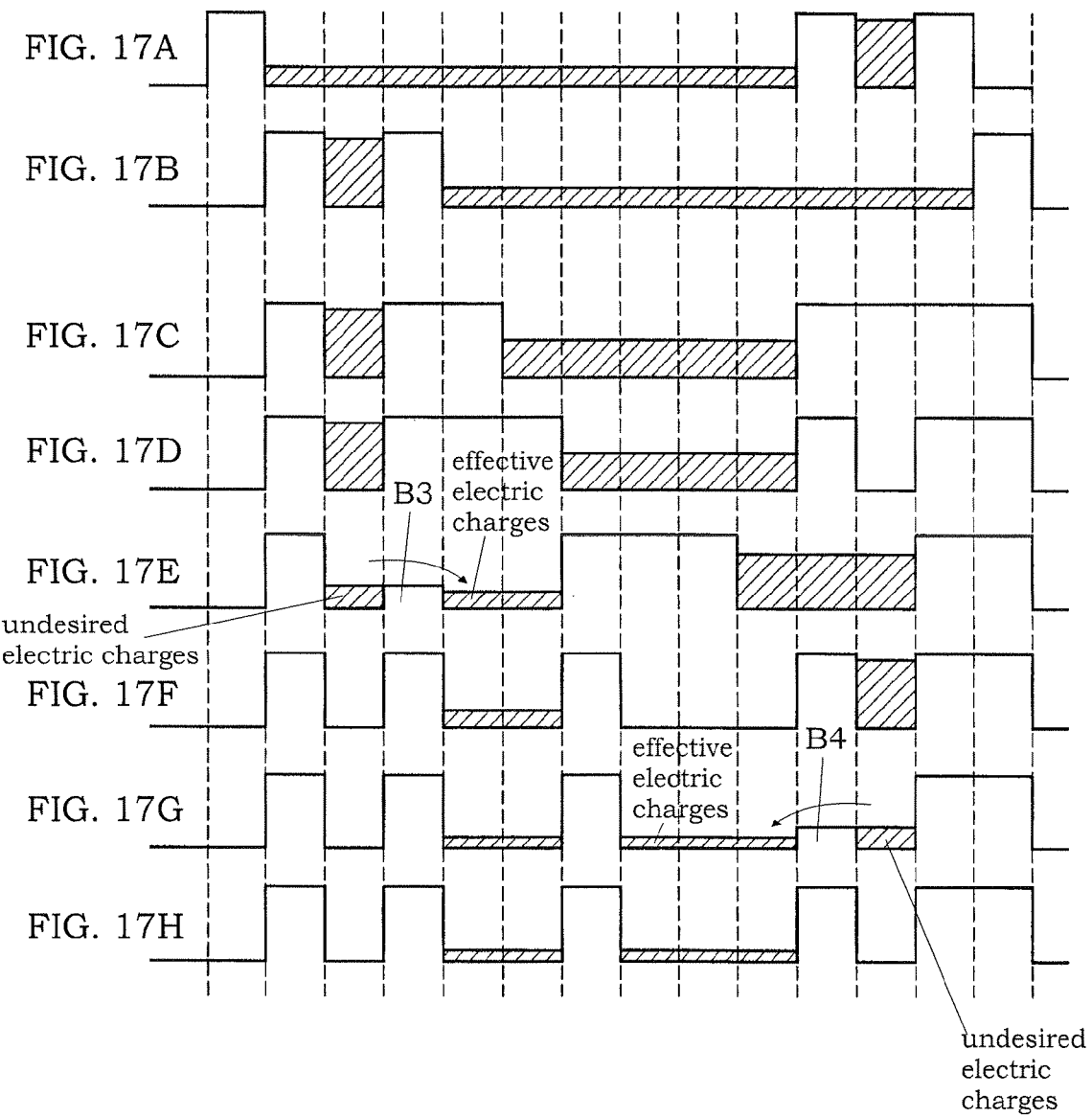
FIGS. 17A to 17H are operation explanatory diagrams showing potential relations in this embodiment.

During the operation of the photoelectric converting portion D1 in the light receiving period, a positive voltage is applied to the control electrodes (18*a*-18*i*) with respect to the phase zone P0, as shown in FIG. 17A, so that electrons are collected by a region corresponding to the nine control electrodes (18*a*-18*i*). In addition, a positive voltage is applied to the control electrodes (18*d*-18*l*) with respect to the phase zone P2, as shown in FIG. 17B, so that electrons are collected by a region corresponding to the nine control electrodes (18*d*-18*l*). The electrons collected with respect to each of the phase zones (P0, P2) are held at a region other than the region for collecting the electrons. That is, in the phase zone P0 where the electrons are collected by the region corresponding to the control electrodes (18*a*-18*i*), the electrons collected with respect to the phase zone P2 are held at a region corresponding to the control electrode 18*k*. Similarly, in the phase zone P2 where the electrons are collected at the region corresponding to the control electrodes (18*d*-18*l*), the electrons collected with respect to the phase zone P0 are held at a region corresponding to the control electrode 18*b*. By repeating the operation for the phase zone (P0, P2) plural times, an amount of electrons corresponding to the received-light amount is held at the region corresponding to the control electrode (18*k*, 18*b*) in the well 12.

When the light receiving period is finished, so that the amount of electrons corresponding to the received-light amount in the phase zone P0 is collected in the region corresponding to the control electrode 18*b*, or the amount of electrons corresponding to the received-light amount in the phase zone P2 is collected in the region corresponding to the control electrode 18*k*, a weighing period is started to perform an operation for separating undesired electric charges to obtain effective electric charges.

For example, in the case of separating the undesired electric charges from the electrons held at the region corresponding to the control electrode 18*b*, a negative voltage is applied to the control electrode 18*a* to form a potential barrier under the condition that the electrons collected in the phase zone P0 are held in the potential well formed at the region corresponding to the control electrode 18*b*. In addition, to use the region corresponding to the control electrodes (18*d*, 18*e*) as the charge accumulating portion, the electrons collected in the phase zone P2 are transferred, as described below. That is, a potential barrier corresponding to the control electrodes (18*c*, 18*d*) is formed, as shown in FIG. 17C. Subsequently, a potential barrier corresponding to the control electrodes (18*c* to 18*e*) is formed, as shown in FIG. 17D. Besides, a potential barrier corresponding to the control electrodes (18*f* to 18*h*) is formed, as shown in FIG. 17E. Thus, the electrons collected in the phase zone P2 can be transferred.

In addition, as shown in FIG. 17E, a positive voltage is applied to the control electrodes (18*d*, 18*e*) to form a potential well used as the charge accumulating portion D3, and at the same time a potential barrier B3 having a predetermined height is formed by controlling the voltage applied to the control electrode 18*c*. By this operation, the undesired electric charges are left in the potential well corresponding to the control electrode 18*b*, and the electrons flowing into the potential well corresponding to the control electrodes (18*d*, 18*e*) over the potential barrier B3 are used as the effective electric charges.

Next, as shown in FIG. 17F, the height of the potential barrier corresponding to the control electrode 18*c* is increased to prevent a leakage of the effective electric charges corresponding to the phase zone P0. At the same time, the electrons collected in the phase zone P2 are collected in the potential well corresponding to the control electrode 18*k*. In this state, a potential well is formed as the charge accumulating portion D3 in the region corresponding to the control electrodes (18*g* to 18*i*), and a potential barrier B4 is formed at the region corresponding to the control electrode 18*j*.

To separate the undesired electric charges from the electric charges (electrons) held in the potential wall corresponding to the control electrode 18*k*, the potential barrier B4 is pulled down by controlling the voltage applied to the control electrode 18*j*, as shown in FIG. 17G. The amount of the undesired electric charges in the electrons collected in the phase zone P2 is determined by to the height of this potential barrier B4. That is, the region corresponding to the control electrode 18*k* functions as the charge separating portion D2.

After the undesired electric charges are separated, the height of the potential barrier corresponding to the control electrode 18*j* is increased, as shown in FIG. 17H, to prevent a leakage of the effective electric charges collected in the potential well corresponding to the control electrodes (18*g*-18*i*) with respect to the phase zone P2. On the other hand, the undesired electric charges left in the regions corresponding to the control electrodes (18*b*, 18*k*) are discarded.

According to the above-described operations, the undesired electric charges are separated from the electrons generated by light irradiation in the phase zones (P0, P2), and the effective electric charges are taken out. In the present embodiment, since the control electrodes (18*a*-18*l*) are arrayed on a line, the electrons of the effective electric charges can be transferred in the array direction of the control electrodes (18*a*-18*l*) by applying the voltages to the control electrodes (18*a*-18*l*) at appropriate timings, as in the case of a vertical transfer resistor of the conventional CCD image sensor. By taking out the electrons to the outside of the photodetector, the received-light output is obtained. That is, in the configuration of the present embodiment, the photoelectric converting portion D1 is also used as the charge separating portion D2, the charge accumulating portion D3, and the charge take-out portion. In addition, since the operations for separating the undesired electric charges from the electrons generated in the two phase zones (P0, P2) can be simultaneously performed, there is an advantage that the processing time needed to separate the undesired electric charges can be reduced.

In the above configuration, it was explained about the case of performing the same operation as the first embodiment. Alternatively, the voltages applied to the control electrodes 18*b*, 18*k* may be controlled according to the amount of electrons held by a charge holding portion D4 separately formed. In this case, it becomes possible to automatically adjust the amount of the undesired electric charges, as described in the second and third embodiments. The other configurations and operations are the same as those of the above-described embodiments.

In addition, it is preferred that after the operation of generating the electric charges by the photoelectric converting portion and the operation of separating the undesired electric charges from the electric charges generated by the photoelectric converting portion and accumulating the effective electric charges in the charge accumulating portion are repeated plural times, the electric charges accumulated in the charge accumulating portion are taken out as the received-light output by the charge take-out portion. In this case, since the undesired electric charges are repeatedly separated from the electric charges generated by the photoelectric converting portion, it is possible to reduce the probability of saturation at the photoelectric converting portion, and achieve a reduction in size of the photoelectric converting portion. In addition, when the photoelectric converting portion is downsized, the capacity of the charge take-out portion can be also reduced. As a result, it becomes possible to downsize the photodetector as a whole.

Seventh Embodiment

Figure 18:
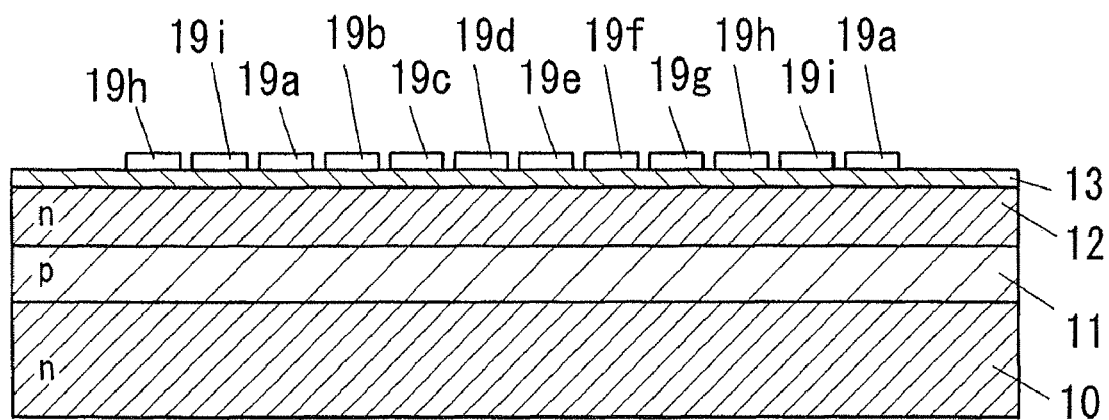
FIG. 18 is a cross-sectional view showing a seventh embodiment.

The present embodiment is the same as the sixth embodiment in that a plurality of control electrodes having a same width are arranged. However, as shown in FIG. 18, the present embodiment is characterized in that one cell 1 has nine control electrodes (19*a* to 19*i*). As explained in the sixth embodiment, the six control electrodes are used to accumulate electrons corresponding to one phase zone of the modulation signal, and separate the undesired electric charges. Therefore, the operations of collecting electrons corresponding to the two phase zones of the modulation signal and separating the undesired electric charges therefrom can not be separately performed at different regions by use of the nine control electrodes (19*a* to 19*i*). That is, a part of the nine control electrodes are used in an overlapping manner in the both phase zones. Moreover, in the sixth embodiment, the operations of separating the undesired electric charges respectively from the electrons collected in the both phase zones can be simultaneously performed. On the other hand, in the preset embodiment, since the part of the control electrodes are used in the overlapping manner, the operation of separating the undesired electric charges from the electrons collected in one of the two phase zones is performed at a different time from the operation of separating the undesired electric charges from the electrons collected in the other phase zone.

Figure 19:
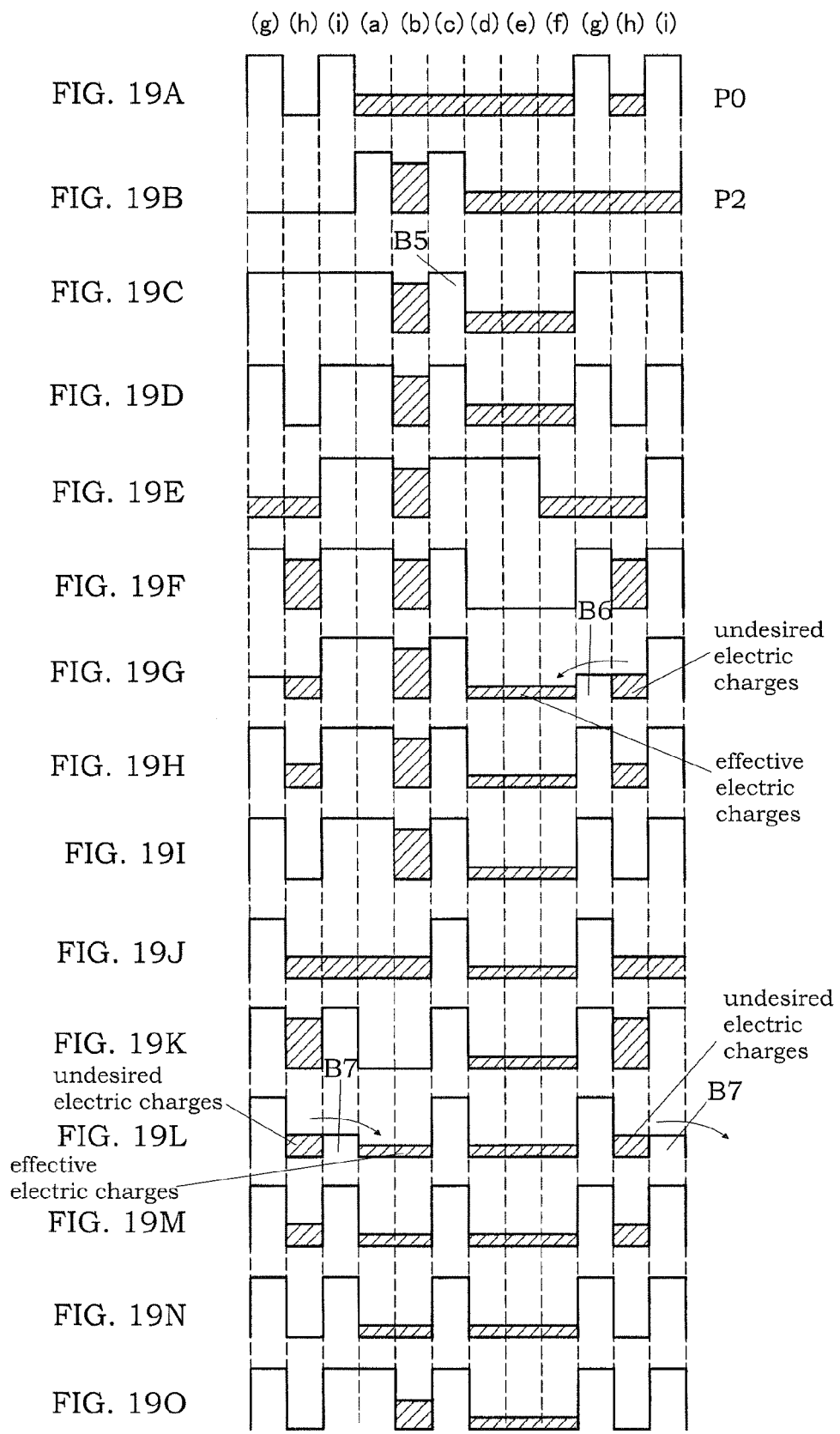
FIGS. 19A to 19O are operation explanatory diagrams showing potential relations in this embodiment.

Specifically, operations shown in FIGS. 19A to 19O are performed. When the photoelectric converting portion D1 is functioned to collect electrons generated by receiving light from the target space, a period of applying a negative voltage to each of the control electrodes (19*g*, 19*i*), as shown in FIG. 19A, and a period of applying a negative voltage to each of the control electrodes (19*a*, 19*c*), as shown in FIG. 19B, are alternately set. The both periods are set in synchronization with the modulation signal. For example, the state of FIG. 19A corresponds to the phase zone P0, and the state of FIG. 19B corresponds to the phase zone P2. In FIGS. 19A to 19O, the control electrodes (19*a* to 19*i*) are represented as (a) to (i).

In the state of FIG. 19A, a region corresponding to the control electrodes (19*a* to 19*f*) functions as the photoelectric converting portion D1 with respect to the phase zone P0. In the state of FIG. 19B, a region corresponding to the control electrodes (19*d* to 19*i*) functions as the photoelectric converting portion D1 with respect to the phase zone P2. In addition, the electrons collected in the phase zone P0 are held in a region corresponding to the control electrode 19*b* in the phase zone P2. On the other hand, the electrons collected in the phase zone P2 are held in a region corresponding to the control electrode 19*h* in the phase zone P0.

After alternately repeating the states of FIGS. 19A and 19B for a sufficiently long time period, the operation of separating the undesired electric charges from the electrons held in the regions corresponding to the control electrodes (19*b*, 19*h*) to obtain the effective electric charges is performed. Since the region corresponding to the control electrode 19*b* is a region used for the effective electric charges, it also functions as the charge accumulating portion D3. As described above, the part of the control electrodes are shared by the two phase zones of the modulation signal. In the period of separating the undesired electric charges, a potential barrier B5 is always formed in the region corresponding to the control electrode 19c to prevent that the electrons collected in the both phase zones are mixed to each other. That is, a negative voltage is always applied to the control electrode 19c.

In FIGS. 19A to 19O, the undesired electric charges are firstly separated from the electrons collected in the phase zone P2, and then the undesired electric charges are separated from the electrons collected in the phase zone P0. Therefore, during the operation of separating the undesired electric charges from the electrons collected in the phase zone P2, the electrons collected in the phase zone P0 are held in the region corresponding to the control electrode 19b.

After the photoelectric converting portion D1 collects electrons generated by light irradiation, the electrons collected in the phase zone P0 are held in the potential well formed in the region corresponding to the control electrode 19b, as shown in FIG. 19C. In addition, a negative voltage is applied to the control electrode 19a to form a potential barrier. This state is maintained until the undesired electric charges are separated from the electrons collected in the phase zone P2 (i.e., over a range of from FIG. 19C to FIG. 19I). On the other hand, in the state of FIG. 19C, the electrons collected in the phase zone P2 are held in a potential well formed in a region corresponding to the control electrodes (19d to 19f). That is, the electrons held in the region corresponding to the control electrodes (19d to 19i) in the phase zone P2, or the electrons held in the region corresponding to the control electrode 19h in the phase zone P0 are collected in the region corresponding to the control electrodes (19d to 19f).

As shown in FIG. 19D, this operation is a previously performed operation to form an electron-free (empty) potential well in the region corresponding to the control electrode 19h. That is, in the stage where the operation of collecting the electrons generated by light irradiation has been finished, the electrons collected in the phase zone P2 exist in the region corresponding to the control electrode 19h. Therefore, after a negative voltage is applied to the control electrodes (19g to 19i), as shown in FIG. 19C, the electron-free potential well is formed in the region corresponding to the control electrode 19h, as shown in FIG. 19D.

Next, as shown in FIGS. 19E and 19F, the electrons held in the region corresponding to the control electrodes (19d to 19f) are moved to the region corresponding to the control electrode 19h. Firstly, a potential well is formed in a region corresponding to the control electrodes (19f to 19h), and a potential barrier is formed in a region corresponding to the control electrodes (19c to 19e). Subsequently, a potential barrier is formed in a region corresponding to the control electrode 19f, and also a potential barrier is formed a region corresponding to the control electrode 19g. Thus, the electrons can be collected in the region corresponding to the control electrode 19h. In this stage, an empty potential well is formed in the region corresponding to the control electrodes (19d to 19f). Although there are plural intermediate states between the state of FIG. 19E and the state of FIG. 19F, they are not shown in the attached drawings. On the other hand, the state of FIG. 19F is the same as the state of FIG. 19D with respect to electric potential. However, in the state of FIG. 19D, electrons exist in the region corresponding to the control electrodes (19d to 19f), and in the state of FIG. 19F, the electrons exist in the region corresponding to the control electrode 19h.

By the above-described procedures, the electrons collected in the phase zone P2 are collected in the region corresponding to the control electrode 19h. Next, as shown in FIG. 19G, the potential barrier B6 corresponding to the control electrode 19g is pulled down. This potential barrier B6 has the same function as the potential barrier B1 explained in the first embodiment. An amount of electrons determined depending on height of the potential barrier B6 is left in the region corresponding to the control electrode 19h as the charge separating portion D2. The amount of electrons exceeding the capacity of the charge separating portion D2 flows into a region corresponding to the control electrodes (19d to 19f), i.e., the charge accumulating portion D3 beyond the potential barrier B6.

After the electrons flow into the charge accumulating portion D3, the height of the potential barrier B6 is increased by applying a negative voltage to the control electrode 19g, as shown in FIG. 19H. Thereby, the undesired electric charges in the charge separating portion D2 can be completely separated from the effective electric charges in the charge accumulating portion D3. As shown in FIG. 19I, the undesired electric charges are discarded from the charge separating portion D2, and the effective electric charges are left in the region corresponding to the control electrodes (19d to 19f). The amount of the effective electric charges corresponds to the received-light amount in the phase zone P2.

On the other hand, the amount of electrons held in the region corresponding to the control electrode 19b corresponds to the received-light amount in the phase zone P0. The undesired electric charges can be separated from the electrons by the procedures shown in FIGS. 19J to 19O. The state where the effective electric charges of the phase zone P2 are held in the region corresponding to the control electrodes (19d to 19f) is maintained during the procedures. The present embodiment is characterized in that the region corresponding to the control electrode 19h has the function of the charge separating portion D2 for the electrons collected in the phase zone P2 as well as the function of the charge separating portion D2 for the electrons collected in the phase zone P0.

That is, after the undesired electric charges are discarded, the electrons of the phase zone P0 held in the region corresponding to the control electrode 19b are moved into the region corresponding to the control electrode 19h, as shown in FIGS. 19J and 19K. At this time, the potential of the region corresponding to the control electrodes (19a, 19i) is firstly pulled down such that the potentials of the regions corresponding to the control electrodes (19a, 19b, 19h, 19i) are equal to each other. Subsequently, the electrons are collected in the region corresponding to the control electrode 19h. Intermediate states between the FIGS. 19J and 19K are not shown in this drawing. In brief, the potential of the region corresponding to the control electrode 19b is firstly increased. Subsequently, the potential of the region corresponding to the control electrode 19a is increased, and then the potential of the region corresponding to the control electrode 19i is increased. After the electrons are collected in the region corresponding to the control electrode 19h, the potentials of the regions corresponding to the control electrodes (19a, 19b) are pulled down.

According to the above-described operations, the electrons of the phase zone P0 are held in the region corresponding to the control electrode 19h, and the region corresponding to the control electrode 19h functions as the charge separating portion D2. Next, as shown in FIG. 19L, a potential barrier B7 is formed in the region corresponding to the control electrode 19i. Electrons flowing into the region corresponding to the control electrodes (19a, 19b) beyond this potential barrier B7 are the effective electric charges. That is, the region corresponding to the control electrodes (19a, 19b) functions as the charge accumulating portion D3.

Subsequently, as shown in FIG. 19M, the potential barrier B7 corresponding to the control electrode 19i is pulled up. In the state where the electrons in the charge separating portion D2 are isolated from the electrons in the charge accumulating portion D3, when the electrons in the charge separating portion D2 are discarded as the undesired electric charges, as shown in FIG. 19N, the electrons corresponding to the received-light amount in the phase zone P2 are held in the region corresponding to the control electrodes (19d, 19e, 19b), and the electrons corresponding to the received-light amount in the phase zone P0 are held in the region corresponding to the control electrodes (19a, 19b). After these electrons are taken out by way of the state of FIG. 19O, the states shown in FIGS. 19A and 19B are reproduced to collect the electrons generated by light irradiation.

Thus, in the present embodiment, a plurality of the control electrodes are arranged as one unit, and electric charges are generated at different two timings (e.g., A0, A2) in the light receiving period. The generated electric charges are temporarily collected in the potential wells formed in the regions corresponding to different control electrodes in the one unit. On the other hand, in the weighing period, the charge separating portion, the charge accumulating portion and the potential barrier formed with respect to the electric charges generated in one of the two timings are provided at different positions from those formed with respect to the electric charges generated in the other timing. Thereby, it is possible to increase the region for collecting the electric charges in the light receiving period. Moreover, in the weighing period, the undesired electric charges are separated from the electrons generated at each of the two different timings. That is, since the control electrode used to separate the undesired electric charges from the electric charges generated at one of the two timings is different from the control electrode used to separate the undesired electric charges from the electric charges generated at the other timing, it is possible to separate the undesired electric charges from the electric charges generated at each of the two different timings, while preventing that the electric charges generated at the two timings are mixed to each other.

Furthermore, in the weighing period, the potential well for holding the electric charges generated at one of the two different timings can be used as the charge separating portion for the electric charges collected in the both timings. In FIGS. 19A to 19O, the control electrode (i) is shown at the right end. In fact, the control electrodes (a) to (i) of an adjacent cell are arranged. Therefore, the potential well corresponding to the control electrode 19h functions as the charge separating portion D2 for the electrons collected in the phase zone P2. On the other hand, in the adjacent cell, as shown in FIG. 19L, the potential well corresponding to the control electrode 19h is also used as the charge separating portion D2 for the electrons collected in the phase zone P0. At this time, the potential barrier for the electrons collected in each of the timings is formed by use of each of the control electrodes adjacent to both sides of the control electrode 19h corresponding to the charge separating portion D2.

That is, when the effective electric charges are separated from the electrons collected in the phase zone P2, the potential barrier formed by applying the voltage to the control electrode 19g is used. On the other hand, when the effective electric charges are separated from the electrons collected in the phase zone P0, the potential barrier formed by applying the voltage to the control electrode 19i is used. Thus, since the region used as the charge separating portion is shared by the electrons collected at the two timings, it is possible to decrease the number of the control electrodes, as compared with the electrode configuration of the sixth embodiment, and also reduce an occupation area of the control electrodes as a whole, while maintaining the function of generating the electric charges at the two timings. As a result, the photodetecting portion can be downsized. In addition, when an image pickup device is configured such that a plurality of cells 1 are arranged, and one pixel is provided by each of the cells 1, there is an advantage that the occupation area for one pixel is reduced, and an improvement in resolving power is achieved. The other configurations and operations are the same as those of the above-described embodiments.

Eighth Embodiment

The present embodiment is characterized by discarding a prescribed constant amount of the undesired electric charges from the electric charges (electrons) generated by receiving the light from the target space according to the following method.

Figure 20:
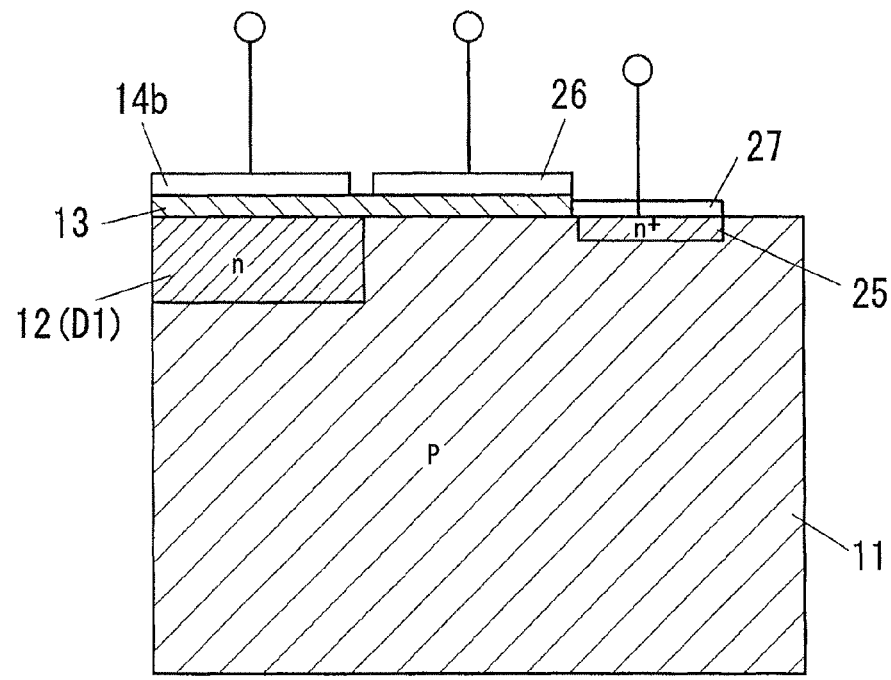
FIG. 20 is a cross-sectional view showing an eighth embodiment.

That is, as shown in FIG. 20, a discarding well 25 formed at the general-surface side of the device formation layer 11 is disposed at a different position from the well 12 used as the photoelectric converting portion D1. In addition, a discarding gate electrode 26 is formed on the general surface of the device formation layer 11 through an insulating layer 13 and between the well 12 and the discarding well 25. Moreover, a discarding electrode 27 is ohmic-connected to the discarding well 25. The discarding well 25 has the same conductive type as the well 12, and the impurity concentration of the discarding well 25 is higher than that of the well 12.

A positive constant voltage is always applied to the discarding electrode 27 such that electrons collected in the discarding well 25 can be discarded through the discarding electrode 27. In addition, when a positive voltage is applied to the discarding gate electrode 26, a channel is formed such that electrons can be moved between the well 12 and the discarding well 25. The electrons in the well 12 move toward the discarding well 25 through this channel. In this regard, when the voltages applied to the discarding gate electrode 26 and the discarding electrode 27 are kept constant, the electron mobility from the well 12 to the discarding well 25 becomes almost constant.

After electrons are collected in the photoelectric converting portion D1 of the well 12 upon the receipt of light from the target space, a prescribed constant voltage is applied to the discarding gate electrode 26 for a predetermined time period to move the electrons from the well 12 to the discarding well 25. As described above, since the electron mobility is constant, an amount of electrons determined in proportion to the time period of applying the voltage to the discarding gate electrode 26 can be moved to the discarding well 25. That is, when the electrons moved from the well 12 to the discarding well 25 are the undesired electric charges, and the remaining electrons in the well 12 are used as the effective electric charges, it means that the prescribed constant amount of the undesired electric charges can be removed from the electric charges generated in the well 12. The effective electric charges left in the well 12 are taken out as the received-light output.

According to this embodiment, the amount of the undesired electric charges is determined by the voltages applied to the discarding gate electrode 26 and the discarding electrode 27, and the time period of applying the voltage to the discarding gate electrode 26. On the other hand, as described above, since the voltages applied to the discarding gate electrode 26 and the discarding electrode 27 are kept constant, the amount of the undesired electric charges is expressed as a function of the time period of applying the voltage to the discarding gate electrode 26. In addition, since the effective electric charges are left in the well 12, the well 12 of this embodiment functions as the charge accumulating portion D3 as well as the photoelectric converting portion D1. The discarding well 25, the discarding gate electrode 26 and the discarding electrode 27 function as the charge separating portion D2. The other configurations and operations are the same as those of the above-described embodiments.

Ninth Embodiment

The present embodiment is characterized in that a charge transfer portion for taking out the received-light output is used as the charge accumulating portion D3 by controlling a voltage applied to a transfer control electrode 31 formed at the charge transfer portion without forming an electrode for controlling the movement of electrons at the charge separating portion D2 for separating the undesired electric charges. That is, in each of the above-described embodiments, the electrode arrangement is the same as the electrode configuration of a frame-transfer type CCD image sensor. In this embodiment, the electrode arrangement is the same as the electrode configuration of an interline-transfer (IT) type CCD image sensor.

Figure 21:
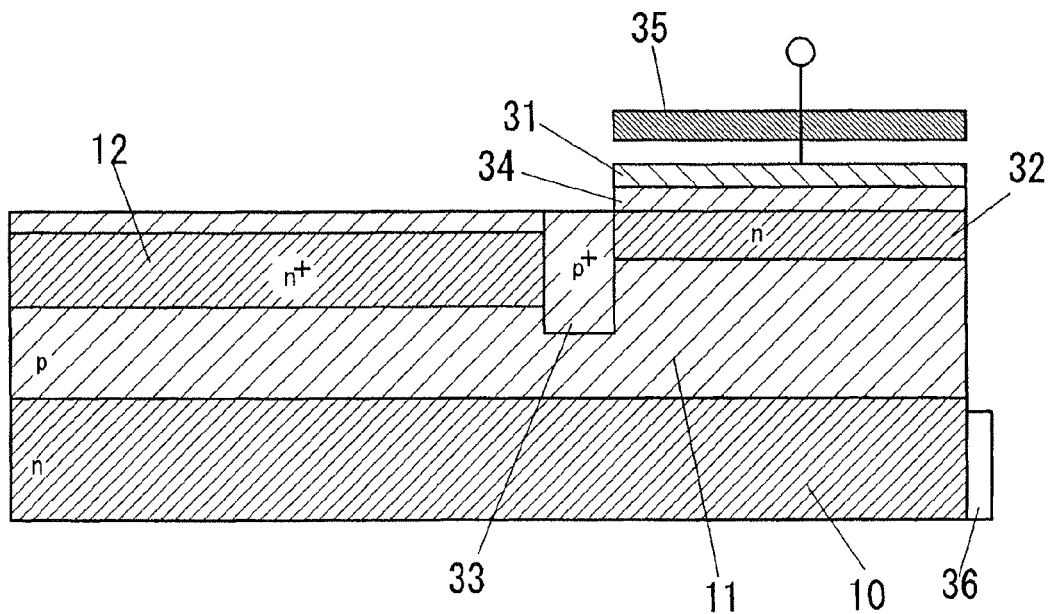
FIG. 21 is a cross-sectional view showing a ninth embodiment.

As shown in FIG. 21, a p-type device formation layer 11 is formed on an n-type substrate 10. An n+-type well 12 is formed on the general surface of the device formation layer 11 and at one side of a p+-type barrier well 33. In addition, an n-type transfer well 32 is formed at the opposite side of the p+-type barrier well 33. The transfer well 32 has the same configuration as the IT-type CCD image sensor. A transfer control electrode 31 is disposed on the general surface of the transfer well 32 through an insulating layer 34. The transfer well 32 is covered by a light-shielding film 35. A plurality of the transfer control electrodes 31 are arranged in a direction orthogonal to the page of FIG. 21. To transfer electrons, a sequence of applying voltages to the transfer control electrodes 31 is controlled, as in the conventional case. To separate the undesired electric charges, a drain electrode 36 ohmic-connected to the substrate 10 is used in combination with the transfer control electrode 31. The well 12 is used in common by the photoelectric converting portion D1 and the charge separating portion D2.

Figure 22A:
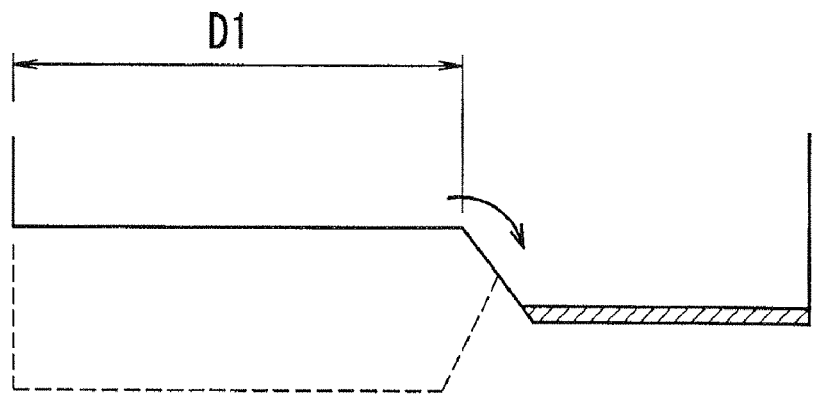
FIGS. 22A to 22E are operation explanatory diagrams showing potential relations in this embodiment.
Figure 22B:
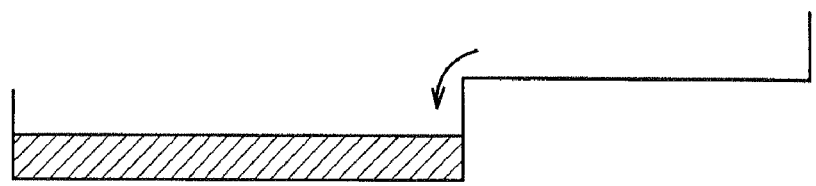
Figure 22C:
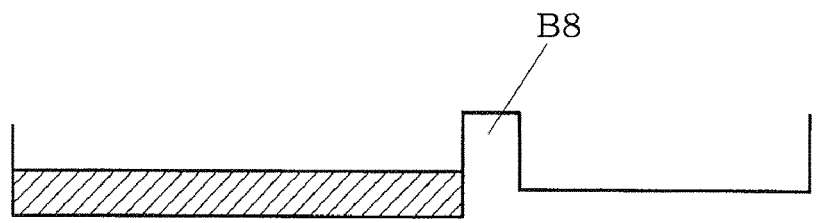

In the present embodiment, the well 12 has no electrode, and the device formation layer 11 has a different conductive type from the well 12. Therefore, as shown in FIG. 22C, a potential well is formed in the well 12. The barrier well 33 presents a potential barrier B8 between the well 12 and the transfer well 32. At this time, it is assumed that the transfer well 32 is in an electron-free state. In addition, no voltage is applied to the transfer control electrode 31, and a positive voltage (e.g., 5 volts) is applied to the drain electrode 36.

Figure 22D:
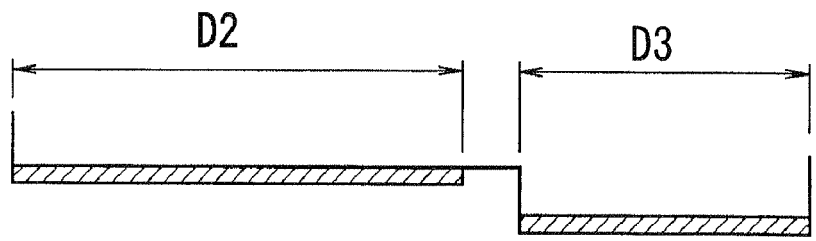

After electrons are generated by light irradiation to the photoelectric converting portion D1, a relatively large positive voltage (e.g., 10 volts) is applied to the transfer control electrode 31. As the voltage applied to the transfer control electrode 31 is larger, the potential of the potential barrier B8 is reduced. When a higher appropriate voltage than the voltage applied in the case of transferring electrons is applied to the transfer control electrode 31, a part of the electrons collected in the well 12 flows into the transfer well 32 over the potential barrier B8, as shown in FIG. 22D. Since the height of the potential barrier B8 is determined by the voltage applied to the transfer control electrode 31, a prescribed constant amount of electrons can be left in the well 12. That is, the well 12 functions as the charge separating portion D2, and the transfer well 32 functions as the charge accumulating portion D3.

Figure 22E:
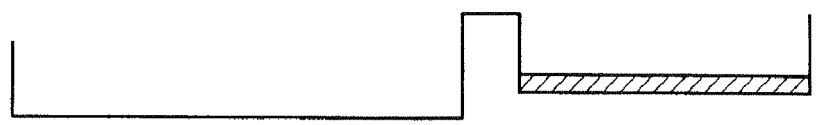

When the undesired electric charges are left in the well 12, and the effective electric charges flow into the transfer well 32, the applying of the voltage to the transfer control electrode 31 is stopped, and a relatively high positive voltage (e.g., 15 volts) is applied to the drain electrode 36. In this state, as shown in FIG. 22E, the potential barrier B8 becomes high, and the potential well formed in the transfer well 32 becomes shallow. That is, the effective electric charges flowed into the transfer well 32 are held in the charge accumulating portion D3. In addition, the undesired electric charges left in the well 12 are discarded through the drain electrode 36.

According to the above operation, the prescribed constant amount of electrons is separated as the undesired electric charges from the electrons generated by receiving light from the target space, and the effective electric charges are left in the transfer well 32. The effective electric charges can be transferred in a direction orthogonal to the page of the drawing by controlling the voltage applied to the transfer control electrode 31 and performing a similar operation to the case of a vertical transfer resistor of the conventional CCD image sensor. The other configurations and operations are the same as those of the above-described embodiments.

By the way, when the photodetector shown in FIG. 21 of this embodiment is used in combination with the light emission source for projecting light intensity-modulated by a modulation signal to detect the information of the target space, it is needed to extract the received-light amount corresponding to a predetermined phase zone of the modulation signal. In such a case, for example, as shown in FIG. 23A, a relatively large positive voltage (e.g., 15 volts) is applied to the transfer control electrode 31 in a light receiving period "T1" to form a deep potential well in the transfer well 32. Thereby, electrons generated by the photoelectric converting portion D1 (well 12) can flow into the transfer well 32. On the other had, as shown in FIG. 23B, the voltage applied to the discarding electrode 36 is changed in high and low two stages (e.g., 15V and 5V) in synchronization with the modulation signal, so that a state of discarding electrons and a state where electrons flow into the potential well formed in the transfer well 32 are alternately repeated. When the voltage applied to the discarding electrode 36 is changed to a lower voltage at the timing of taking out the electric charges used as the received-light output from the electric charges generated by the photoelectric converting portion D1, the intended electric charges are allowed to flow into the transfer well 32. A change of the potential well in the light receiving period "T1" is shown in FIGS. 22A and 22B.

After the voltage applied to the discarding electrode 36 is changed plural times in the light receiving period where the above-described operations are performed, a weighing period "T2" is started. In the weighing period "T2", a negative voltage (e.g., −5 volts) is applied to the transfer control electrode 31 such that the potential well of the transfer well 32 becomes shallow. In addition, the voltage applied to the discarding electrode 36 is controlled to a relatively low voltage (e.g., 5 volts) such that electrons are not discarded from the well 12. According to this relation, electrons can be returned from transfer well 32 to the well 12. The charge weighing operation performed after the electrons are returned to the well 12 is the same as that described above.

The purpose and the characteristics of the present invention are to stably obtain the effective electric charges needed to detect the spatial information by preventing saturation without being influenced by an increase or decrease in the environmental light. Therefore, although details are not explained in the preferred embodiments, the spatial information detected by use of the effective electric charges as the received-light output comprises measuring a distance to an object in the target space by use of a difference between the received-light outputs, which are detected at different timings synchronized with plural phase zones of the modulation signal, generating an amplitude image having pixel values, each of which is provided by the above-mentioned difference, recognizing the size or shape of the object from the amplitude image, and obtaining the information such as reflectance of the object in the target space by eliminating the environmental light component.

INDUSTRIAL APPLICABILITY

As described above, according to the present invention, by controlling the voltage applied to the barrier control electrode to change the height of the potential barrier, the electric charge amount flowing from the charge separating portion into the charge accumulating portion over the potential barrier is adjusted, and the undesired electric charges remaining in the charge separating portion are discarded. Therefore, it is possible to provide the spatial information detecting device, which is capable of downsizing the photoelectric converting portion, and reliably obtaining effective electric charges by preventing saturation phenomenon, even in a case that a large amount of undesired electric charges are generated by receiving the light from the target space.

Especially, when adjusting the electric charge amount separated as the undesired electric charges from the electric charges corresponding to the received-light amount in the lighting period according to the electric charge amount generated by the photoelectric converting portion in the rest period, an appropriate amount of the undesired electric charges can be automatically discarded depending on a change in environmental light even when an increase or decrease in the environmental light occurs in the target space.

Thus, since the spatial information detecting device of the present invention has the capability of accurately detecting the information of the target space anywhere indoor and outdoor, it is expected to expand the application fields of the conventional spatial information detecting device.

The invention claimed is:

1. A spatial information detecting device comprising:
a light emission source configured to project a signal light intensity-modulated by a modulation signal into a target space;
a photodetecting portion configured to separate a constant amount of a bias component from electric charges corresponding to a received-light amount detected from the target space at a timing synchronized with said modulation signal, thereby providing a received-light output reflecting a fluctuation component of said signal light; and
a signal processing portion configured to detect spatial information of the target space by use of said received-light output;
wherein said photodetecting portion comprises:
a photoelectric converting portion configured to receive light from the target space to generate electric charges;
a charge separating portion configured to separate a prescribed constant amount of undesired electric charges corresponding to the bias component from the electric charges generated by said photoelectric converting portion, which correspond to a total of the constant amount of the bias component that does not depend on fluctuations of said signal light and the fluctuation component that changes depending on the fluctuations of said signal light;
a charge accumulating portion configured to accumulate, as effective electric charges, the remaining electric charges obtained by separating the undesired electric charges from the electric charges generated by said photoelectric converting portion; and
a charge take-out portion configured to take out, as said received-light output, the effective electric charges accumulated in said charge accumulating portion,
wherein said light emission source irradiates, into the target space, a light intensity-modulated by said modulation signal so as to have a lighting period where the intensity-modulated light is projected from said light emission source into the target space and a rest period where the intensity-modulated light is not projected into the target space, and
said photodetecting portion comprises an electric-charge amount adjusting means configured to adjust an amount of electric charges to be separated as the undesired electric charges from the electric charges corresponding to a received-light amount obtained in said lighting period according to electric charge amount generated by said photoelectric converting portion in said rest period, and
wherein said charge separating portion and said charge accumulating portion are potential wells formed in a semiconductor substrate,
a barrier control electrode is disposed between said charge separating portion and said charge accumulating portion to form a potential barrier, and
said electric-charge amount adjusting means controls a voltage applied to said barrier control electrode according to the electric charge amount generated by said photoelectric converting portion in said rest period to change a height of said potential barrier, thereby adjusting an amount of electric charges flowing from said charge separating portion into said charge accumulating portion over said potential barrier.

2. The spatial information detecting device as set forth in claim 1, wherein said electric-charge amount adjusting means has a charge holding portion, which is a potential well formed in said semiconductor substrate, to hold electric charges generated by said photoelectric converting portion in said rest period, and
said electric-charge amount adjusting means applies a voltage determined according to the electric charge amount held by said charge holding portion to said barrier control electrode.

3. The spatial information detecting device as set forth in claim 2, wherein said electric-charge amount adjusting means comprises a holding electrode formed at a position corresponding to said charge holding portion on said semiconductor substrate through an insulating layer, and electrically connected to said barrier control electrode.

4. The spatial information detecting device as set forth in claim 2, wherein said barrier control electrode is electrically connected to a portion of said semiconductor substrate corresponding to a charge holding well formed as said charge holding portion.

5. The spatial information detecting device as set forth in claim 2, further comprising a gate electrode formed on a general surface of said semiconductor substrate between said photoelectric converting portion and said charge holding portion, and configured to control a timing of transferring the electric charges generated by said photoelectric converting portion to said charge holding portion.

6. A spatial information detecting device comprising:
a light emission source configured to project a signal light intensity-modulated by a modulation signal into a target space;
a photodetecting portion configured to separate a constant amount of a bias component from electric charges corresponding to a received-light amount detected from the target space at a timing synchronized with said modulation signal, thereby providing a received-light output reflecting a fluctuation component of said signal light; and
a signal processing portion configured to detect spatial information of the target space by use of said received-light output;
wherein said photodetecting portion comprises:
a photoelectric converting portion configured to receive light from the target space to generate electric charges;
a charge separating portion configured to separate a prescribed constant amount of undesired electric charges corresponding to the bias component from the electric charges generated by said photoelectric converting portion, which correspond to a total of the constant amount of the bias component that does not depend on fluctuations of said signal light and the fluctuation component that changes depending on the fluctuations of said signal light;
a charge accumulating portion configured to accumulate, as effective electric charges, the remaining electric charges obtained by separating the undesired electric charges from the electric charges generated by said photoelectric converting portion; and
a charge take-out portion configured to take out, as said received-light output, the effective electric charges accumulated in said charge accumulating portion,
wherein said light emission source irradiates, into the target space, a light intensity-modulated by said modulation signal so as to have a lighting period where the intensity-modulated light is projected from said light emission source into the target space and a rest period where the intensity-modulated light is not projected into the target space, and
said photodetecting portion comprises an electric-charge amount adjusting means configured to adjust an amount of electric charges to be separated as the undesired electric charges from the electric charges corresponding to a received-light amount obtained in said lighting period according to electric charge amount generated by said photoelectric convertingportion in said rest period, and
wherein said charge separating portion and said charge accumulating portion are potential wells formed in a semiconductor substrate,
a separation electrode is disposed at a position corresponding to said charge separating portion on said semiconductor substrate, and
said electric-charge amount adjusting means controls a voltage applied to said separation electrode according to electric charge amount generated by said photoelectric converting portion in said rest period to change a depth of a potential well formed as said charge separating portion, thereby adjusting an amount of electric charges flowing from said charge separating portion into said charge accumulating portion over said potential barrier.

7. The spatial information detecting device as set forth in claim 6, wherein said electric-charge amount adjusting means has a charge holding portion, which is a potential well formed in said semiconductor substrate, to hold electric charges generated by said photoelectric converting portion in said rest period, and
said electric-charge amount adjusting means applies a voltage determined according to the electric charge amount held by said charge holding portion to said separation electrode.

8. A spatial information detecting device comprising:
a light emission source configured to project a signal light intensity-modulated by a modulation signal into a target space;
a photodetecting portion configured to separate a constant amount of a bias component from electric charges corresponding to a received-light amount detected from the target space at a timing synchronized with said modulation signal, thereby providing a received-light output reflecting a fluctuation component of said signal light; and
a signal processing portion configured to detect spatial information of the target space by use of said received-light output;
wherein said photodetecting portion comprises:
a photoelectric converting portion configured to receive light from the target space to generate electric charges;
a charge separating portion configured to separate a prescribed constant amount of undesired electric charges corresponding to the bias component from the electric charges generated by said photoelectric converting portion, which correspond to a total of the constant amount of the bias component that does not depend on fluctuations of said signal light and the fluctuation component that changes depending on the fluctuations of said signal light;
a charge accumulating portion configured to accumulate, as effective electric charges, the remaining electric charges obtained by separating the undesired electric charges from the electric charges generated by said photoelectric converting portion; and
a charge take-out portion configured to take out, as said received-light output, the effective electric charges accumulated in said charge accumulating portion,
wherein said light emission source irradiates, into the target space, a light intensity-modulated by said modulation signal so as to have a lighting period where the intensity-modulated light is projected from said light emission source into the target space and a rest period where the intensity-modulated light is not projected into the target space, and
said photodetecting portion comprises an electric-charge amount adjusting means configured to adjust an amount of electric charges to be separated as the undesired electric charges from the electric charges corresponding to a received-light amount obtained in said lighting period according to electric charge amount generated by said photoelectric converting portion in said rest period, and
wherein said signal processing portion increases, when the electric charge amount generated in said lighting period reaches a predetermined saturation level, the amount of the undesired electric charges separated in a next lighting period.

9. A spatial information detecting device comprising:
a light emission source configured to project a signal light intensity-modulated by a modulation signal into a target space;
a photodetecting portion configured to separate a constant amount of a bias component from electric charges corresponding to a received-light amount detected from the target space at a timing synchronized with said modulation signal, thereby providing a received-light output reflecting a fluctuation component of said signal light; and a signal processing portion configured to detect spatial information of the target space by use of said received-light output;

wherein said photodetecting portion comprises:

a photoelectric converting portion configured to receive light from the target space to generate electric charges;

a charge separating portion configured to separate a prescribed constant amount of undesired electric charges corresponding to the bias component from the electric charges generated by said photoelectric converting portion, which correspond to a total of the constant amount of the bias component that does not depend on fluctuations of said signal light and the fluctuation component that changes depending on the fluctuations of said signal light a charge accumulating portion configured to accumulate, as effective electric charges, the remaining electric charges obtained by separating the undesired electric charges from the electric charges generated by said photoelectric converting portion; and a charge take-out portion configured to take out, as said received-light output, the effective electric charges accumulated in said charge accumulating portion, wherein said light emission source irradiates, into the target space, a light intensity-modulated by said modulation signal so as to have a lighting period where the intensity-modulated light is projected from said light emission source into the target space and a rest period where the intensity-modulated light is not projected into the target space, and said photodetecting portion comprises an electric-charge amount adjusting means configured to adjustment an amount of electric charges to be separated as the undesired electric charges from the electric charges corresponding to a received-light amount obtained in said lighting period according to electric charge amount generated by said photoelectric converting portion in said rest period, and wherein said photodetecting portion has a plurality of photodetecting cells, each of which corresponds to one pixel, each of said photodetecting cells comprises a semiconductor layer of a first conductive type, a well of a second conductive type formed in a general surface of said semiconductor layer, said photoelectric converting portion including an array of a plurality of sensitivity control electrodes, which are formed on a prescribed region of said well of the second conductive type through an insulating layer, a separation electrode used to form a potential well as said charge separating portion in said well, a barrier control electrode used to form said potential barrier in said well, an accumulation electrode used to form a potential well as said charge accumulating portion in said well, and a discarding portion, to which the undesired electric charges are discarded from said charge separating portion, wherein said electric-charge amount adjusting means has a charge holding portion, which is a potential well for holding the electric charges generated by said photoelectric converting portion in said rest period, and said electric-charge amount adjusting means applies a voltage to at least one of said barrier control electrode and said separation electrode according to the electric charge amount held by said charge holding portion.

10. The spatial information detecting device as set forth in claim 9, wherein said separation electrode, said barrier control electrode, and said accumulation electrode are formed in said array of said sensitivity control electrodes, and said charge holding portion is formed adjacently in a direction orthogonal to said array of said sensitivity control electrodes.

11. The spatial information detecting device as set forth in claim 9, wherein said separation electrode, said barrier control electrode, said accumulation electrode and said charge holding portion are set out in an array direction of said sensitivity control electrodes in a column adjacent to said array of said sensitivity control electrodes.

12. A spatial information detecting device comprising:

a light emission source configured to irradiate a light intensity-modulated by a modulation signal into a target space;

a photodetecting portion configured to provide an electrical output according to light received from the target space; and a signal processing portion configured to detect spatial information of the target space by use of said electrical output;

wherein said photodetecting portion comprises:

a photoelectric converting portion configured to receive the light from the target space to generate electric charges;

a charge separating portion configured to separate an amount of undesired electric charges, which is determined according to an electric charge amount generated by said photoelectric converting portion in one of two zones having different phase ranges of said modulation signal, from electric charges generated in the other zone by said photoelectric converting portion;

a charge accumulating portion configured to accumulate, as effective electric charges, the remaining electric charges obtained by separating the undesired electric charges from the electric charges generated in the other zone by said photoelectric converting portion; and a charge take-out portion configured to output, as said electrical output, the effective electric charges accumulated in said charge accumulating portion, wherein said charge separating portion and said charge accumulating portion are potential wells formed in a semiconductor substrate, the spatial information detecting device has a barrier control electrode disposed on said semiconductor substrate to form a potential barrier between said charge separating portion and said charge accumulating portion, and a charge holding portion configured to hold electric charges generated by said photoelectric converting portion in said one of the two zones having different phase ranges of said modulation signal, a voltage is applied to said barrier control electrode according to the electric charge amount held by said charge holding portion to determine the amount of undesired electric charges, and the amount of undesired electric charges is separated from the electric charges generated by said photoelectric converting portion in the other one of the two zones having different phase ranges of said modulation signal by said charge separating portion.

* * * * *